(12) United States Patent
Kimura

(10) Patent No.: US 8,395,607 B2
(45) Date of Patent: *Mar. 12, 2013

(54) CURRENT DRIVING CIRCUIT AND DISPLAY DEVICE USING THE CURRENT DRIVING CIRCUIT

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 18 days.

This patent is subject to a terminal disclaimer.

(21) Appl. No.: 13/252,248

(22) Filed: Oct. 4, 2011

(65) Prior Publication Data

US 2012/0025876 A1 Feb. 2, 2012

Related U.S. Application Data

(63) Continuation of application No. 10/720,847, filed on Nov. 25, 2003, now Pat. No. 8,035,626.

(30) Foreign Application Priority Data

Nov. 29, 2002 (JP) ................................ 2002-348673
Jan. 28, 2003 (JP) ................................ 2003-019240

(51) Int. Cl.
*G06F 3/038* (2006.01)
*G09G 5/00* (2006.01)

(52) U.S. Cl. .............................. 345/204; 345/76; 345/84

(58) Field of Classification Search .............. 345/76–81, 345/204

See application file for complete search history.

(56) References Cited

U.S. PATENT DOCUMENTS

| | | | |
|---|---|---|---|
| 5,521,871 A | 5/1996 | Choi |
| 5,552,677 A | 9/1996 | Pagones |
| 5,610,549 A | 3/1997 | Choi |
| 5,877,654 A | 3/1999 | Fong et al. |
| 6,229,506 B1 | 5/2001 | Dawson et al. |
| 6,297,675 B1 | 10/2001 | Akamatsu et al. |
| 6,310,589 B1 | 10/2001 | Nishigaki et al. |
| 6,332,661 B1 | 12/2001 | Yamaguchi |
| 6,369,786 B1 | 4/2002 | Suzuki |
| 6,373,454 B1 | 4/2002 | Knapp et al. |
| 6,525,574 B1 | 2/2003 | Herrera |
| 6,534,925 B2 | 3/2003 | Kawashima |
| 6,633,136 B2 | 10/2003 | Kim et al. |
| 6,667,580 B2 | 12/2003 | Kim et al. |
| 6,710,995 B2 | 3/2004 | Knoedgen |

(Continued)

FOREIGN PATENT DOCUMENTS

| | | |
|---|---|---|
| CN | 1122943 A | 5/1996 |
| CN | 1242563 A | 1/2000 |

(Continued)

OTHER PUBLICATIONS

International Search Report (Application No. PCT/JP03/15140) dated Jan. 20, 2004.

(Continued)

*Primary Examiner* — Michael Pervan
(74) *Attorney, Agent, or Firm* — Fish & Richardson P.C.

(57) ABSTRACT

A current drive circuit which can improve a rate for signal writing and a driving rate of an element even when a signal current is small, and a display device using the current drive circuit are provided. The current drive circuit for supplying a signal current to a node of a driven circuit through a signal line includes a precharge function for supplying a precharge voltage to the node through the signal line and the precharge function includes a supply function for supplying the precharge voltage to the node and the signal line prior to supplying the signal current.

36 Claims, 42 Drawing Sheets

U.S. PATENT DOCUMENTS

| | | | |
|---|---|---|---|
| 6,839,057 B2 | 1/2005 | Iguchi | |
| 6,859,193 B1 | 2/2005 | Yumoto | |
| 6,870,553 B2 | 3/2005 | Kondo et al. | |
| 6,930,680 B2 | 8/2005 | Miyazawa | |
| 6,943,760 B2 | 9/2005 | Bae et al. | |
| 6,963,336 B2 | 11/2005 | Kimura | |
| 6,975,290 B2 | 12/2005 | Asano | |
| 6,989,826 B2 | 1/2006 | Kasai | |
| 6,992,663 B2 | 1/2006 | Nakamura et al. | |
| 7,015,884 B2 | 3/2006 | Kwon | |
| 7,138,967 B2 | 11/2006 | Kimura | |
| 7,154,454 B2 | 12/2006 | Okabe et al. | |
| 7,170,479 B2 | 1/2007 | Kimura | |
| 7,180,479 B2 | 2/2007 | Kimura | |
| 7,184,034 B2 | 2/2007 | Kimura | |
| 7,193,619 B2 | 3/2007 | Kimura | |
| 7,209,101 B2 | 4/2007 | Abe | |
| 7,253,665 B2 | 8/2007 | Kimura | |
| 7,256,756 B2 | 8/2007 | Abe | |
| 7,345,657 B2 | 3/2008 | Kimura | |
| 7,453,427 B2 | 11/2008 | Kimura | |
| 7,474,285 B2 | 1/2009 | Kimura | |
| 7,532,209 B2 | 5/2009 | Kimura | |
| 7,554,362 B2 | 6/2009 | Kimura | |
| 7,576,734 B2 | 8/2009 | Kimura | |
| 7,742,064 B2 | 6/2010 | Kimura | |
| 7,859,520 B2 | 12/2010 | Kimura | |
| 2002/0008543 A1 | 1/2002 | Nasu et al. | |
| 2002/0008687 A1 | 1/2002 | Tazuke | |
| 2002/0153844 A1 | 10/2002 | Koyama | |
| 2002/0180369 A1 | 12/2002 | Koyama | |
| 2002/0195964 A1 | 12/2002 | Yumoto | |
| 2003/0006713 A1 | 1/2003 | Kim et al. | |
| 2003/0006955 A1 | 1/2003 | Tsuchi | |
| 2003/0016190 A1 | 1/2003 | Kondo | |
| 2003/0020705 A1 | 1/2003 | Kondo et al. | |
| 2003/0030382 A1 | 2/2003 | Koyama | |
| 2003/0030602 A1 | 2/2003 | Kasai | |
| 2003/0048669 A1 | 3/2003 | Abe | |
| 2003/0062524 A1 | 4/2003 | Kimura | |
| 2003/0128199 A1 | 7/2003 | Kimura | |
| 2003/0128200 A1 | 7/2003 | Yumoto | |
| 2003/0156012 A1 | 8/2003 | Omidi et al. | |
| 2003/0156102 A1 | 8/2003 | Kimura | |
| 2003/0169250 A1 | 9/2003 | Kimura | |
| 2003/0214465 A1 | 11/2003 | Kimura | |
| 2003/0214466 A1 | 11/2003 | Kimura | |
| 2003/0218584 A1 | 11/2003 | Kimura | |
| 2003/0231152 A1 | 12/2003 | Shin | |
| 2004/0008166 A1 | 1/2004 | Kimura | |
| 2004/0041752 A1 | 3/2004 | Kimura | |
| 2004/0085029 A1 | 5/2004 | Kimura | |
| 2004/0207615 A1 | 10/2004 | Yumoto | |
| 2004/0227749 A1 | 11/2004 | Kimura | |
| 2005/0007181 A1 | 1/2005 | Kimura | |
| 2005/0052209 A1 | 3/2005 | Jacobs et al. | |
| 2005/0190177 A1 | 9/2005 | Yumoto | |
| 2005/0200300 A1 | 9/2005 | Yumoto | |
| 2005/0218821 A1 | 10/2005 | Asano | |
| 2005/0243040 A1 | 11/2005 | Miyazawa | |
| 2005/0285625 A1 | 12/2005 | Kimura | |
| 2006/0028413 A1 | 2/2006 | Kimura | |
| 2006/0103610 A1 | 5/2006 | Kimura | |
| 2006/0114192 A1 | 6/2006 | Kasai | |
| 2006/0119552 A1 | 6/2006 | Yumoto | |
| 2006/0187730 A1 | 8/2006 | Kimura | |
| 2006/0284800 A1 | 12/2006 | Kimura | |
| 2007/0262978 A1 | 11/2007 | Kimura | |
| 2008/0197777 A1 | 8/2008 | Koyama | |
| 2009/0021299 A1 | 1/2009 | Kimura | |

FOREIGN PATENT DOCUMENTS

| | | |
|---|---|---|
| EP | 0653760 A2 | 5/1995 |
| EP | 1103946 A1 | 5/2001 |
| EP | 1130565 A1 | 9/2001 |
| EP | 1220191 A2 | 7/2002 |
| EP | 1274065 A2 | 1/2003 |
| EP | 1291839 A1 | 3/2003 |
| EP | 1363264 A2 | 11/2003 |
| EP | 1598938 A1 | 11/2005 |
| JP | 2000-105574 A | 4/2000 |
| JP | 2000-293245 A | 10/2000 |
| JP | 2001-296837 A | 10/2001 |
| JP | 2002-149125 A | 5/2002 |
| JP | 2002-514320 A | 5/2002 |
| JP | 2002-517806 A | 6/2002 |
| JP | 2002-202754 A | 7/2002 |
| JP | 2002-215096 A | 7/2002 |
| JP | 2002-328659 A | 11/2002 |
| JP | 2003-043997 A | 2/2003 |
| JP | 2003-050564 A | 2/2003 |
| JP | 2003-066908 A | 3/2003 |
| JP | 2003-076327 A | 3/2003 |
| JP | 2003-099001 A | 4/2003 |
| JP | 2003-108065 A | 4/2003 |
| JP | 2003-114645 A | 4/2003 |
| JP | 2003-150082 A | 5/2003 |
| JP | 2003-150116 A | 5/2003 |
| JP | 2003-157048 A | 5/2003 |
| JP | 2003-157049 A | 5/2003 |
| JP | 2003-177709 A | 6/2003 |
| JP | 2003-195812 A | 7/2003 |
| JP | 2004-046127 A | 2/2004 |
| JP | 2004-046128 A | 2/2004 |
| JP | 2004-046129 A | 2/2004 |
| JP | 2004-046130 A | 2/2004 |
| TW | 493118 B | 7/2002 |
| WO | WO 98/48403 A1 | 10/1998 |
| WO | WO 99/65012 A2 | 12/1999 |
| WO | WO 01/06484 A1 | 1/2001 |
| WO | WO 02/39420 A1 | 5/2002 |
| WO | WO 03/027997 A1 | 4/2003 |
| WO | WO 03/038793 A1 | 5/2003 |
| WO | WO 03/038794 A1 | 5/2003 |
| WO | WO 03/038795 A1 | 5/2003 |
| WO | WO 03/038796 A1 | 5/2003 |
| WO | WO 03/038797 A1 | 5/2003 |

OTHER PUBLICATIONS

International Preliminary Report (Application No. PCT/JP2003/015140), dated Jun. 2, 2004, 4 pages.

Hattori et al., "Circuit Simulation of Poly-Si TFT Based current-Writing Active-Matrix Organic LED Display," Technical Report of IEICE, vol. 101, No. 15, ED2001-8, SDM2001-8, Apr. 1, 2001, pp. 7-14.

Shimoda et al. "New Pixel-Driving Scheme With Data-Line Pre-Charge Function for Active Matrix Organic Light Emitting Diode Displays," IDW'02, Proceedings of the 9th International Display Workshops, Jan. 1, 2002, pp. 239-242.

Lee et al., "P-39: An Improved Driving Method Using Precharge for Active Matrix OLED Displays," Conference record of the 2003 IDRC (International Display Research Conference), Jan. 1, 2003, pp. 285-287.

European Patent Office Search Report (European Patent Application No. 03812316.2), 5 pages, mailed Jul. 9, 2009.

European Office Action (Application No. 03812316.2) Dated Mar. 24, 2011.

Office Action, Taiwanese Application No. 92133078, dated Jun. 24, 2011, 22 pages with English translation.

(A)

(B)

(C)

CURRENT DRIVING CIRCUIT AND DISPLAY DEVICE USING THE CURRENT DRIVING CIRCUIT

CROSS-REFERENCE TO RELATED APPLICATIONS

This application is a continuation of U.S. application Ser. No. 10/720,847, filed Nov. 25, 2003, now allowed, which claims the benefit of foreign priority applications filed in Japan as Serial No. 2002-348673 on Nov. 29, 2002 and Serial No. 2003-019240 on Jan. 28, 2003, all of which are incorporated by reference.

TECHNICAL FIELD

The invention relates to a current drive circuit and a display device using the same, and more particularly to a current drive circuit used in a pixel circuit and a source driver circuit of an active matrix display device using a current drive light emitting element which changes its luminance in accordance with a current as a display element of the pixel.

BACKGROUND ART

In recent years, what is called a self-emission display device using self-light emitting elements such as light emitting diodes (LEDs) as display elements has been attracting attention. Among the light emitting elements for using in such a self-emission display device, an organic light emitting diode (OLED) and the like are in the spotlight and they are beginning to be used for the displays of display devices and mobile phones.

Because such light emitting element as OLED emits light by itself, it is advantageous in that the visibility of pixels is higher than liquid crystal displays, a backlight is not needed, and a response rate is fast and the like. Moreover, the luminance of a light emitting element is controlled by a current value flowing through a light emitting element.

Known as driving methods for such a display device using a self-light emitting element are a passive matrix type and an active matrix type. The passive matrix type has a rather simple structure, however, there are such problems as a difficulty in realizing a large and high definition display, therefore developments are more on the active matrix type these days, which controls the current flowing to the light emitting element with a thin film transistor (TFT) provided in a pixel circuit.

In the case of such active matrix display device, there is a problem that a luminance varies because of the change in the current flowing to the light emitting element due to the variation in characteristics of driving TFTs. In the case of the active matrix display device, a pixel circuit 100 employs driving TFTs for driving the current flowing to the light emitting element, however, when the characteristics of these driving TFTs vary, the current flowing to the light emitting element changes, and the luminance varies. In view of such problems, various circuits for suppressing the variation in luminance, in which the current flowing to the light emitting element does not change even when the characteristics of the driving TFTs in the pixel circuit vary, are suggested.

Patent Document 1: Published Japanese Translation of a PCT Application No. 2002-517806
Patent Document 2: International Publication No. WO01-06484
Patent Document 3: Published Japanese Translation of a PCT Application No. 2002-514320
Patent Document 4: International Publication No. WO02-39420

Each of the patent documents 1 to 4 discloses the structure of the active matrix display device, and patent documents 1 to 3 disclose circuit configurations in which a current flowing to the light emitting element does not change due to the variation in characteristics of the driving TFTs disposed in the pixel circuit. Further, the patent document 4 discloses a circuit configuration for suppressing the change of driving current due to the variation of TFTs in a source driver circuit.

FIG. 30 is a circuit diagram showing an example of a conventional active matrix display device disclosed in the patent document 1.

This display device is configured with a plurality of pixel circuits 100 disposed in matrix and a source driver circuit 200 for driving the pixel circuits 100. A signal current having a signal level corresponding to the image data is supplied through a signal line 20 for each pixel, and a driving current which is in proportion with this signal current is supplied to a light emitting element 40 in the pixel circuit 100 from a power supply line 30.

The pixel circuit 100 comprises an OLED 40 which is a current drive light emitting element, a light emitting TFT 52 which switches between ON and OFF corresponding to a control signal of a control line 10c, a select TFT 51 which switches between ON and OFF corresponding to a control voltage of a control line 10b so that a signal current having a current level corresponding to image data supplied to the signal line flows, a driving TFT 50 which supplies driving current from the power supply line 30, a holding capacitor 60 which is connected between the gate and source of the driving TFT 50, a holding TFT 53 which switches between ON and OFF corresponding to a control signal of the control line 10a and selectively connects the gate and drain of the driving TFT 50. Further, a source driver circuit 200 has an image signal input current source 70 which outputs a signal current $I_{video}$ having a signal level corresponding to image data.

The operation of the circuit is explained now.

First, as shown in FIG. 31, the holding TFT 53 and the select TFT 51 are turned ON by the control voltage applied to the control lines 10a and 10b. Then, the signal current $I_{video}$, which is determined by the image signal input current source 70 flows from the power supply line 30 through the driving TFT 50 and the select TFT 51 as shown by a dotted line in FIG. 31.

At this time, a voltage between the gate and source, $V_{gs}$ is applied between the gate and source of the driving TFT 50, which is required for the signal current $I_{video}$ to flow. The voltage is stored in the holding capacitor 60, and the current stops flowing to the holding TFT 53 when it reaches the steady state.

Next, as shown in FIG. 32, the holding TFT 53 is turned OFF.

Then the voltage between the gate and source, $V_{gs}$ is stored in the holding capacitor 60 and this storage voltage $V_{gs}$ keeps the signal current $I_{video}$ flowing to the driving TFT 50. After that, the select TFT 51 is turned OFF and a light emitting TFT 52 is turned ON as shown in FIG. 33. Thus, the signal current $I_{video}$ starts flowing to the OLED 40.

Here, a voltage between the drain and source of the driving TFT 50, $V_{ds}$ has a different value between the cases of FIG. 32 and FIG. 33. In the case where the driving TFT 50 operates in a saturation region, however, the same current $I_{video}$ flows as long as a voltage between the gate and source, $V_{gs}$ is the same even when a voltage between the source and drain, $V_{ds}$ changes. Therefore, it is advantageous that the current flowing to the OLED is constant even when the current voltage characteristic is changed due to the deterioration of the characteristics of OLED, thus the luminance is not easily deteriorated.

Also, constant current flows as long as the voltage stored in the holding capacitor 60 is constant, even when a voltage between the drain and source of the driving TFT changes. Therefore, a problem that the signal current is changed due to manufacturing variations of the driving TFT 50 can be avoided.

Abovementioned examples relates to the technology for correcting the change in signal current due to the variation of the OLED 40 and the driving TFT in the pixel circuit, however, the same problem occurs in the source driver circuit.

Patent document 4 discloses a circuit configuration for preventing the change in signal current due to the manufacturing variations of TFTs in a source driver circuit.

DISCLOSURE OF THE INVENTION

In this manner, a conventional current drive circuit and a display device employing it are configured so that a signal current and a current for driving a TFT, or a signal current and a current flowing to a light emitting element when emitting light can be equal or stay in proportion to each other.

However, in the cases where a driving current of a driving TFT for driving the light emitting element is small or where a dark gradation is to be displayed by the light emitting element, the signal current decreases accordingly. Further, as parasitic capacitance of a wiring used for supplying a signal current to a driving TFT and a light emitting element is quite large, therefore a time constant for charging the parasitic capacitance of the wiring becomes large, which makes a rate for writing the signal and a rate for driving the element slowed down.

In view of foregoing problems, it is an object of the invention to provide a current drive circuit which can improve the rate for writing a signal and the rate for driving the element even when the signal current is small, and a display device using the circuit.

In the invention, a circuit (precharge circuit) having a similar circuit configuration to a driven circuit into which a signal is written is formed in a circuit having a current source.

A voltage to be applied to a signal line in a steady state when writing a signal is determined in the precharge circuit. Provided that the voltage is $V_p$, the voltage $V_p$ is applied as a precharge voltage before supplying a signal current to a signal line as a precharge voltage.

When applying the precharge voltage $V_p$, not a constant current but a large current flows in the signal line, therefore the potential of the signal line is charged to the precharge voltage $V_p$ rapidly. After that, a signal current having a current level corresponding to image data is applied to the signal line. Accordingly, influence due to variation can be eliminated and an accurate signal can be inputted to the driven circuit. Further, the potential of the signal line is charged to the precharge voltage $V_p$ already, therefore the rate for writing a signal is not slowed even when the magnitude of a signal current is small.

It should be noted that the signal current to be applied to the signal line does not necessarily have a current level corresponding to the image data. Precharging may be performed with a required voltage and a current having a required current level is applied.

Moreover, the precharge voltage is not determined exclusively according to the circuit (precharge circuit) having the similar circuit configuration to the driven circuit. It may be determined by other means as well.

It should be noted that such circuit configuration and the methods (driving methods) can be applied not only to display devices but to various circuits.

A current drive circuit of the invention comprising a current drive circuit for supplying a signal current through a signal line to a node (a connection point of a plurality of wirings) of a driven circuit, a precharge means for supplying a precharge voltage to the node through the signal line, wherein the precharge means has a supply means for supplying the precharge voltage to the node and the signal line prior to supplying the signal current.

The current drive circuit may have a means for setting the precharge voltage to a value equal or close to the potential of the node in a steady state in which the signal current is supplied to the driven circuit.

Also in the current drive circuit, the precharge means is capable of having a plurality of setting means for setting a plurality of the precharge voltage, and a selective supply means for supplying the precharge voltage to the node and the signal line selectively corresponding to the magnitude of the signal current.

Furthermore, a current drive circuit of the invention which supplies a signal current to a node of a driven circuit through a signal line comprising a precharge circuit which supplies a precharge voltage to the node and the signal line, a generating means for generating the precharge voltage by supplying the signal current to the precharge circuit, and a supply means for supplying the precharge voltage to the node and the signal line prior to supplying the signal current to the driven circuit.

Also, a current drive circuit of the invention which supplies a signal current to a node of a driven circuit through a signal line, comprising a precharge circuit which supplies a precharge voltage to the node, and a supply means for supplying a current corresponding to the signal current to the precharge circuit to generate the precharge voltage in advance, and supplying the precharge voltage to the node and the signal line prior to supplying the signal current to the driven circuit.

In the current drive circuit, the driven circuit may have a first driving element, the precharge circuit may have a second driving element, and the first and second driving elements may be equal in size or the size close to it. More precisely, the first and second driving elements are first and second transistors respectively, and the proportion of the channel width W and the channel length L of the first transistor and the proportion of the channel width W and the channel length L of the second transistor are preferably substantially equal.

Furthermore, the current drive circuit may have a supply means for supplying the precharge voltage to the node and the signal line through an impedance transformation amplifier.

Also, the current drive circuit may have a means for plural setting for setting a plurality of the precharge voltage, and a selective supply means for supplying the precharge voltage to the node and the signal line selectively corresponding to the magnitude of the signal current.

The current drive circuit may also have a means for setting a precharge period $T_b$ for supplying the precharge voltage to the node and the signal line as $T_b = R_L \times C_L$ according to a wiring resistance $R_L$ and a parasitic capacitance $C_L$ of the signal line.

In the case where a supply period $T_a$ for supplying the signal current to the driven circuit is in a relation of $T_a < T_b$, the current drive circuit may have a means for setting so that $T_a = T_b$ is established.

Also, a display device comprising an image circuit which receives image data as a current through a current line, and a current drive circuit for supplying the image data to the current line as a signal current, wherein the current drive circuit has a source driver current source for supplying a signal current corresponding to the image data from a node to the current line, a precharge circuit for supplying a precharge voltage to the node and the current line, and a supply means for supplying the precharge voltage to the node and the current line prior to supplying the signal current.

The display device may have a means for supplying the precharge voltage to the current line through an impedance transformation amplifier.

Further, a display device of the invention comprising a pixel circuit having a signal line which transfers image data as a signal current and a first driving element which supplies a drive current which is in proportion to the signal current from a power supply line, and a source driver circuit having an image signal input current source for supplying the signal current to the signal line, wherein a precharge circuit for precharging the signal line prior to supplying the signal current to the signal line is integrated in the source driver circuit.

The precharge circuit may have a second driving element which is connected between the image signal input current source and the power supply source selectively, and outputs a precharge voltage corresponding to the signal current.

The precharge circuit may have a means for supplying the precharge voltage to the signal line through an impedance transformation amplifier.

A display device comprising a pixel circuit having a signal line which transmits image data as a signal current and a first driving element which supplies a driving current proportional to the signal current from a power supply line, and a source driver circuit having an image signal input current source for supplying the signal current to the signal line, wherein a precharge circuit for precharging the signal line prior to supplying the signal current to the signal line is integrated in the source driver circuit. The precharge circuit may have a second driving element which is connected between the image signal input current source and the power supply line selectively, and outputs a precharge voltage corresponding to the signal current. The first and second driving elements may be equal in size or the size close to it. More specifically, the first and second driving elements are first and second transistors respectively, and the proportion of the channel width W and length L of the first transistor and the proportion of the channel width W and length L of the second transistor are preferably substantially equal.

The precharge circuit may have a means for setting the precharge voltage to a value equal or close to the potential of the node in a steady state in which the signal current is supplied to the driven circuit.

Note that, in this specification, connection means electrical connection unless it is described otherwise. Therefore, the configuration disclosed in the invention may have other additional elements (such as other elements or switches, for example) which enable electrical connections in addition to the predetermined connections.

BRIEF DESCRIPTION OF DRAWINGS

FIG. 1 is a diagram showing an embodiment of a current drive circuit of the invention, in which FIG. 1(A) is a circuit diagram, FIG. 1(B) is a diagram describing a precharge operation, and FIG. 1(C) is a diagram showing an operation when current is inputted.

BEST MODE FOR CARRYING OUT THE INVENTION

Embodiment modes of the invention are hereinafter described in detail based on embodiments.

A principle of operation of a current drive circuit of the invention is described with reference to FIG. 16.

The current drive circuit is configured such that a signal current I is supplied from a signal current source 300 to a node P of a driven circuit 150 through a signal line 400.

The driven circuit 150 is configured with a thin film transistor Tr, a holding capacitor C connected between the gate and source of the thin film transistor, a switch $SW_1$ for controlling the open and close between the gate and the drain. The drain of the transistor Tr is connected to the signal line 400 at the node P.

It should be noted that in the case where a plurality of driven circuits 150 are connected to one signal line, a switch may be provided between the node P and the signal line 400. However, the switch may be disposed anywhere as long as it can control a conductive and non-conductive state of a signal current.

A signal current I is supplied to the signal line 400 through a $SW_2$ from the signal current source 300. The signal line 400 is connected to a precharge circuit 500 through a $SW_3$. The precharge circuit 500 can be configured very variably and supplies a precharge voltage $V_p$ which is almost equal to the node potential of the node P in a steady state after the signal current I is supplied to the driven circuit 150.

Figure 16:
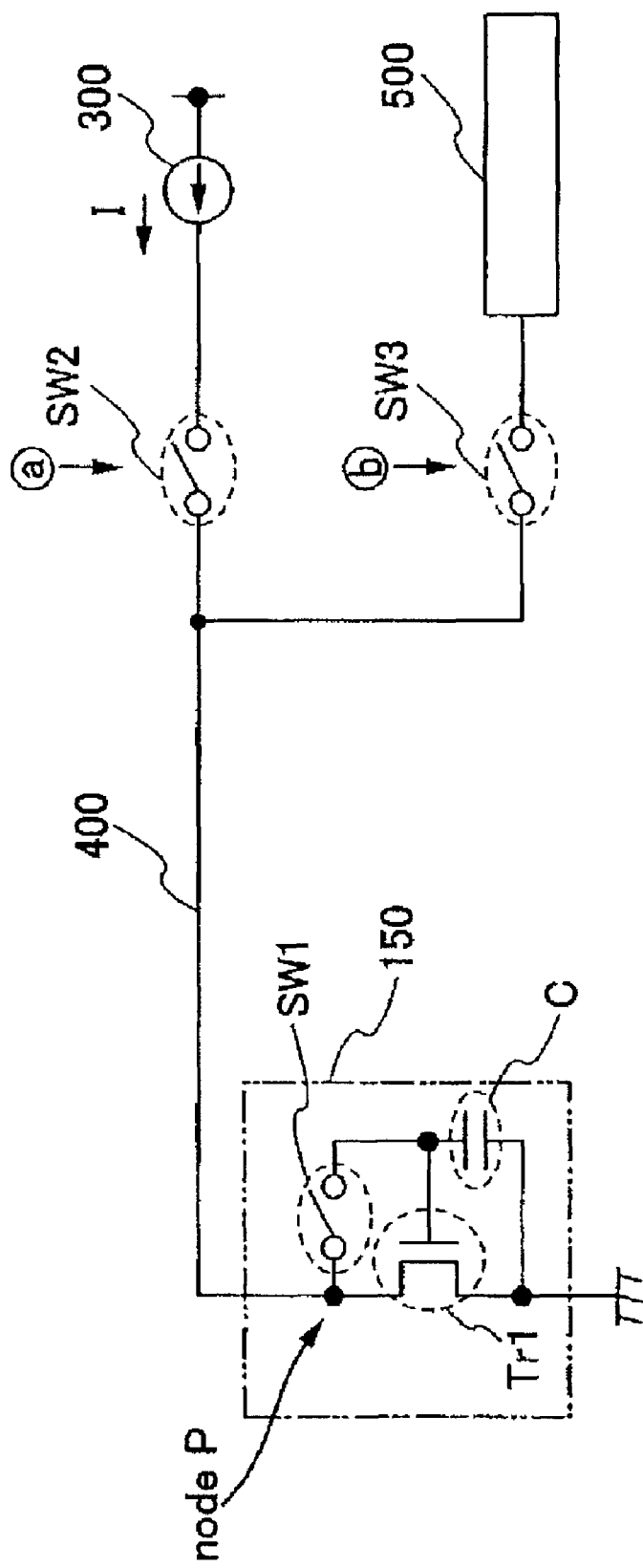
FIG. 16 is a diagram describing the principle of operation of a current drive circuit of the invention.

The operation in FIG. 16 is described with reference to FIG. 9 in comparison to the case where a precharge is not performed.

As shown in FIG. 9(A), when turning ON the switch $SW_1$ and a signal current $I_0$ is supplied to the driven circuit without performing a precharge to the node P, a current $I_1$ flows to the transistor $Tr_1$ and a current $I_2$ flows to a holding capacitor C. FIG. 9(C) shows a relationship of the changes according to time of the current $I_1$ and $I_2$ flowing to the driven circuit. FIG. 9(D) shows a voltage change at the node P according to time. It should be noted that $V_{th}$ denotes a threshold voltage of the transistor $Tr_1$.

In this manner, in the case where precharge is not performed, it takes quite a long time until the potential of the voltage of the node P becomes steady. This is because parasitic capacitance of the signal line 400 and the transistor $Tr_2$ are large and it requires a long time to charge them. In the case where the signal current $I_0$ is small, a supply of charge required to change the potential of the node P per time unit becomes small. As a result, it takes more time to charge the parasitic capacitance of the signal line 400 and the transistor $Tr_1$. On the other hand, in the case where the signal current $I_0$ is large, a supply of charge per time unit required to change the potential of the node P becomes large. Therefore, it only takes a short time to charge the parasitic capacitance of the signal line 400 and the transistor $Tr_1$.

FIG. 9(B) shows a current drive circuit in the case where the node P is precharged in advance by using a precharge voltage $V_p$ which is a little lower than the potential of the node P in a steady state by turning ON a switch $SW_3$ and using the precharge circuit 500, then the signal current $I_0$ is supplied to the node P through the signal line 400. FIG. 9(E) shows a voltage change of the node P of the driven circuit according to time.

It should be noted that in FIG. 9(E), the precharge voltage is desirably the same potential as the potential of the node P in a steady state. Even when the precharge voltage does not reach the same potential, it is efficient to precharge to the potential equivalent to the potential in the steady state since the time required to reach the stationary state can be reduced if only slightly. That is, it is efficient to precharge when the precharge voltage is closer to the potential of the node P in a steady state than the potential of the node P before the precharge.

When the precharge is performed, the switches $SW_1$ and $SW_3$ are turned ON and the precharge voltage $V_p$ is supplied to the node P. Subsequently, when the node P reaches the potential of the precharge voltage $V_p$, the switch $SW_3$ is turned OFF and the switch $SW_2$ is turned ON to supply the signal current $I_0$ to the node P. Then, the transistor $Tr_1$ becomes a steady state in a short time. Therefore, the driven circuit 150 reaches the steady state in quite a short time as shown in FIG. 9(E).

Thus, by providing a precharge period for supplying the precharge voltage $V_p$ to the node P and the signal line 400 prior to supplying the signal current and then supplying the signal current $I_0$ after the precharge period, rate for writing a signal can be higher even when the signal current is small.

Note that, the potential of the node P in a steady state depends on the magnitude of the signal current $I_0$ and characteristics (such as mobility, threshold voltage) and the size (such as gate width W and gate length L) of the transistor $Tr_1$. Therefore, it is desirable to precharge using the precharge voltage $V_p$ appropriate for each aforementioned parameter. This is because it takes extra time until the node P reaches the steady state in the case where the potential of the node P in a steady state and the precharge voltage $V_p$ are not the same. Most desirably, the precharge voltage has the same potential as the node P in the steady state. In that case, the node P can be in a steady state once the precharge is finished. Therefore, the precharge voltage is preferably changed to an optimum value according to the change in the signal current $I_0$.

It should be noted that the potential of the node P is low at first and becomes higher later to be a steady state in FIG. 9(D), however, the case where the node P is high at first and becomes lower later to be a steady state is also possible. In that case, charge in the holding capacitor C is discharged through the transistor $Tr_1$. Then, the potential of the node P gets lower gradually and reaches the steady state.

In the case where the signal current $I_0$ is very small, however, current value flowing between the source and drain of the transistor $Tr_1$ becomes small since the voltage between the gate and source becomes small when the potential of the node P becomes low. As a result, it takes quite a long time to discharge the charge of the holding capacitor C. Therefore, in the case where the signal current $I_0$ is very small, it is preferable to precharge the node P by using the precharge voltage $V_p$ which is a little lower than the potential of the node P in a steady state. After that, by charging the holding capacitor C, the node P can become a steady state quickly. For example, in the case where the signal current $I_0$ is smaller than a certain value, precharge may be performed so that (absolute value of) the voltage between the gate and source of the transistor $Tr_1$ becomes lower than the threshold voltage (e.g. 0 V).

Figure 9:
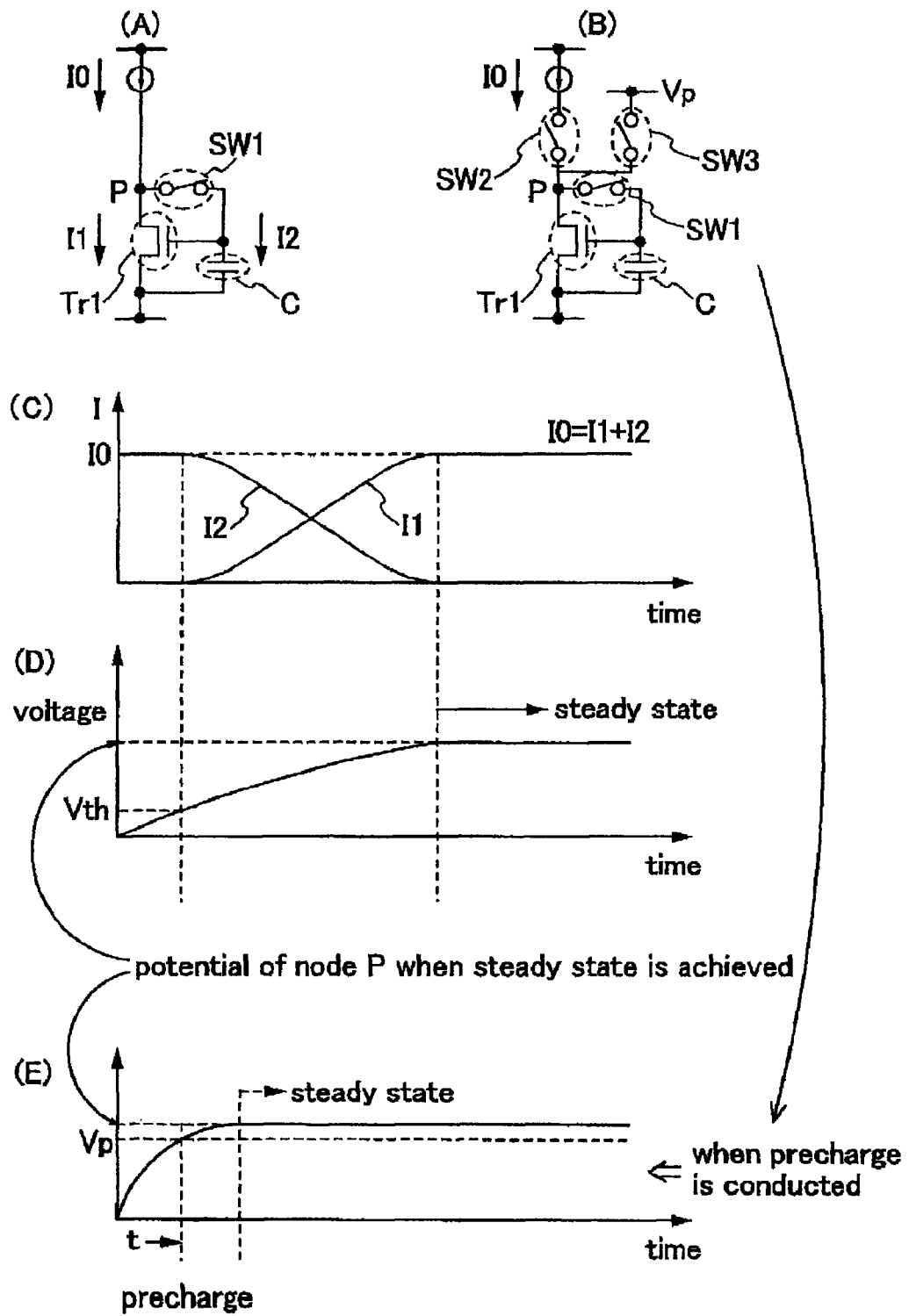
FIG. 9 is a diagram showing a current drive operation in comparison with the case where a precharge is not performed.

Note that the diagrams shown in FIGS. 16 and 9 are only general ideas of the invention, therefore an actual circuit is not limited to these configurations. For example, arrangement of each switch, existence of each switch, arrangement of the holding capacitor C, and existence of each holding capacitor C are not limited to these configurations. Further, the direction of the current flows and the polarities of the transistors are not limited to these configurations either. Moreover, the number of the signal current sources 300 and the precharge circuits 500 are not limited to these configurations and can be transformed into other configurations easily. For example, the holding capacitor C does not have to be disposed and the drain terminal and the gate terminal can be short circuited by removing the switch $SW_1$. Further, the holding capacitor C is connected to the gate terminal and the source terminal, however, it may be connected to the gate terminal and some other wirings as well.

Note that the precharge voltage is supplied to the node P prior to supplying the signal current in FIGS. 16 and 9, however, it may be combined with other precharge methods as well. For example, after supplying the precharge voltage, another precharge may be preformed and then the signal current may be supplied. Or, a signal may be supplied after a plurality of precharge voltages are supplied subsequently.

Embodiment 1

Figure 17:
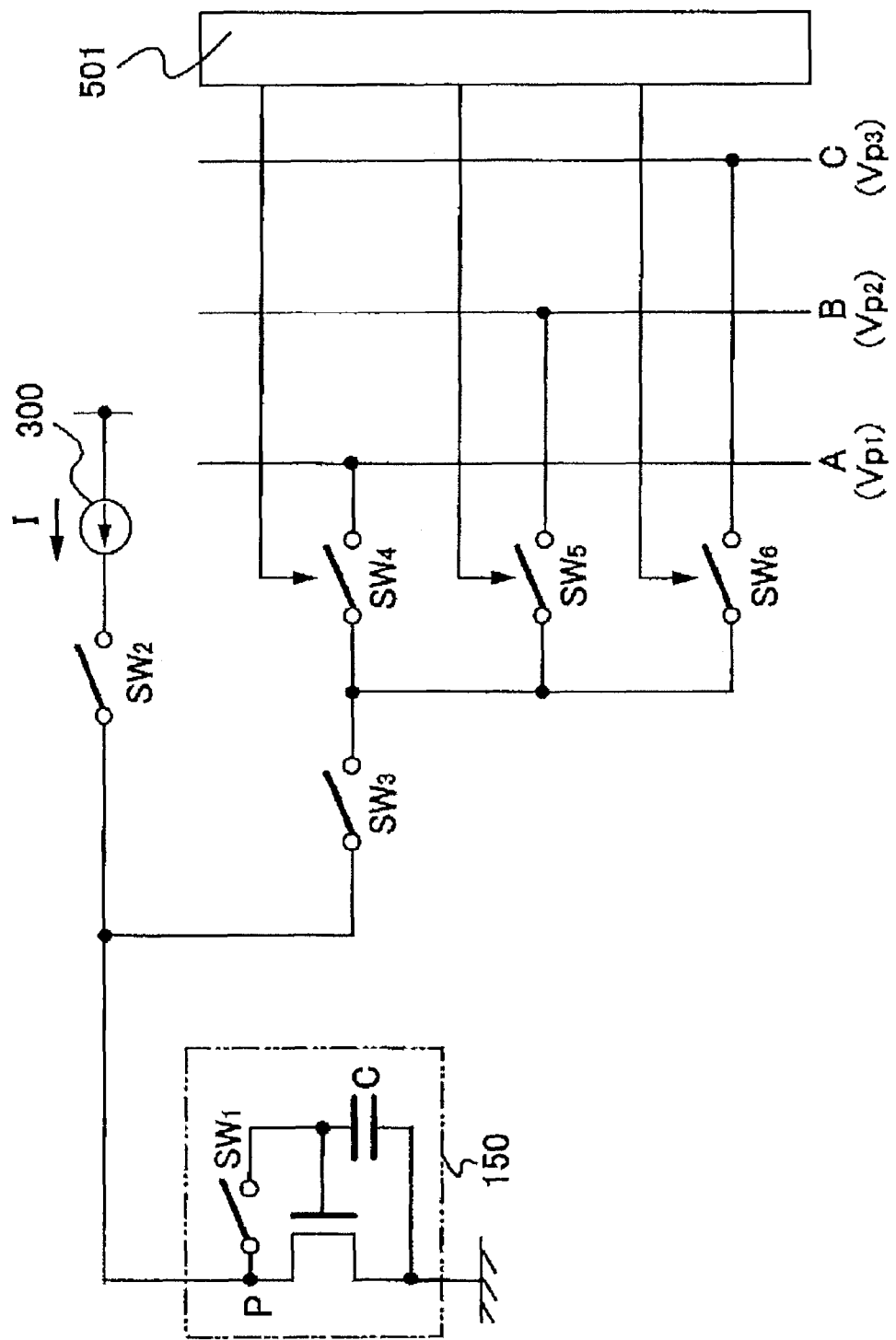
FIG. 17 is a diagram showing an embodiment of a current drive circuit according to the invention.

FIG. 17 shows a circuit diagram of a current drive circuit showing an embodiment of the invention. FIG. 17 shows an example of the specific configurations of the precharge circuit 500 shown in FIG. 16.

As described above, the precharge voltage $V_p$ is not always equal to the potential of the node P in a steady state, however, it can be set to the potential close to this one. The magnitude of the precharge voltage $V_p$ can be set appropriately according to the signal current I. FIG. 17 shows a circuit in which a plurality of precharge voltage $V_p$ is set according to the signal current I and supplied to the node P selectively.

For example, the precharge circuit is designed so that a precharge voltage $V_{p1}$ is supplied when the signal current I is 0 to 10 mA, a precharge voltage $V_{p2}$ is supplied when the signal current I is 10 to 20 mA, and a precharge voltage $V_{p3}$ is supplied when the signal current I is 20 to 30 mA, then the precharge circuit for supplying these precharge voltages is composed to be connected to terminals A, B, and C. By using a switching circuit 501, $SW_4$ to $SW_6$ are sequentially switched in accordance with the signal current I for supplying the node P.

It should be noted that an optimum precharge voltage (that is, a potential of the node P in a steady state) changes when the signal current I is changed as described above. Therefore, the precharge voltage $V_{p2}$ to be supplied when the signal current I is 10 to 20 mA is preferably between the optimum precharge voltage (a potential of the node P in a steady state) when the signal current I is 10 mA and the optimum precharge voltage when the signal current I is 20 mA.

For example, the precharge voltage $V_{p2}$ may be a voltage between the optimum precharge voltage when the signal current I is 10 mA and the optimum precharge voltage when the signal current I is 20 mA, or the optimum precharge voltage when the signal current I is 10 mA, or the optimum precharge voltage when the signal current I is 20 mA. However, in the case where the optimum precharge voltage when the signal current I is 10 mA or the optimum precharge voltage when the signal current I is 20 mA is applied to $V_{p2}$, the precharge voltage of smaller signal current is preferable (in this case, the optimum precharge voltage when the signal current I is 10 mA). By inputting a small signal current before inputting a large signal current, a steady state can be obtained more quickly than the case of inputting a large signal current first and a steady state is obtained (an optimum precharge voltage for a large signal current) and then a small signal current is inputted. That is, a stationary state can be obtained more quickly when performing a precharge with the optimum precharge voltage when the signal current I is 10 mA than with the optimum precharge voltage when the signal current I is 20 mA. This is because in the case where the precharge is performed with the optimum precharge voltage when the signal current I is 20 mA, and an absolute value of the voltage between the gate and source of the transistor $Tr_1$ is larger than the absolute value of the voltage between the gate and source in a steady state. Therefore, after the precharge, the absolute value of the voltage between the gate and source of the transistor $Tr_1$ gets smaller gradually. Thus, a charge in the holding capacitor C is not easily discharged through the transistor $Tr_1$. It takes longer time to reach the steady state. Therefore, it is preferable to precharge with the optimum precharge voltage for the smaller signal current.

Note that the precharge voltage is supplied by using three terminals A, B and C, however, the invention is not limited to this configuration. Any number of terminals may be provided.

Furthermore, when connecting to the terminals A, B, and C, range of the current does not always have to be in equal intervals. For example, such case may be employed as the precharge voltage $V_{p1}$ is supplied when the signal current I is 0 to 5 mA, the precharge voltage $V_{p2}$ is supplied when the signal current I is 5 to 15 mA, and the precharge voltage $V_{p3}$ is supplied when the signal current I is 15 to 30 mA. In this manner, in the case where the signal current is small, the precharge voltage is preferably supplied by classifying the current range thereof with more parts because it takes more time to reach a steady state in the case where the signal current is small. Therefore, it is preferable that the difference between the potential of the node P in a steady state and the precharge voltage as small as possible by classifying the precharge voltage into short ranges.

Note that FIG. 17 shows an example of the configurations described in FIGS. 9 and 16 in more details. Therefore, the description of FIGS. 9 and 16 can be applied to FIG. 17 also.

Embodiment 2

Figure 1:
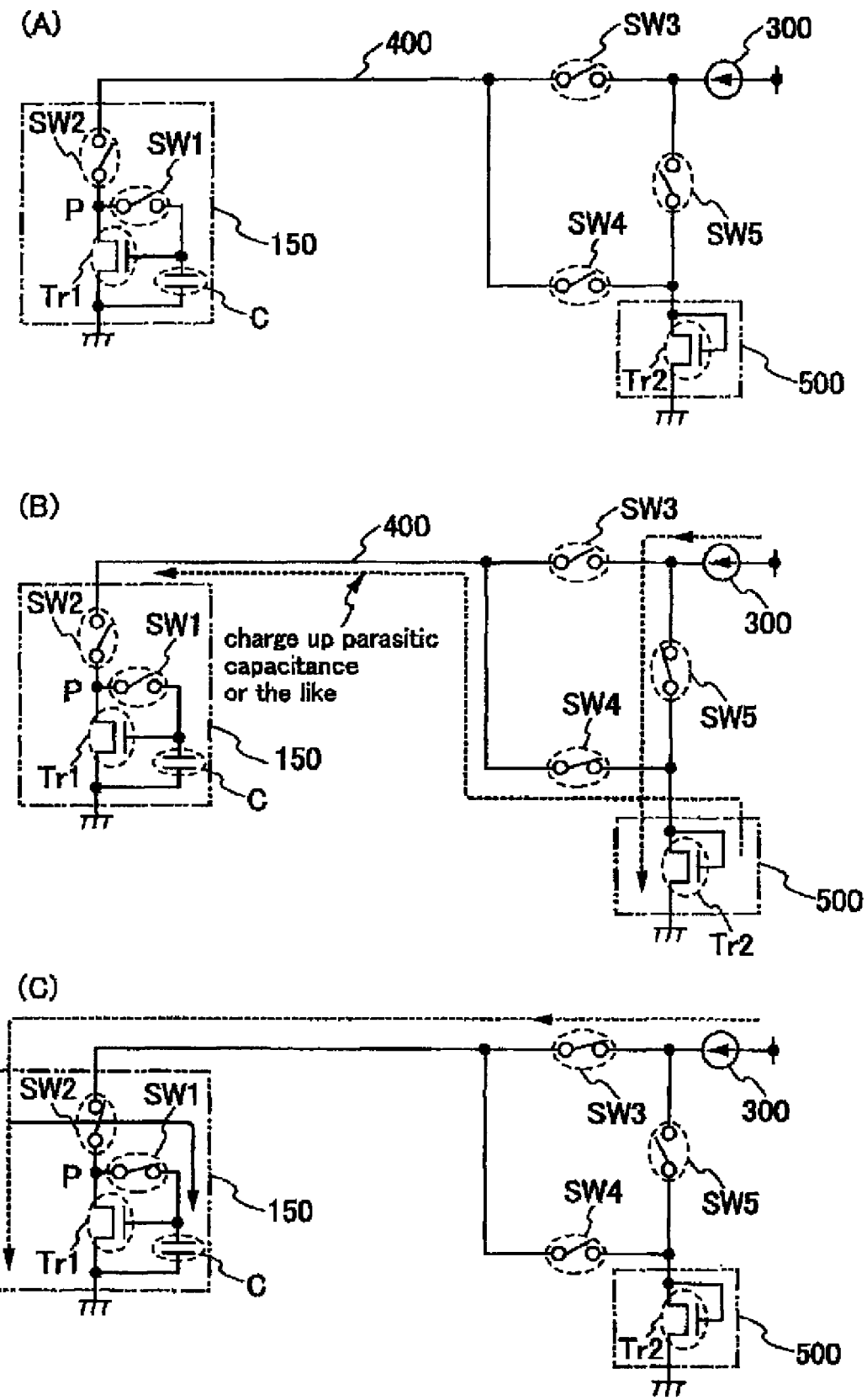

FIG. 1 shows an embodiment of a current drive circuit according to the invention. FIG. 1(A) is a circuit diagram, FIG. 1(B) is a diagram for describing the precharge operation, and FIG. 1(C) is a diagram describing an operation when a current is inputted. That is, FIG. 1 is a diagram showing an example of specific configurations which is different from FIG. 17 regarding the precharge circuit 500 shown in FIG. 16.

In the present embodiment, the precharge circuit 500 is configured with a transistor $Tr_2$ which is almost the same in size (or a similar ratio of the gate width W and the gate length L: W/L) and the same conductivity as the transistor $T_{r1}$ in the driven circuit 150. By this configuration, the precharge voltage $V_p$ generated by supplying a signal current from the signal current source 300 to the precharge circuit 500 becomes almost equal to the potential of the node P in a steady state in which a signal current is supplied to the driven circuit 150.

In this manner, a writing rate can be even higher by setting the precharge voltage $V_p$ to the potential almost equal to the node potential of the node P in a steady state in which a signal current is supplied to the driven circuit 150.

In the case of precharge operation, switches $SW_4$ and $SW_5$ are closed (turned ON) as shown in FIG. 1(B) and a signal current is supplied to the precharge circuit 500. Then, the precharge voltage $V_p$ is generated in the drain of the transistor $Tr_2$. Moreover, as the switch $SW_4$ is closed (turned ON), the parasitic capacitance and the like are charged in the signal line 400 by the signal current 300, and the potential thereof reaches the precharge voltage $V_p$. After reaching this state, the switches $SW_4$ and $SW_5$ are turned OFF and the switch $SW_3$ is turned ON. Further, the switches $SW_1$ and $SW_2$ in the driven circuit 150 are turned ON.

Then, the signal current is supplied to the driven circuit 150 through the signal line 400 and the current is supplied to the transistor $Tr_1$ and the holding capacitor C as shown in FIG. 1(C).

After reaching the steady state, the potential of the node P becomes equal to the potential required for the transistor $Tr_1$ to flow the same current as the signal current. A charge is stored in the holding capacitor C even after turning OFF the $SW_1$, therefore a current keeps flowing to the transistor $Tr_1$ while the signal current from the signal current source 300 is held.

In this manner, by using the transistor $Tr_2$, an optimum precharge voltage in accordance with the signal current can be generated. That is, even when the signal current changes, the precharge voltage changes accordingly. As a result, a quick precharge can be performed even when the magnitude of signal current changes. Further, in the case where there is no variation in characteristics of the transistors $Tr_1$ and $Tr_2$, a steady state can be obtained right after the precharge.

It should be noted that the signal current at the time of precharge in FIG. 1(B) and the signal current in FIG. 1(C) are preferably the same, however, the invention is not exclusively limited to this. For example, the signal current may be made a little smaller only when precharging. As a result, the precharge voltage can have a smaller value than an ideal value.

Alternatively, the precharge voltage can be a smaller by adjusting the size of the $Tr_2$ (for example, making the gate width W large or the gate length L small). In this case, the same effect as the case where the signal current is made a little smaller only when precharging. Thus, it is effective to make the precharge voltage smaller than the ideal value in the case where the signal current is small as described above.

Furthermore, in the case where a plurality of driven circuits 150 are disposed and the signal current is inputted sequentially, e.g., in the case where a plurality of pixels are disposed, a circuit which is not working as a driven circuit 150 may be used as a transistor $Tr_2$. That is, in the case of inputting a signal current into the certain driven circuit 150, another driven circuit 150 may be used as a transistor $Tr_2$ and the precharge voltage may be generated.

As FIG. 1 shows a part of the configurations in FIGS. 9 and 16 described in more details. Therefore, the description of FIGS. 9 and 16 can be applied to FIG. 1 also. That is, even when the arrangement and the connection of the switches are changed, a similar circuit can be configured.

Embodiment 3

Figure 2:
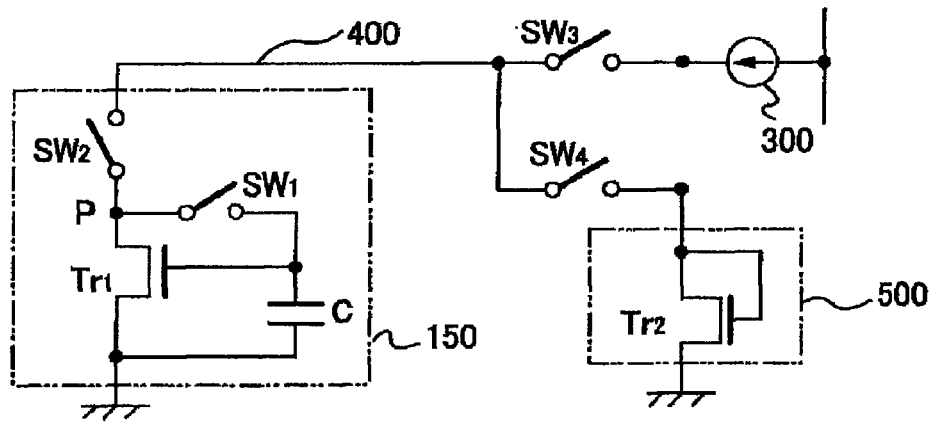
FIG. 2 is a diagram showing another embodiment of the current drive circuit of the invention.
Figure 2:
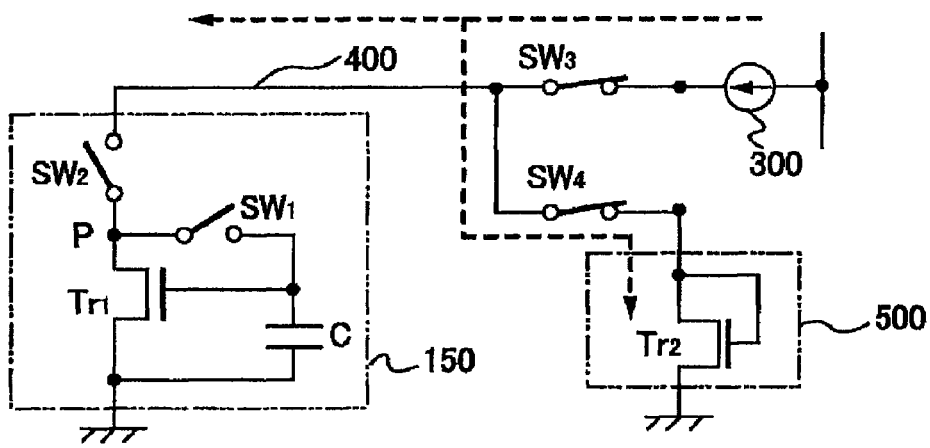
Figure 2:
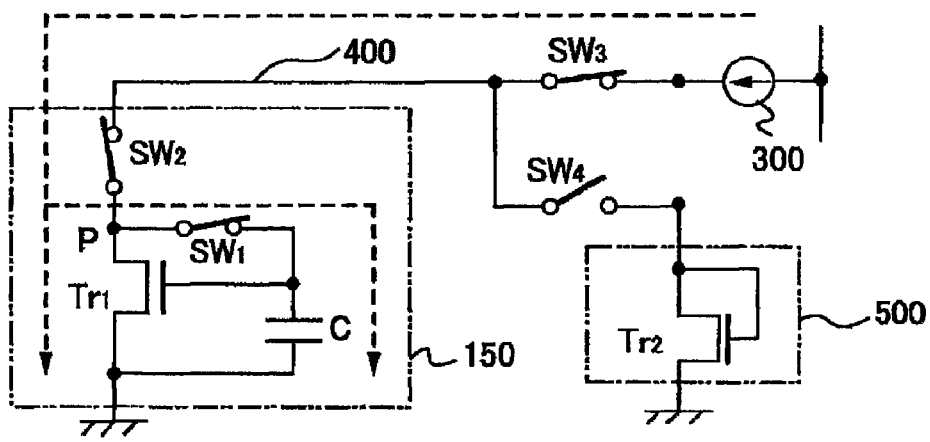

FIG. 2 shows an example where the arrangement and the connection of the switches in FIG. 1 are changed. Elements which are identical to FIG. 1 are denoted by the same reference numerals in FIG. 2. In the configuration of the embodiment shown in FIG. 2, the switch $SW_5$ is omitted, however, the other configurations are the same as FIG. 1.

As shown in FIG. 2(B), the switches $SW_3$ and $SW_4$ are turned ON and the precharge voltage $V_p$ is generated in the precharge circuit 500. The precharge is performed until the potential reaches $V_p$ by the signal current source 300. The current is inputted in the same way as FIG. 1 in which the switch $SW_4$ is turned OF while the switch $SW_3$ is turned ON. In the present embodiment, it is advantageous that a number of the switches can be smaller than FIG. 1.

In this manner, the number and arrangement of the switches are various. The invention is not exclusively limited to the configurations shown in FIGS. 1 and 2 as long as a similar operation to FIGS. 1 and 2 can be obtained.

Figure 34:
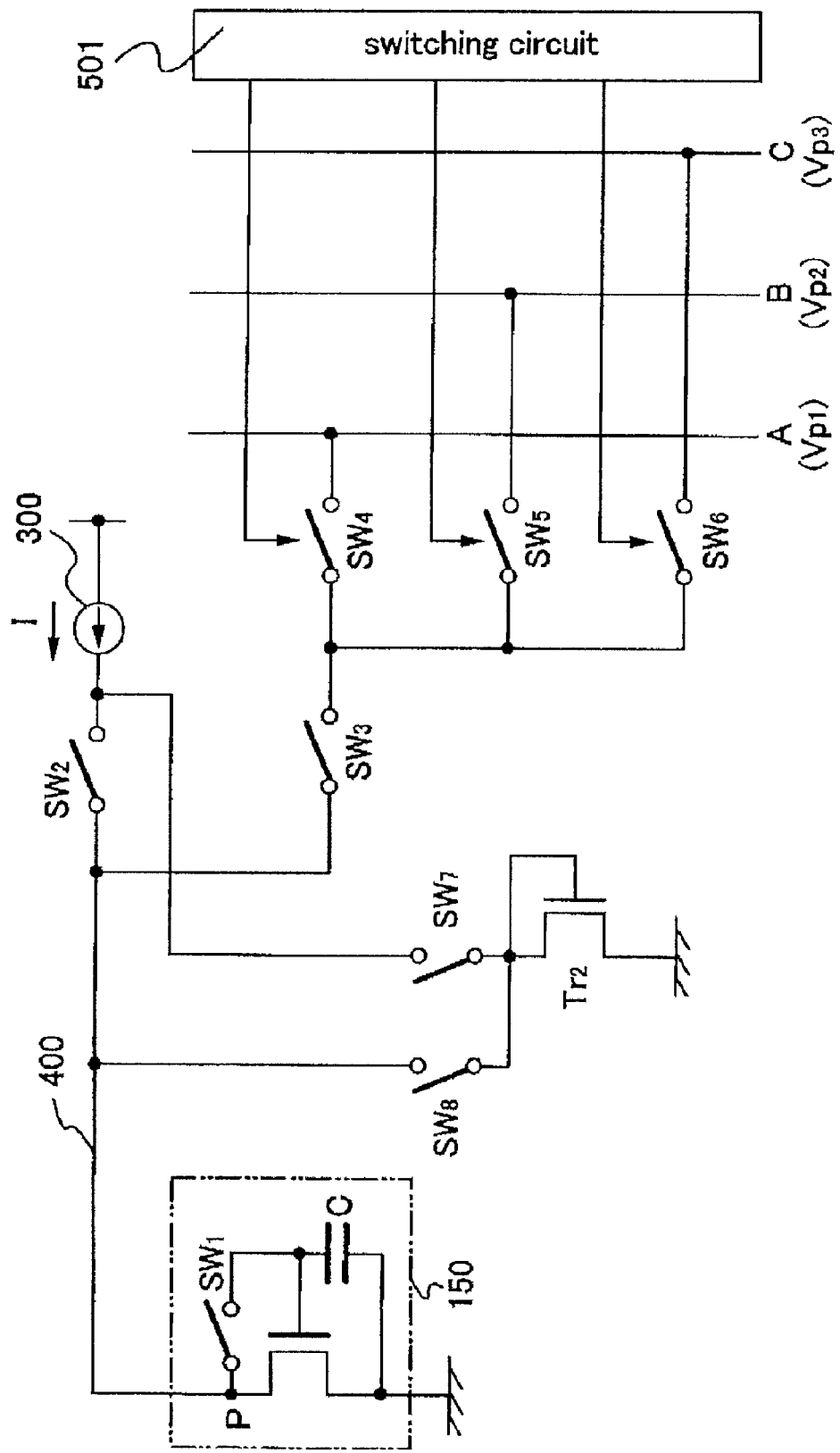
FIG. 34 is a diagram showing another embodiment of a current drive circuit of the invention.

Furthermore, the precharge circuit as shown in FIG. 1 or 2, and the precharge circuit shown in FIG. 17 may be combined as shown in FIG. 34. In FIG. 34, switches $SW_7$ and $SW_8$ and a transistor $Tr_2$ correspond to the precharge circuit in FIGS. 1 and 2. First, a precharge is performed with the charge supplied from the terminals A, B and C by using the switching circuit 501 and the switches $SW_3$ to $SW_6$, and then another precharge is performed by using the switches $SW_7$ and $SW_8$ and the transistor $Tr_2$, and a signal current may be inputted. Further, other ways of precharge may be combined in addition.

Embodiment 4

Figure 3:
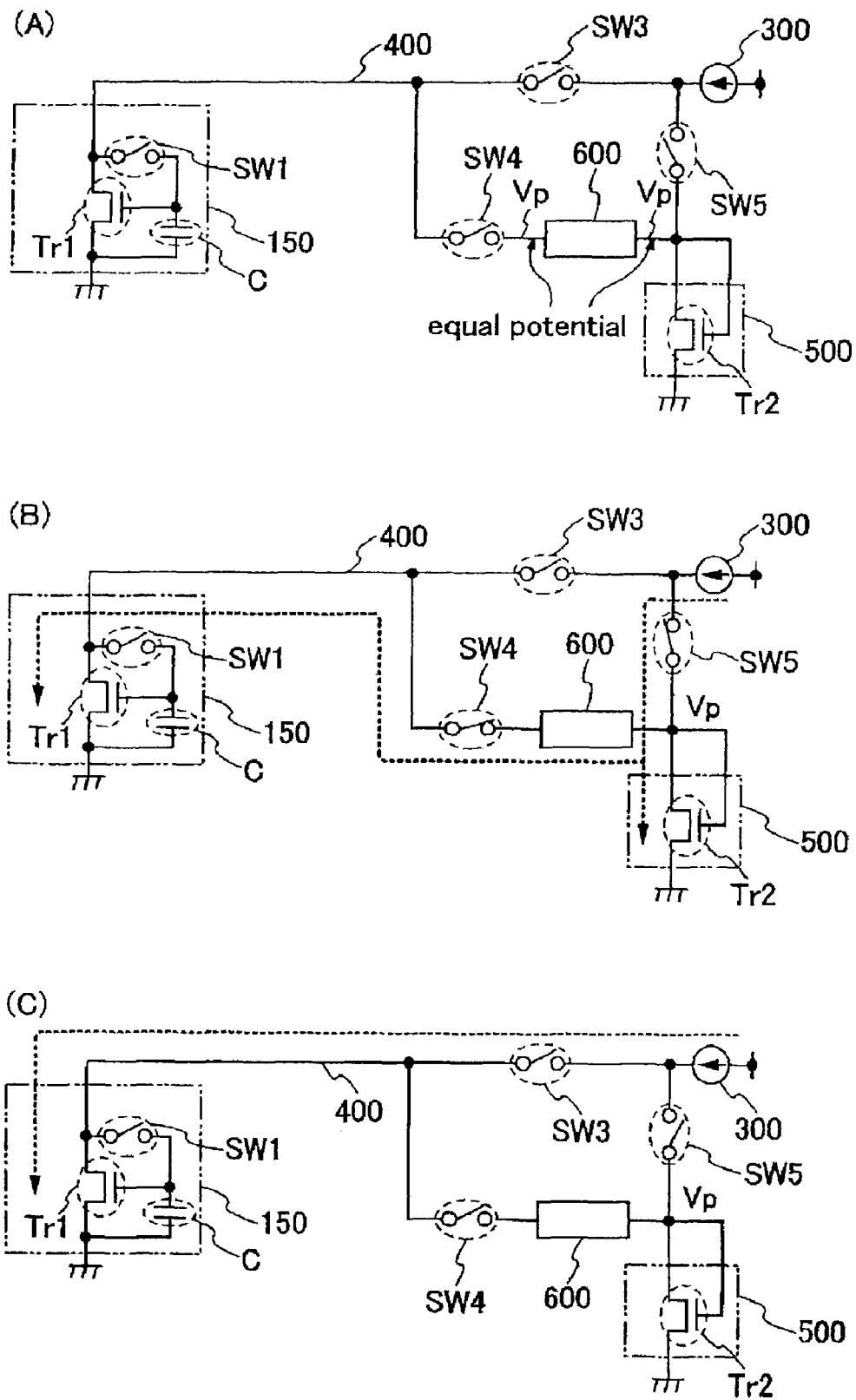
FIG. 3 is a diagram showing another embodiment of the current drive circuit of the invention.

FIG. 3 is a diagram showing another embodiment of current drive circuit of the invention. FIG. 3 is different from FIG. 1 in the respect that an impedance conversion amplifier 600 is inserted between the precharge circuit 500 and the switch $SW_4$. Because other circuit configurations and the operations are similar to the case shown in FIG. 1, detail description is omitted here.

The impedance conversion amplifier 600 can be configured by a voltage follower circuit, an analog buffer circuit, a source follower circuit, an operational amplifier and the like. The impedance conversion amplifier 600 has a function to convert the impedance of the input side and the impedance of the output side, thus the input voltage and output voltage can be kept at the same potential.

A precharge voltage $V_p$ of the precharge circuit 500 is kept at the same potential $V_p$ even on the output side of the amplifier 600, however, signal line 400 can be charged at a high rate as the current drive ability is improved because the impedance for output of the amplifier 600 is very low. Therefore, it is advantageous in that precharge operation can be done in a short time.

As in FIG. 34, configurations using a combination of FIGS. 3 and 17 or FIGS. 1 and 2 and the like may be employed as well.

Note that FIG. 3 shows an example of a part of the configurations in FIGS. 9 and 16 described in more details. Also an example is shown where a part of FIGS. 1 and 2 is improved. Therefore, the description in FIGS. 1, 2, 9, and 16 can be applied here as well.

Embodiment 5

Figure 4:
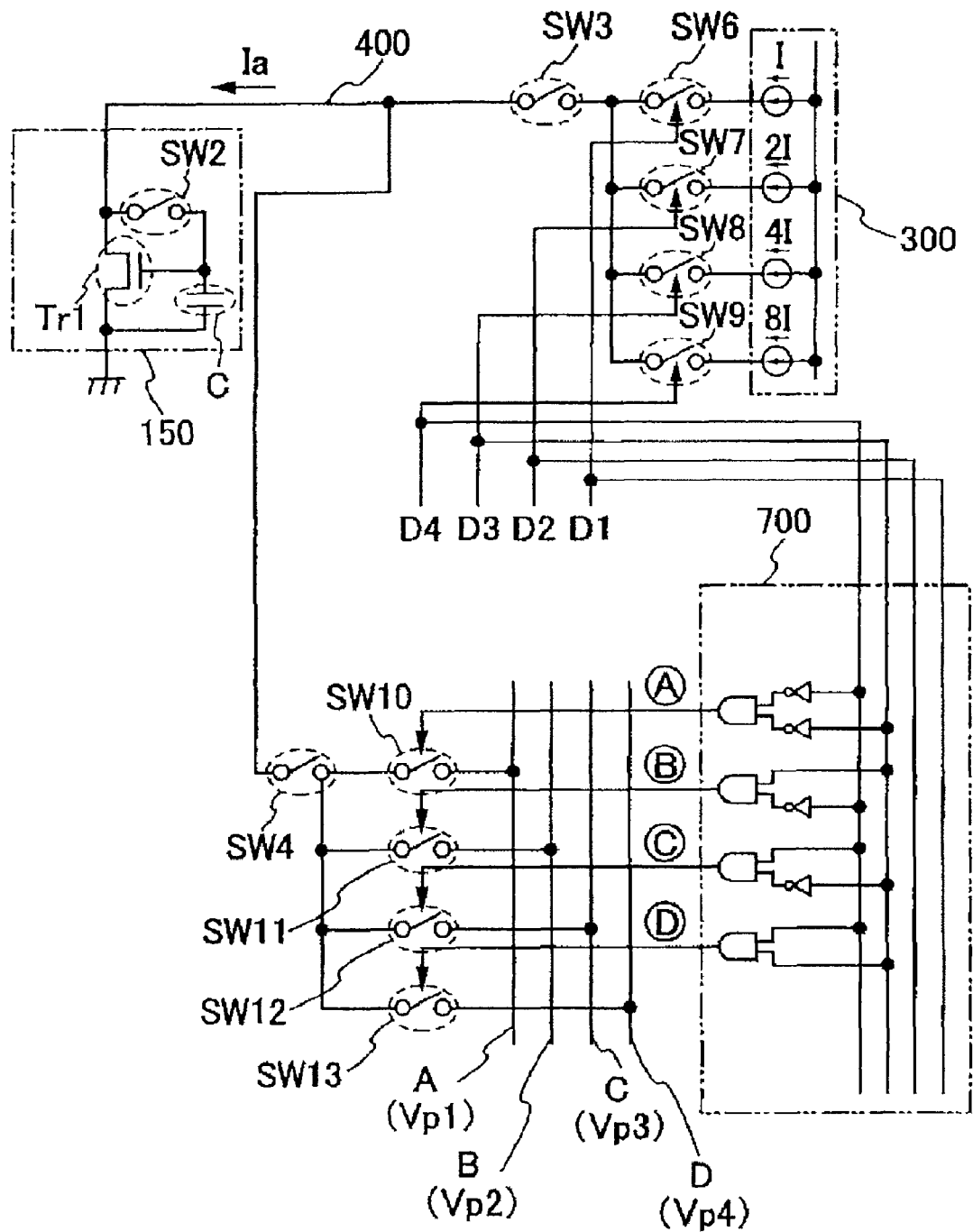
FIG. 4 is a diagram showing another embodiment of the current drive circuit of the invention.

FIG. 4 shows another embodiment of the current drive circuit of the invention. A signal current $I_a$ is supplied to the signal line 400 by selectively switching according to the current range of the signal current $I_a$. In that case, according to the magnitude of the signal current, a plurality of precharge voltages $V_p$ are set beforehand and they are switched selectively according to the magnitude of the signal current $I_a$.

FIG. 4 is an example which describes the configuration of FIG. 17 in more details. The circuit to output a signal current in FIG. 17 is shown with a signal current source 300. That is, the signal current source 300 is described notionally as a thing changing the magnitude of a signal current variously. On the other hand, there are four current sources in FIG. 4 which shows the case of controlling a current value digitally. Each current value of four current sources is the value raised to the power two such as I, 2I, 4I, and 8I and each of these corresponds to each bit. The switches $SW_6$ to $SW_9$ control whether current is outputted by a current source corresponding to each bit. The switches $SW_6$ to $SW_9$ are controlled by digital data D1 to D4. In accordance with the sum value of outputted current, current value is determined Thus, current value as many as 4 bits (16 kinds) can be controlled.

In FIG. 4, 4 bits are controlled, however, the invention is not limited to this configuration. By changing the number of current sources and the magnitude of current, the number of bits can be changed easily.

In FIG. 17, the switching circuit 501 is used as a circuit to select a precharge voltage according to the magnitude of a signal current. The precharge voltage is supplied by switching $SW_4$ to $SW_6$ according to the magnitude of signal current by the switching circuit 501 sequentially. FIG. 4 describes a precharge selection circuit 700 as an example of detailed configuration of the switching circuit 501.

As shown in FIG. 4, magnitude of signal current $I_a$ is set by means of four kinds of (4 bits) current sources to which the precharge voltages $V_{p1}$ to $V_{p4}$ correspond, and the precharge voltages $V_{p1}$ to $V_{p4}$ according to the magnitude of signal current $I_a$ is supplied to the driven circuit 150 by the precharge selection circuit 700. The precharge selection circuit 700 is configured by combining an inverter and an AND logic element.

The configuration of the precharge selection circuit 700 is not limited to the configuration of FIG. 4. The precharge selection circuit 700 can be configured by using various circuits in accordance with the configuration of the signal current source 300, the magnitude of the precharge voltage, and the number of voltage levels.

Although the magnitude of signal current is controlled by using digital data D1 to D4, the precharge voltage is selected by using the same digital data as well. The precharge voltage is selected by using digital data D1 to D4 since the precharge voltage is selected according to the magnitude of signal current. In other words, digital data control both the magnitude of signal current and the magnitude of the precharge voltage.

It should be noted that the precharge selection circuit (switching circuit) 700 shown in FIG. 4 is classified into four areas at even intervals in accordance with magnitude of current. That is to say, 0 to 4I as A, 4I to 8I as B, 8I to 12I as C, and 12I to 16I as D. The magnitude of signal current is determined by the magnitude of digital data D1 to D4. The precharge selection circuit (switching circuit) 700 controls which region of A to D the magnitude of signal current is in. By the result, on/off of the switches $SW_{10}$ to $SW_{13}$ is controlled and the precharge voltage is supplied.

Note that the areas are classified at even intervals according to the magnitude of current as A: 0 to 4I, B: 4I to 8I, C: 8I to 12I, and D: 12I to 16I, however, the invention is not limited to this configuration. The areas are desirably classified more finely when the signal current is small. This is because it requires more time to reach a steady state in the case where the signal current is small. Further, three kinds of precharge voltages are selectively outputted in FIG. 17, however, four kinds of precharge voltages are selectively outputted in FIG. 4. Nevertheless, the invention is not limited to this configuration. The precharge voltage may be classified even more finely. In that case, the precharge selection circuit 700 is dependent on the number of the areas, the interval of the signal currents of each area, the value of the precharge voltage and the like. Any configuration can be easily designed in accordance with each case.

FIG. 4 is configured as the switch $SW_6$ controls whether a current is flown from the current source of a current value I, the switch $SW_7$ controls whether a current is flown from the current source of a current value 2I, . . . , however, the invention is not limited to this configuration. Any configuration may be employed as long as the flow of a current from the current source of each bit is controlled.

Next, it is assumed that the driven circuit 150 is a pixel and the digital data D1 to D4 are video signals (image signals). Further, it is assumed that the digital data D1 to D4 are digital voltage signals.

In this case, by controlling the signal current source 300 and the switches $SW_3$ to $SW_9$ by video signals having digital voltages, an analog signal current is supplied to the signal line 400. That is to say, the signal current source 300 and the switches $SW_3$ to $SW_9$ convert the digital video voltage into the analog video current. Therefore, the signal current source 300 and the switches $SW_3$ to $SW_9$ can be considered as a circuit formed by integrating a DA converter circuit and a voltage-current conversion circuit, which can be regarded as a signal driver circuit (source driver) or a part of it which supplies a video signal to the pixel (the driven circuit 150) and the signal line 400.

Furthermore, the precharge selection circuit 700, each precharge voltage, the switches $SW_4$ and $SW_{13}$ to $SW_{13}$ supply precharge voltages to the signal line 400 by controlling the precharge voltages by using video signals having digital voltages. The precharge voltages here have analog values. Therefore, it can be said that the precharge selection circuit 700, each precharge voltage, the switches $SW_4$ and $SW_{10}$ to $SW_{13}$ convert the digital video voltage into analog video voltage. Therefore, the precharge selection circuit 700, each precharge voltage, the switches $SW_4$ and $SW_{10}$ to $SW_{13}$ can be regarded as a DA converter circuit and also a signal driver circuit (source driver) or a part of it which supplies a video signal to the pixel (the driven circuit 150) and the signal line 400.

It should be noted that a circuit which converts digital voltage into analog voltage includes a resistance dividing DA (digital-analog) converter circuit (R-DAC) or a capacitance dividing DA converter circuit (C-DAC) as known techniques. Therefore, as a means for supplying a precharge voltage, it is possible to output a precharge voltage having finer intervals by using the resistance dividing DA (digital-analog) converter circuit (R-DAC) or the capacitance dividing DA converter circuit (C-DAC) in addition to the precharge selection circuit 700, the switches $SW_4$ and $SW_{10}$ to $SW_{13}$ as shown in FIG. 4. In the case of employing the resistance dividing DA (digital-analog) converter circuit (R-DAC) or the capacitance dividing DA converter circuit (C-DAC), some precharge voltages may be supplied as standard voltages of the DA converter circuit. Then, the precharge voltage supplied to the DA converter circuit may be further divided and supplied to the pixel (the driven circuit 150) or the signal line 400 as a precharge voltage. However, detailed description on that case is omitted here.

It should be noted that four current sources are used in the signal current source 300 in FIG. 4, however, the invention is not limited to this configuration. Any number of current sources can be used.

It should be noted that the precharge selection circuit 700 in FIG. 4 is configured by using a combination of an inverter and an AND logic element, however, the invention is not limited to this configuration. Any configuration can easily be designed by using various digital circuits and analog circuits.

Furthermore, the number, arrangement, each connection or the like in FIG. 4 are not also limited to the circuit in FIG. 4. It can easily be changed to a circuit which operates similarly.

Note that the circuit in FIG. 4 may be combined with such circuits as FIGS. 1 and 2 as shown in FIG. 34. Further, the circuit in FIG. 4 may be combined with a circuit in FIG. 3. That is, an impedance transformation amplifier may be used.

Note that, FIG. 4 shows an example of a part of the configuration described in FIGS. 9, 16 and 17 in more details. Therefore, the description of FIGS. 9, 16 and 17 can be applied here as well.

Note that the driven circuit 150 is assumed as the pixel and the signal current source 300 is assumed as a part of the signal driver circuit, however, the invention is not limited to this.

It may be assumed that the driven circuit 150 is a signal driver circuit (a part of it or a current source arranged therein) and the signal current source 300 is a circuit for supplying a current to the signal driver circuit.

Figure 5:
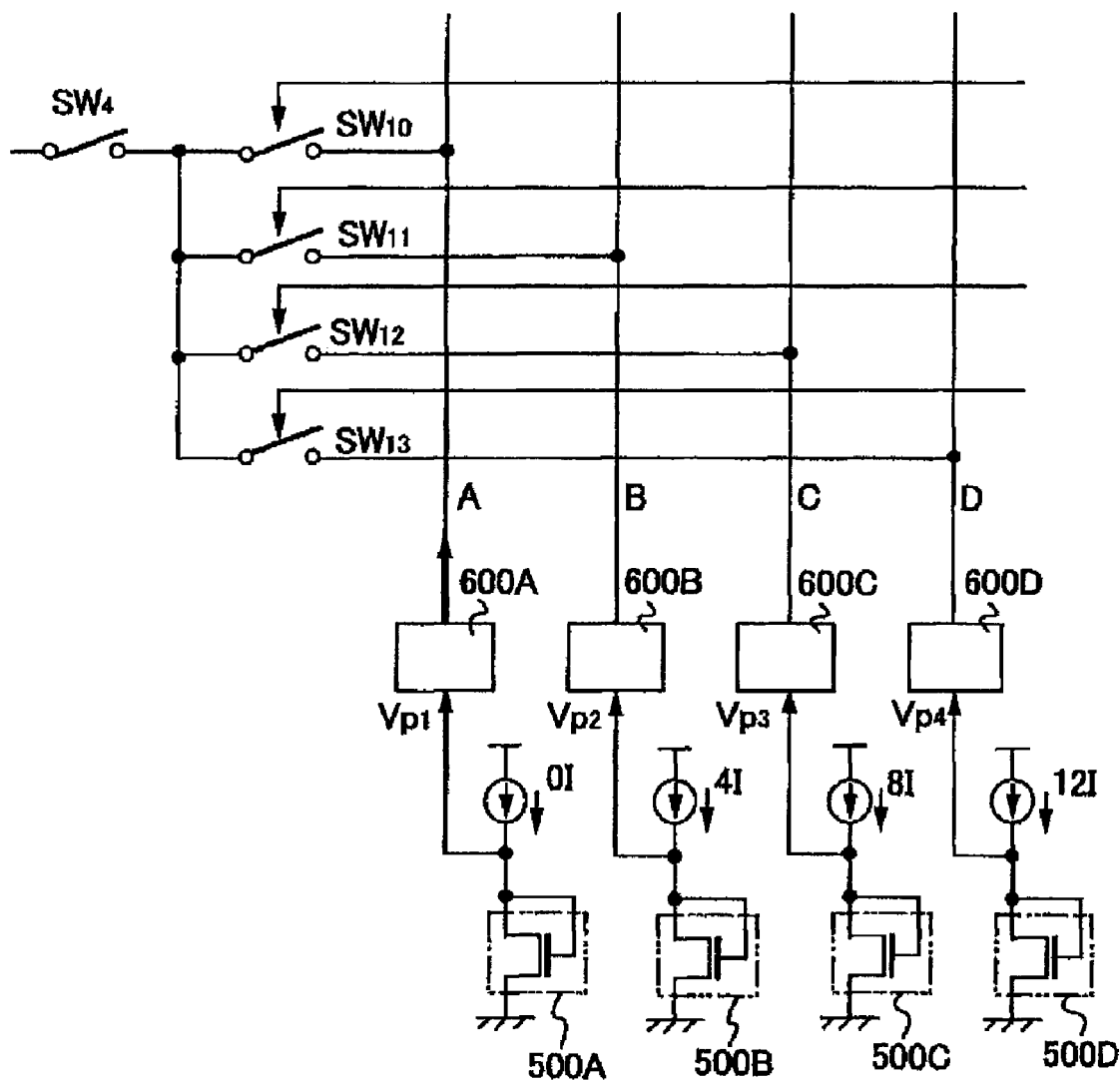
FIG. 5 is a circuit configuration for automatically generating the precharge voltage from $V_{p1}$ to $V_{p4}$ in the embodiment in FIG. 4.

FIG. 5 shows a circuit configuration for automatically generating the precharge voltages $V_{p1}$ to $V_{p4}$ in the embodiment in FIG. 4 (or FIG. 17). This corresponds to the one utilizing the configuration in FIG. 3.

Precharge circuits (transistors) 500A, 500B, 500C, and 500D are provided for each of the signal current areas A to D. Signal currents (0I, 4I, 8I, and 12I) are supplied to these circuits to generate precharge voltages, and these precharge voltages are taken out through impedance conversion amplifiers 600A, 600B, 600C and 600D and supplied to the driven circuit 150 as precharge voltages $V_{p1}$ to $V_{p4}$ in accordance with the selection of the precharge selection circuit 700.

Note that the circuit operation thereof is the same as the embodiments shown in FIGS. 1 to 4, 9, 16 and 17, therefore the detailed description is omitted here. Therefore, the description made on the aforementioned figures can be applied here as well.

For example, polarity or transistor size of the precharge circuits (transistors) 500A, 500B, 500C, and 500D are preferably the same as the driven circuit 150.

Note that in FIG. 5, all the four precharge voltages are generated, however, the invention is not limited to this configuration. For example, the smallest value (0I) is used in the case where a precharge voltage corresponding to the area A (0I<Ia<4I) is generated. In that case, an appropriate voltage may be supplied directly without using the precharge circuit (transistor) 500A or the impedance conversion amplifier 600A.

Note that the precharge circuits (transistors) 500A, 500B, 500C, and 500D in FIG. 5 may be arranged exclusively for the precharge circuit, or may utilize the driven circuit 150 or a part of it. Or, the signal current source 300 or a part of it may be utilized as well.

Note that although the impedance conversion amplifiers 600A, 600B, 600C and 600D are used in FIG. 5 as shown in FIG. 3, the invention is not limited to this configuration. The impedance conversion amplifier may not be used as shown in FIG. 1.

Figure 6:
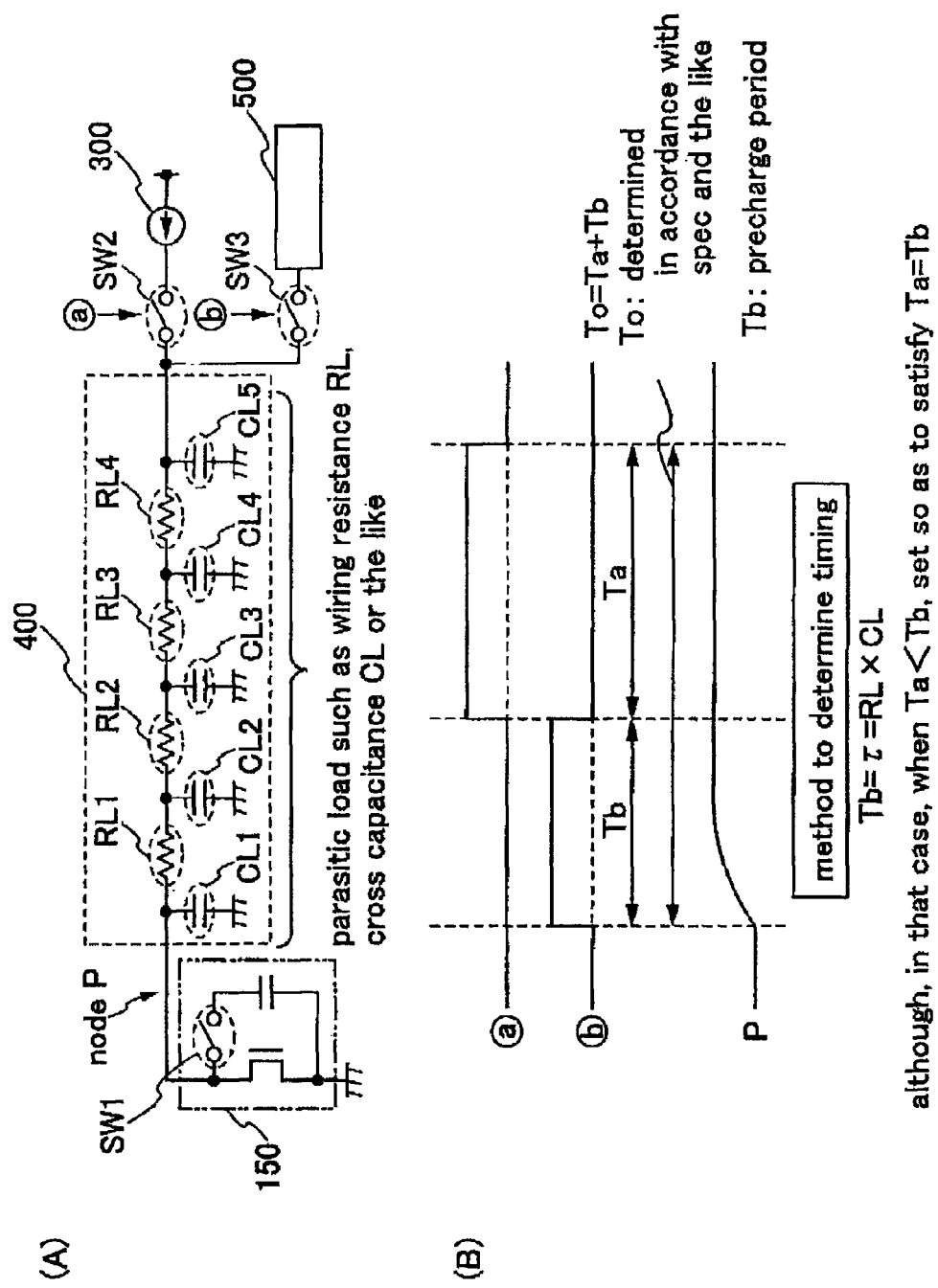
FIG. 6 is a diagram showing a relationship between a precharge period $T_b$ and a supply period $T_a$ of a signal current for a driven circuit after the precharge period.

FIG. 6 shows a relation of a precharge period $T_b$ for supplying a precharge voltage $V_p$ to a node P and a supply period $T_a$ for supplying a signal current to the driven circuit 150 after the precharge period, in consideration with the case where a parasitic load exists such as a wiring resistance $R_L$ or a cross capacitance $C_L$ on the signal line 400 to which a signal current is transmitted from the signal current source 300.

As shown in FIG. 6(A), in the case where the parasitic load (a wiring resistance $R_L$ and a cross capacitance $C_L$) exists on the signal line 400, the switch $SW_3$ is turned ON. Time $T_b$ for applying a precharge voltage $V_p$ having almost the same potential as the node P in a steady state from the precharge circuit 500 is set so as to satisfy $T_b = R_L \times C_L$.

Further, the supply period Ta following the precharge period $T_b$ is preferably set longer than the precharge period $T_b$, and in the case where the precharge period $T_b$ which is calculated above becomes as $T_a < T_b$, it is preferable to set so as to satisfy $T_a = T_b$. Further, an entire period $T_0$ is set according to the spec and the like.

Note that the magnitude of $T_b$ corresponds to a time constant when parasitic load is charged by using an ideal power source. That is to say, in the case there is time as much as the time constant, a potential of the signal line 400 becomes almost equal to the precharge voltage. Therefore, the magnitude of $T_b$ is preferably set the same as the time constant. However, in the case of actually supplying a precharge voltage, the voltage is not supplied by using the ideal power source, therefore it takes more time to charge than the case of using the ideal power source. Therefore, $T_b$ may be somewhat longer than the time constant. Thus, the lengths of $T_a$ and $T_b$ are not limited to the case of FIG. 6.

Figure 7:
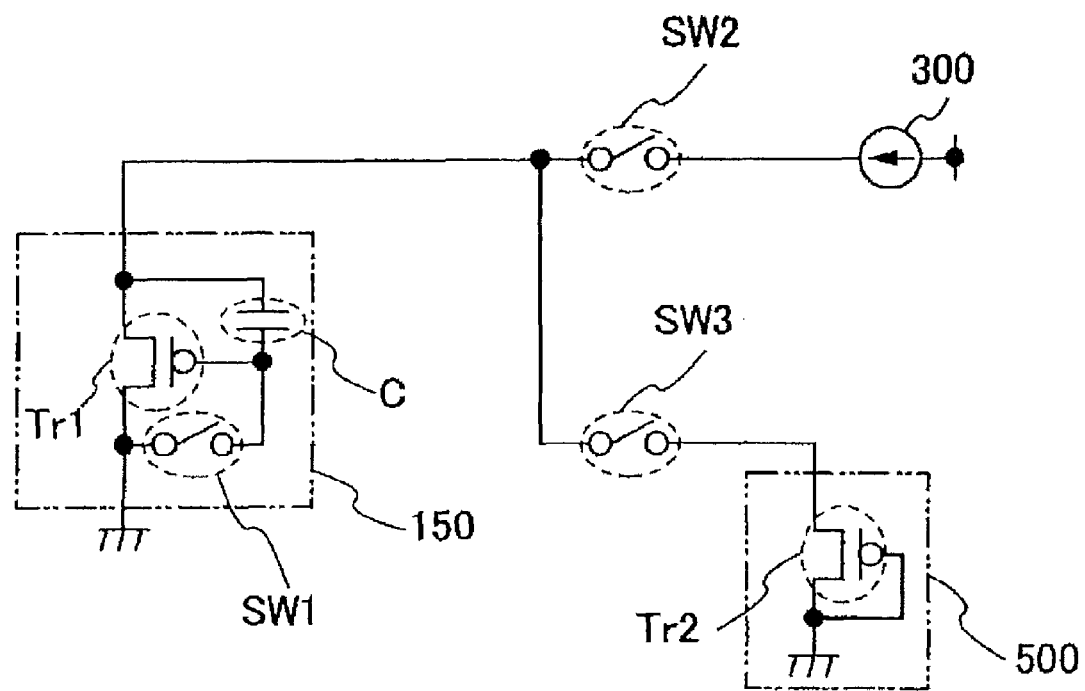
FIG. 7 is a diagram showing a current drive circuit in the case where a polarity of the transistor $Tr_1$ configuring the driven circuit is changed to a p-channel type.

FIG. 7 shows a current driver circuit in the case where the polarity of the transistor $Tr_1$ configuring the driven circuit 150 in the circuit of FIG. 2 is changed to a p-channel type.

In this case, although a connection of the switch $SW_1$ and the holding capacitor C is changed as shown, the other circuit configuration is the same. That is, the holding capacitor C is connected between the gate and source of the transistor $Tr_1$ and the switch $SW_1$ is connected between the gate and drain of the transistor $Tr_1$. The polarity of the transistor $Tr_1$ configuring the driven circuit 150 is changed, therefore the connection is required to be changed accordingly.

Furthermore, in the case of using a transistor $T_{r2}$ which has the same conductivity and the same size as the drive transistor $Tr_1$ which is used in the driven circuit 150 in the precharge circuit 500, a connection is required to be changed as well. That is, the gate and drain of the transistor $Tr_2$ are connected.

Figure 8:
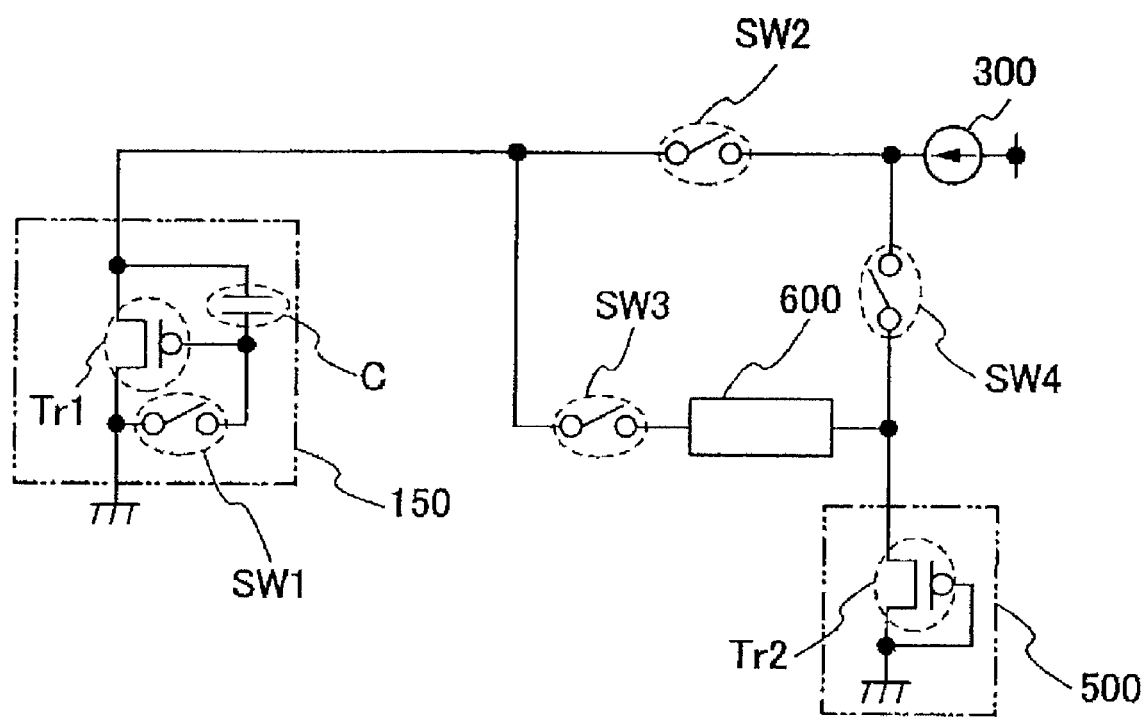
FIG. 8 is a circuit configuration in the case where a polarity of a transistor $Tr_2$ in a precharge circuit is changed to match the polarity of the transistor $Tr_1$ in the driver circuit, which is a p-channel type.

FIG. 8 shows a circuit configuration of the case where the polarity of the transistor $Tr_2$ in the precharge circuit 500 is changed to the p-channel type so as to coincide with the polarity of the transistor $Tr_1$ in the driven circuit 150, and further the impedance transformation amplifier 600 is used.

In this manner, in the case of changing the polarities (conductivity) of the drive transistor $Tr_1$ or the transistor $Tr_2$ used in the driven circuit 150 without changing the direction of signal current, a circuit can be configured by changing the connection as shown in FIGS. 7 and 8.

Note that although the polarities (conductivity) of the transistors are changed in the circuits of FIG. 2, transistors in other circuits can be changed as well.

Also, in the case of changing the direction of signal current, only the polarities (conductivity) of the transistors may be changed but the connections do not have to be changed.

The driven circuit 150 is not yet specified; therefore the case of the more specific driven circuit 150 is described now.

Figure 10:
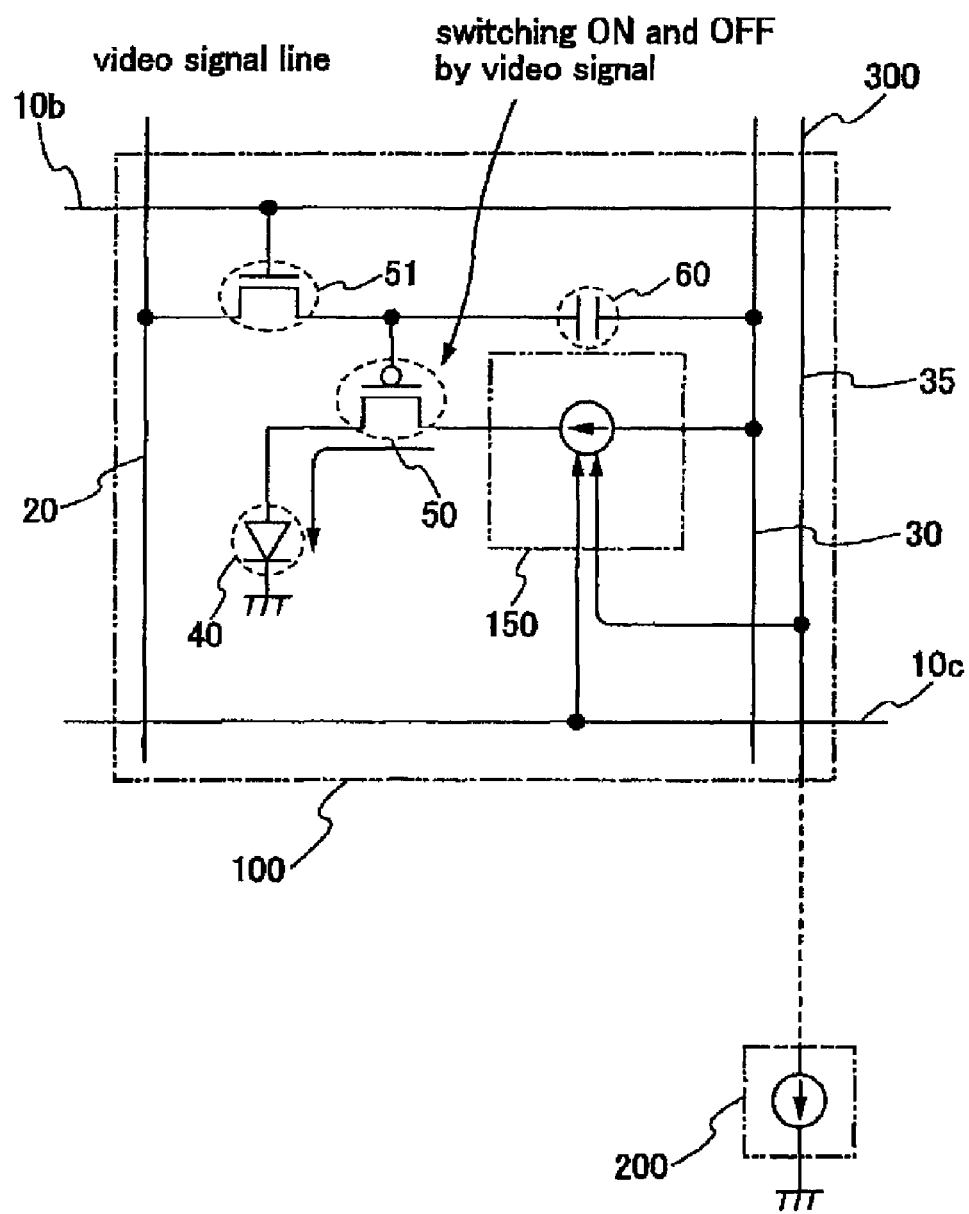
FIG. 10 is a circuit configuration of a display device using a current drive circuit of the invention.

FIG. 10 shows a circuit configuration of a display device using a current drive circuit of the invention.

Figure 30:
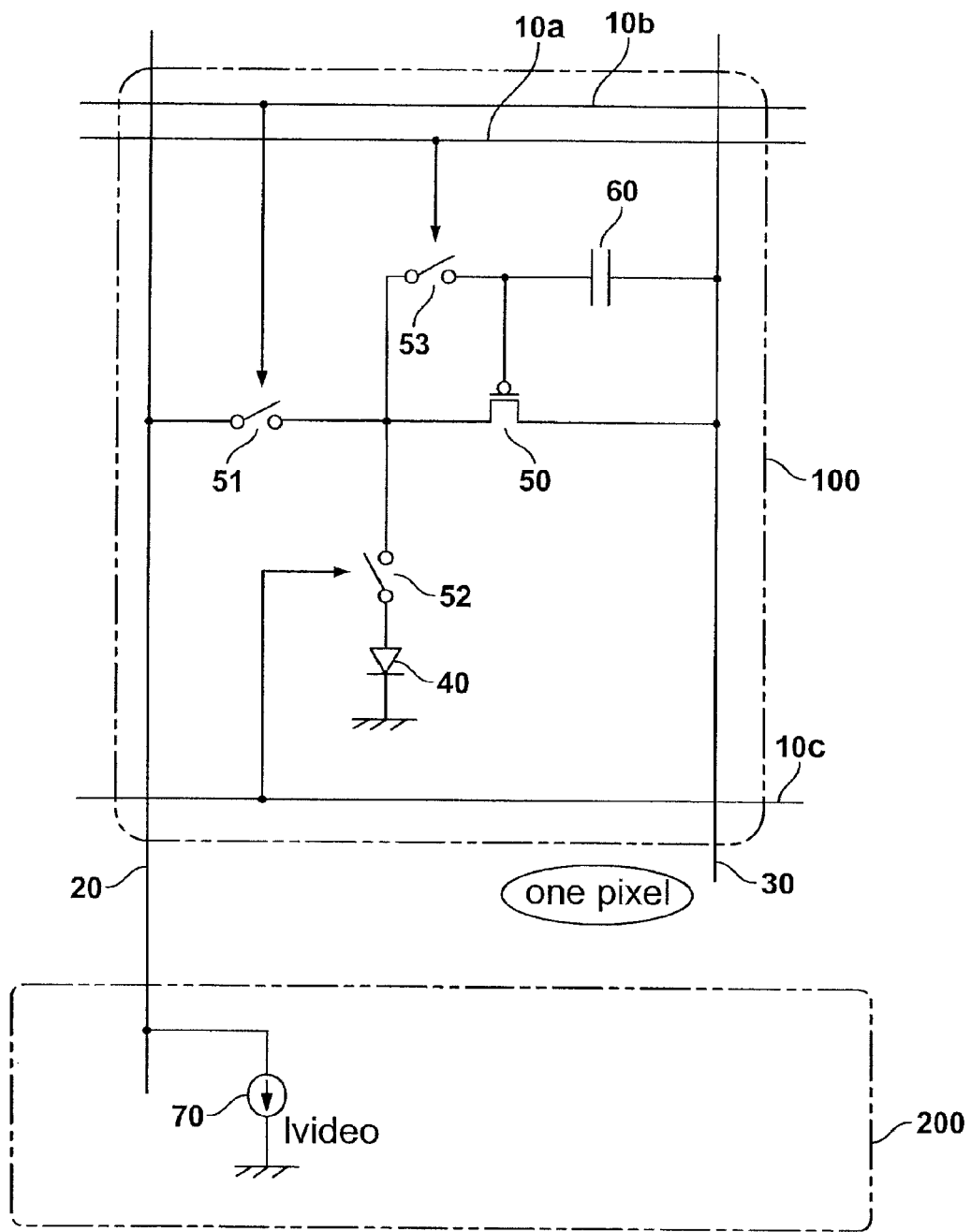
FIG. 30 is a circuit diagram showing an example of a conventional active matrix display device.
Figure 31:
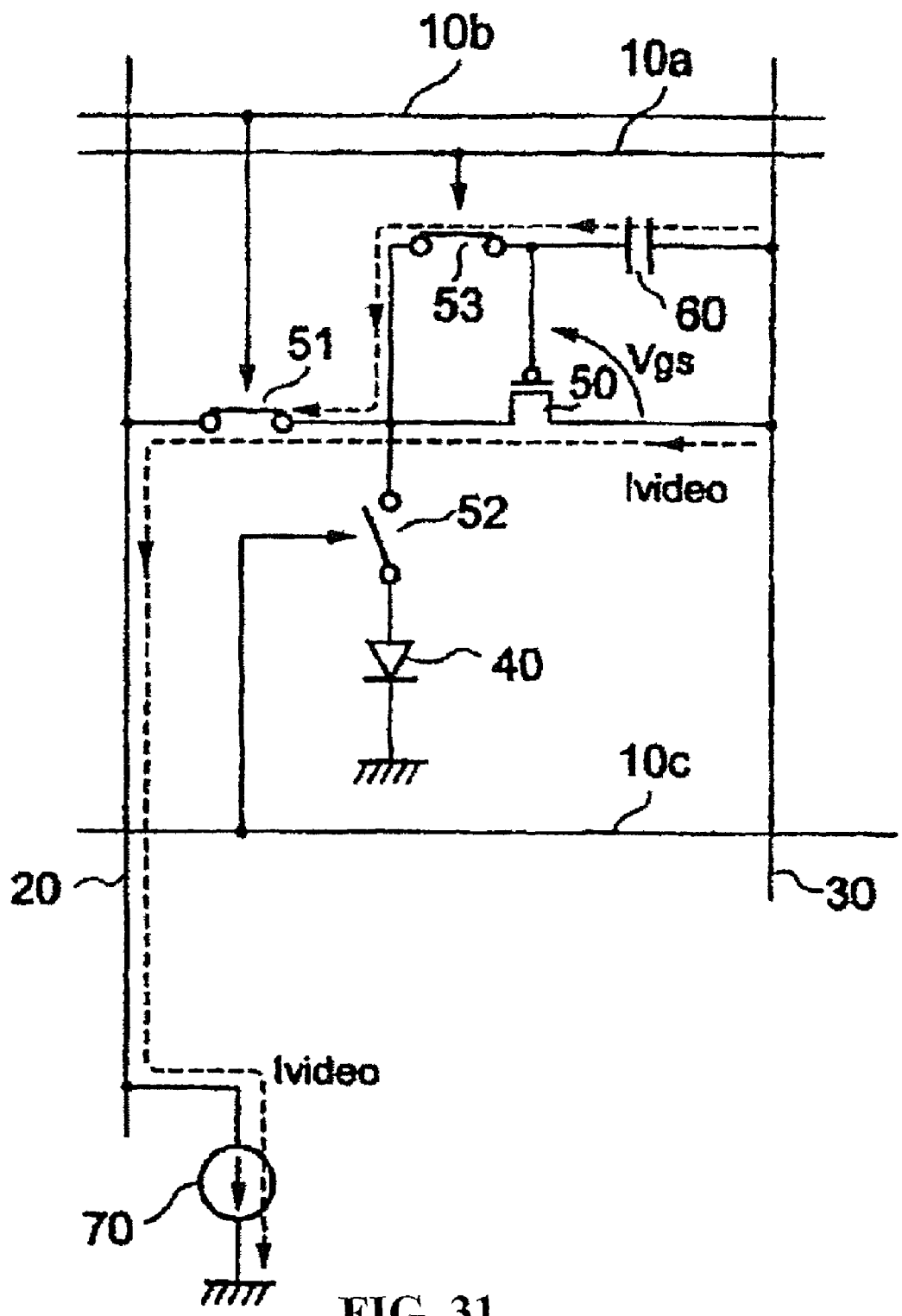
FIG. 31 is a first diagram describing a circuit operation of FIG. 30.
Figure 32:
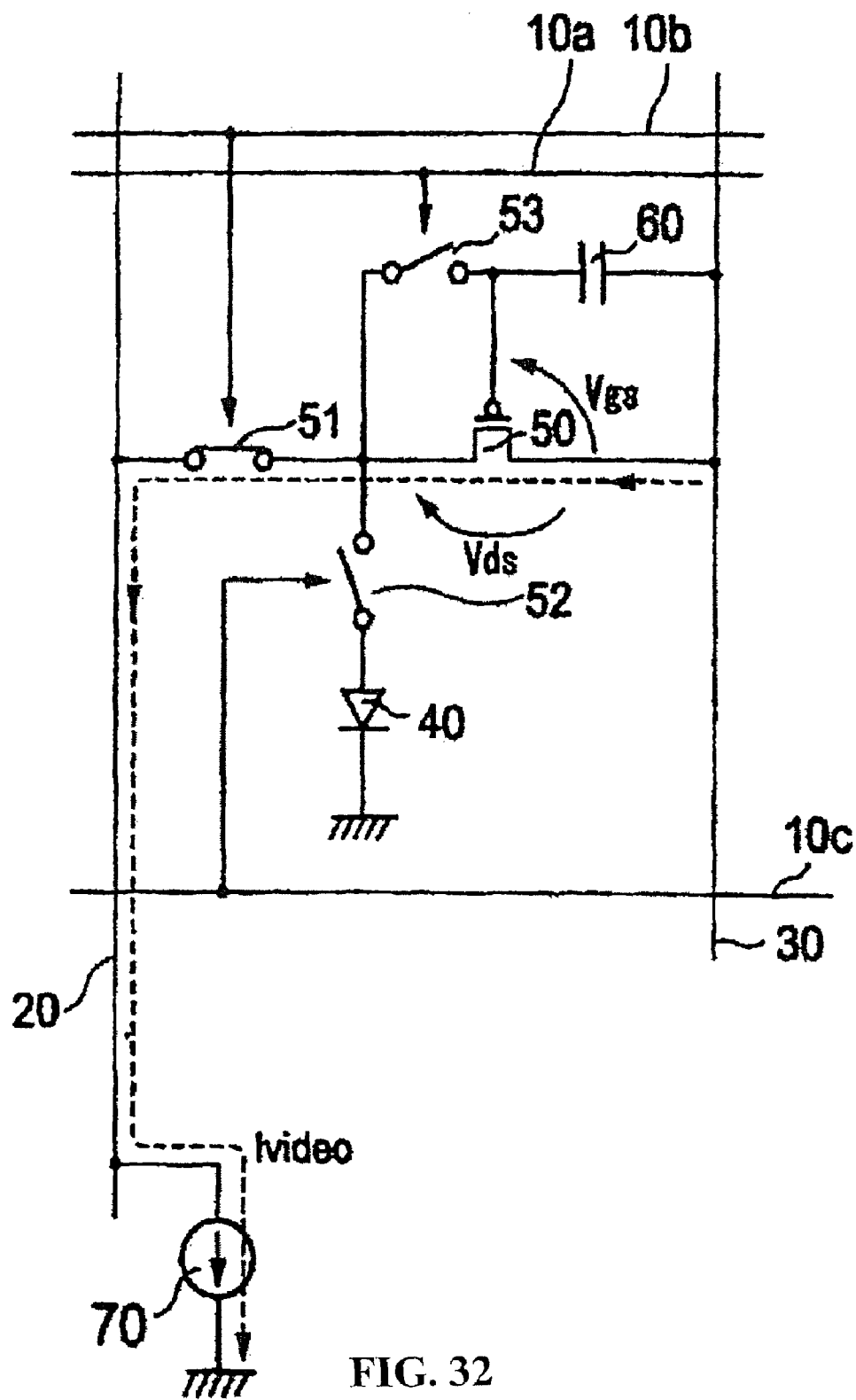
FIG. 32 is a second diagram describing the circuit operation of FIG. 30.
Figure 33:
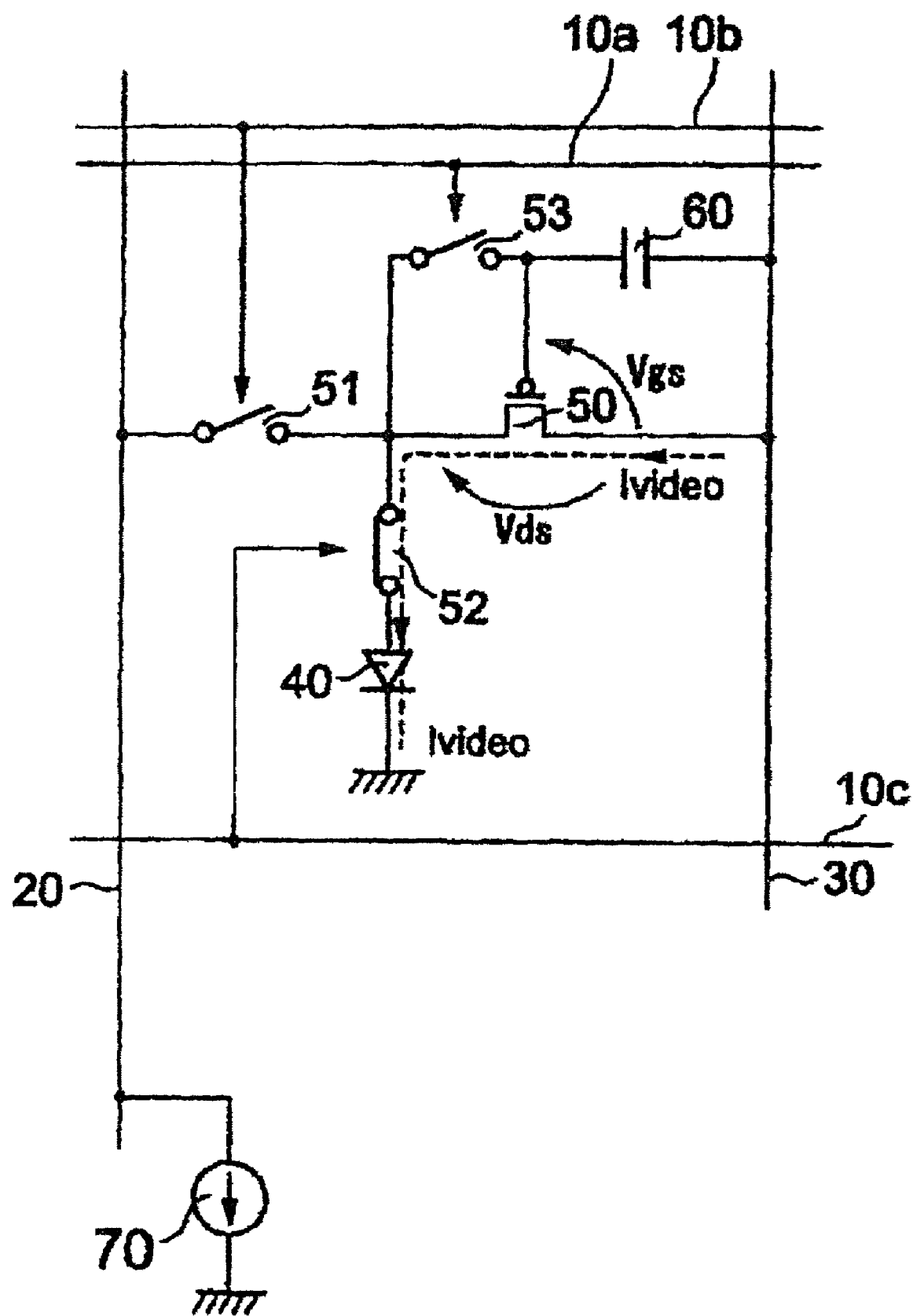
FIG. 33 is a third diagram describing the circuit operation of FIG. 30.

A display device is at least configured with a pixel circuit 100 and a source driver circuit 200. The identical portion in the configuration of the pixel circuit 100 to a conventional circuit configuration in FIG. 30 is denoted by the same reference numerals and the detailed description is omitted here. Note that the description on the display device shown in FIG. 10 is disclosed in the International Publication No. 03-027997, which is an earlier application of the present applicant. Further, display devices having similar configurations as the one shown in FIG. 10 are disclosed in Japanese Patent Application No. 2002-143882, Japanese Patent Application No. 2002-143885, Japanese Patent Application No. 2002-143886, Japanese Patent Application No. 2002-143887, and Japanese Patent Application No. 2002-143888. Therefore, the invention can be combined with these earlier arts.

The pixel circuit 100 operates as follows. First, a selection TFT 51 is turned ON by a control line 10b and a video signal (voltage value) is inputted to a holding capacitor 60 through a video signal line. The pixel circuit 100 has a current source circuit, therefore it can flow a constant current. Then, the current source circuit, a driving TFT 50, and a light emitting element 40 are connected in series. Whether a current flows from the current source circuit to the light emitting element 40 (whether the light emitting element 40 emits light), that is, the gradation is controlled by switching ON and OFF of the driving TFT 50. The switching ON and OFF of the driving TFT 50 is controlled by a video signal inputted from the video signal line to the holding capacitor 60.

In order to reduce the influence of variation in characteristic of the transistors, the current source circuit arranged in the pixel circuit 100 is set by using the current of a source driver. The source driver circuit 200 has a current source which supplies a current to the current source circuit in the pixel circuit 100. That is, the current source circuit in the pixel circuit 100 corresponds to the driven circuit 150, the current source in the source driver circuit 200 corresponds to a signal current source 300, and a current line 35 corresponds to a signal line 400.

Note that the current flows from the signal current source 300 to the driven circuit 150 in FIGS. 1 to 4. However, FIG. 10 shows the case where the current flows from the driven circuit 150 to the signal current source 300.

The driven circuit 150 to which a signal current by the invention is supplied is arranged in the pixel circuit 100 and controlled by the current line 35 and the control line 10c. The driven circuit 150 supplies a signal current from the power supply line 30 and is configurable in a variety of ways.

Embodiment 6

Hereinafter described is an embodiment where the driven circuit 150 is in the pixel circuit 100 with reference to FIGS. 11 to 14.

Figure 11:
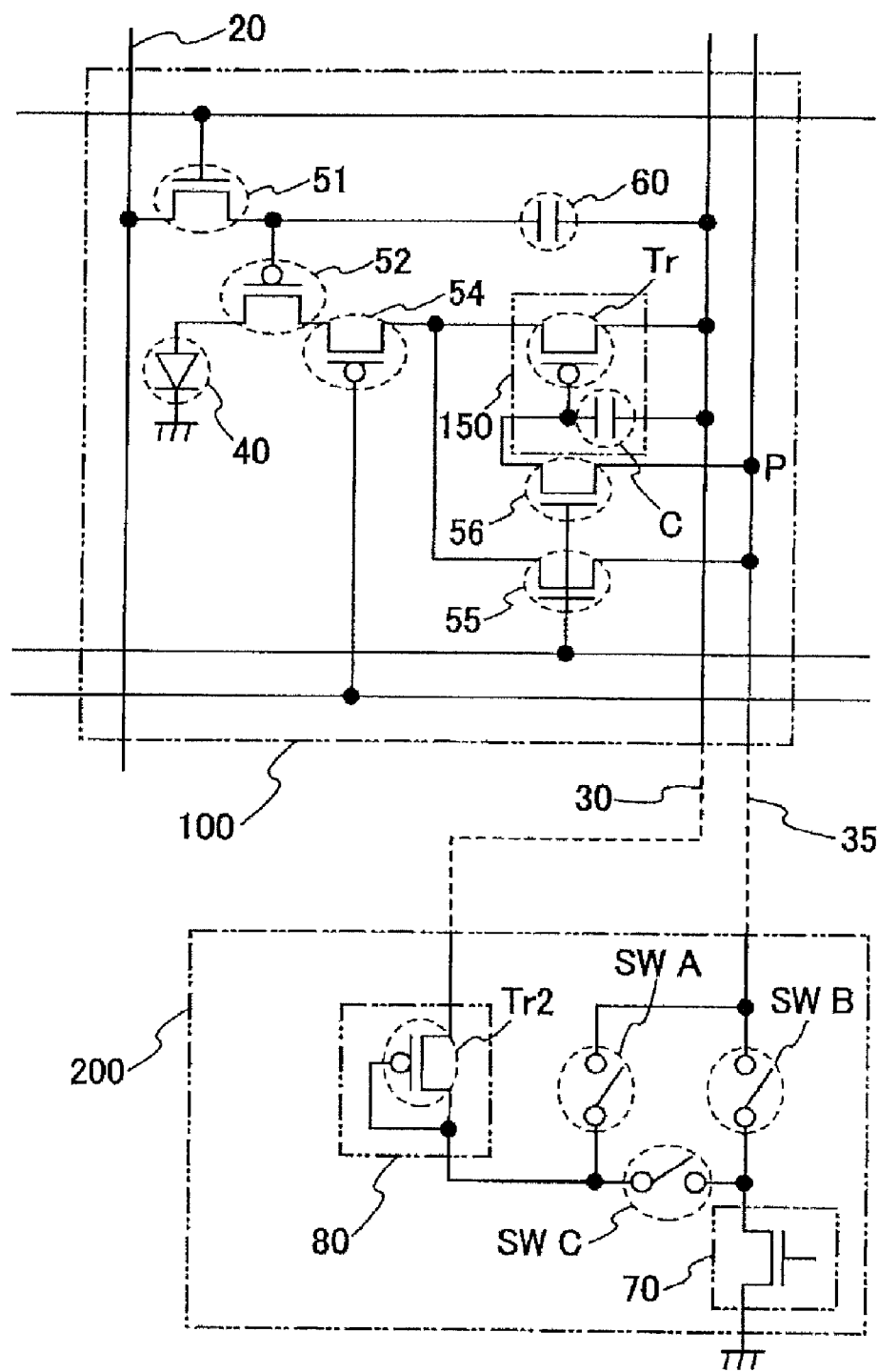
FIG. 11 is a diagram showing an embodiment of a current drive circuit in a display device according to the invention.

In the embodiment shown in FIG. 11, the source driver circuit 200 is configured with a source driver current source 70, a precharge circuit 80 for supplying a precharge voltage to the driven circuit 150, and switches $SW_A$, $SW_B$, and $SW_C$.

The precharge circuit 80 is configured with a p-channel transistor $Tr_2$ which is the same conductivity type as a transistor $Tr_1$ in the driven circuit 150 and has a diode connection in which the gate and drain of the transistor $Tr_2$ are connected. One end of the precharge circuit 80 is connected to the power supply line 30 and another end thereof is connected to the drain of a source driver current source 70 through $SW_C$. Further, the drain of the source driver current source 70 is connected to a current line 35 through the switch $SW_B$. The current line 35 is connected to the connection point of the precharge circuit 80 and the switch $SW_C$ through the switch $SW_A$.

That is, the circuit shown in FIG. 1 is applied to FIG. 11.

An operation of a current drive circuit in such a source driver circuit is described now.

First, the switch $SW_B$ is turned OFF in a precharge operation and the precharge voltage generated in the precharge circuit 80 by turning ON the switches $SW_A$ and $SW_C$ is supplied to the current line 35 for the precharge.

Subsequently, the switches $SW_A$ and $SW_C$ are turned OFF and the switch $SW_B$ is turned ON in a current input operation and a signal current is supplied from the source driver current source 70 to the current line 35. Note that the pixel circuit 100 has the driven circuit 150 to which a signal current is supplied, however, the transistor $Tr_1$ in the driven circuit 150 and the transistor $Tr_2$ configuring the precharge circuit 80 in the source driver circuit 200 are desirably the same in size and conductivity type.

The switches $SW_1$ and $SW_2$ in FIG. 1 correspond to transistors 56 and 55, and they are turned ON when a signal current is supplied from the source driver current source 70 to the pixel circuit 100.

In FIG. 1, the transistor $Tr_1$ in the driven circuit 150 is an n-channel type, however, the transistor in the driven circuit 150 in FIG. 11 is a p-channel type transistor. This is because the directions of the signal current flows are different.

Note that the transistors 55 and 56 in FIG. 11 correspond to the switches $SW_1$ and $SW_2$ in FIG. 1. However, the invention is not exclusively limited to this configuration. A switch used in the invention may be any switch such as an electrical switch or a mechanical switch. It may be anything as far as it has a switching function. That is, it may be anything as far as it can control a current. It may be a transistor, a diode, or a logic circuit configured with them. Therefore, in the case of applying a transistor as a switch, a polarity thereof (conductivity type) is not particularly limited because it operates just as a switch. However, when OFF current is preferred to be small, a transistor of a polarity with small OFF current is favorably used. For example, the transistor which is provided with an LDD region has small OFF current. Further, it is desirable that an n-channel transistor is employed when a potential of a source terminal of the transistor as a switch is closer to the power source potential on the low potential side (Vss, Vgnd, 0V and the like), and a p-channel transistor is desirably employed when the potential of the source terminal is closer to the power source potential on the high potential side (Vdd and the like). This helps the switch operate efficiently as the absolute value of the voltage between the gate and drain of the transistor can be increased. It is also to be noted that a CMOS switch can be also applied by using both n-channel and p-channel transistors.

Figure 12:
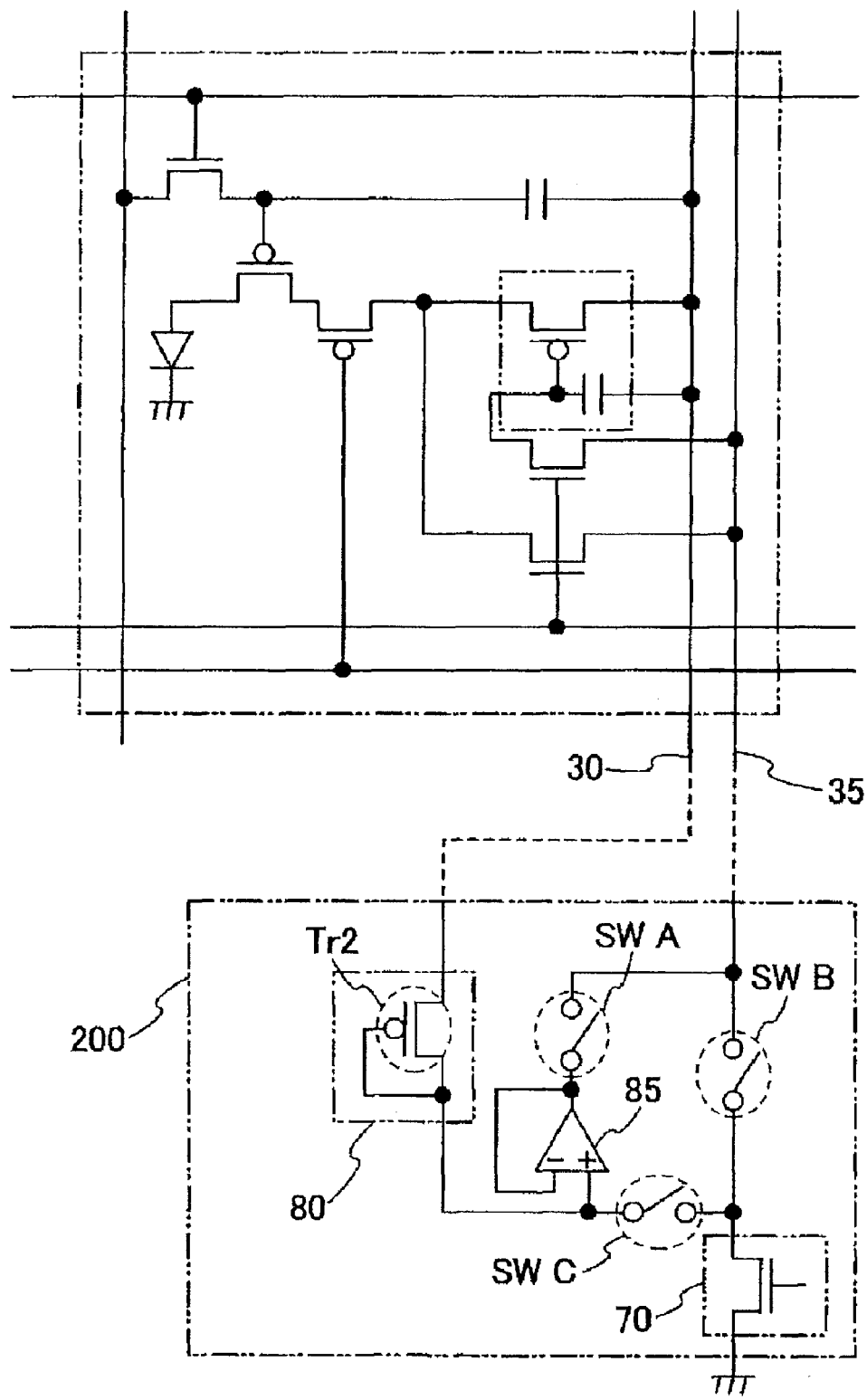
FIG. 12 is a diagram showing another embodiment of the current drive circuit in the display device according to the invention.

FIG. 12 is the one configured so that the precharge voltage is supplied to the current line 35 through an impedance transformation amplifier 85. That is to say, the circuit shown in FIG. 3 is applied in FIG. 12.

Figure 13:
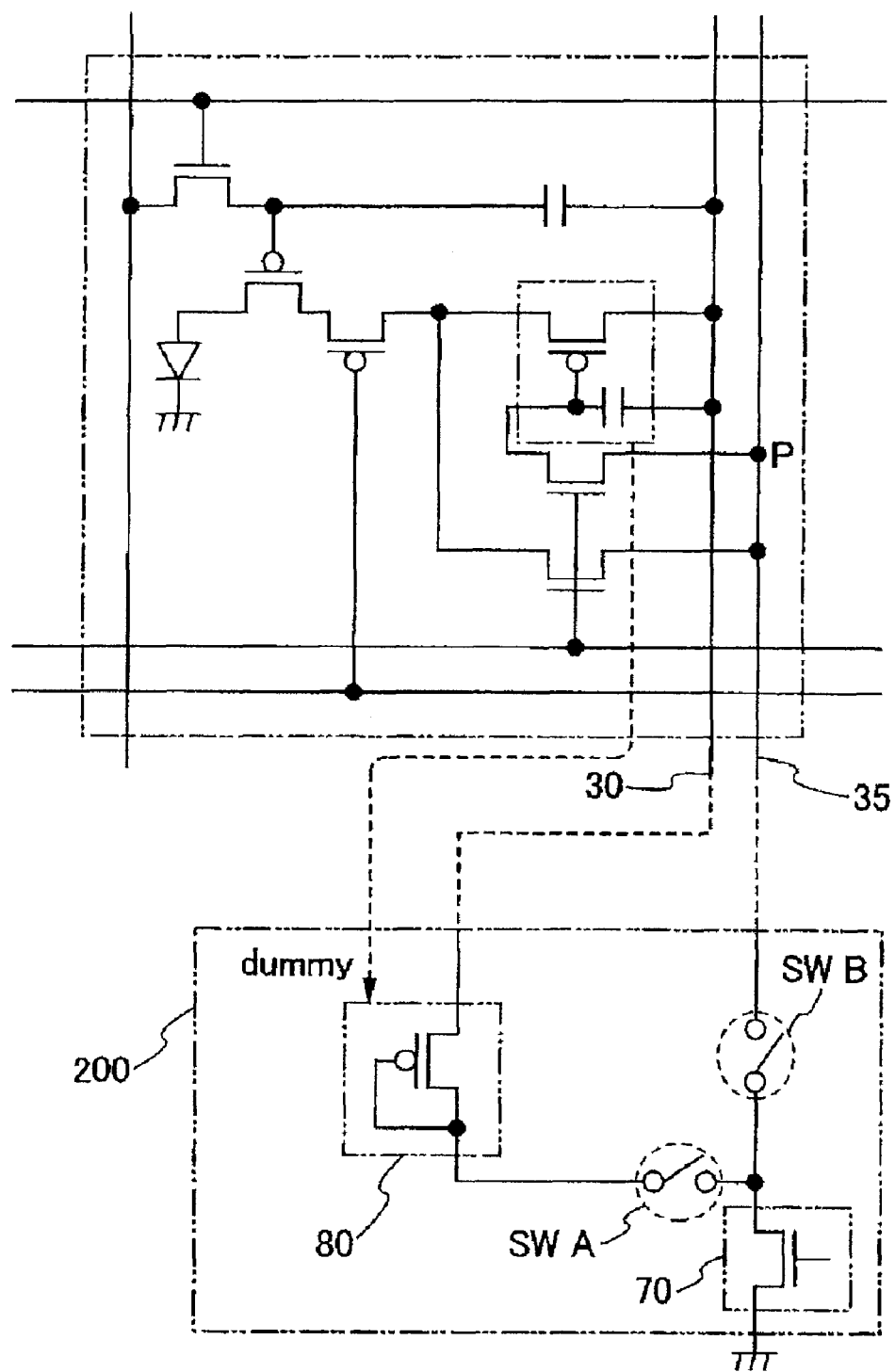
FIG. 13 is a diagram showing another embodiment of the current drive circuit in the display device according to the invention.

Further, an embodiment shown in FIG. 13 is the case where one switch is omitted and the switches $SW_A$ and $SW_B$ only are used for configuration.

In the case of this circuit, the switches $SW_A$ and $SW_B$ are turned ON in the precharge operation and the node P and the current line 35 are precharged by using the precharge circuit 80.

Subsequently, the switch $SW_A$ only is turned OFF and the switch $SW_B$ remains ON in a current input operation, and a signal current is supplied from the source driver current source 70 to the signal line 35. That is, the circuit shown in FIG. 2 is applied in FIG. 13.

Embodiment 7

Figure 14:
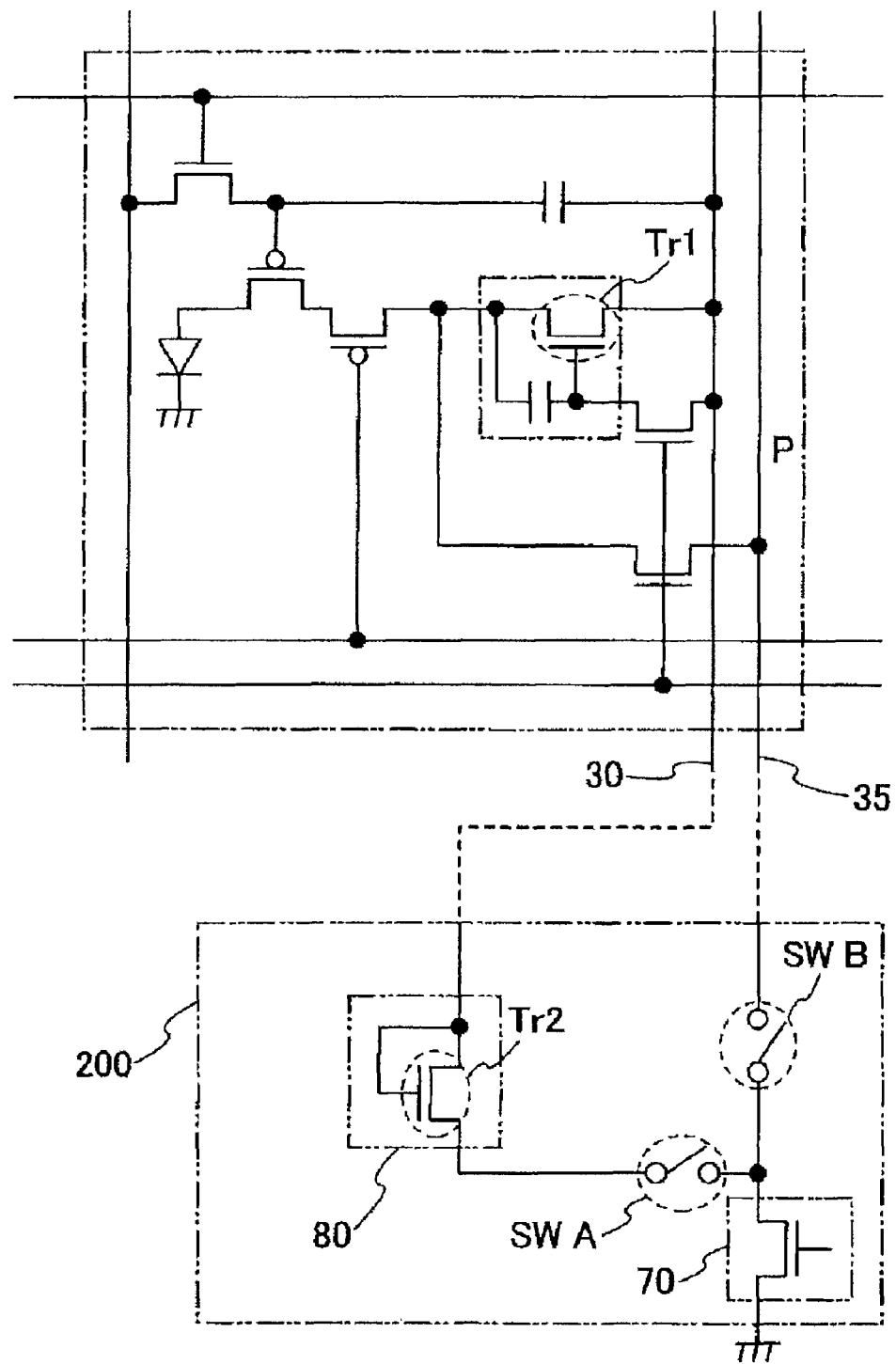
FIG. 14 is a diagram showing another embodiment of the current drive circuit in the display device according to the invention.

An embodiment in FIG. 14 shows a configuration in which the transistor $Tr_1$ configuring the driven circuit 150 in the pixel circuit 100 and the transistor $Tr_2$ configuring the precharge circuit 80 in the source driver circuit 200 are changed to n-channel transistors respectively. That is, the circuit shown in FIG. 7 is applied in FIG. 14.

In this manner, by applying a variety of configurations as shown in FIGS. 10 to 14, a display device using a current drive circuit of the invention can be configured.

Note that the circuits shown in FIGS. 1 to 3 and 7 are applied in FIGS. 10 to 14, however, the invention is not exclusively limited to this configuration. Other configurations can be applied as well. Further, the descriptions so far can be applied to FIGS. 10 to 14 as well.

Figure 15:
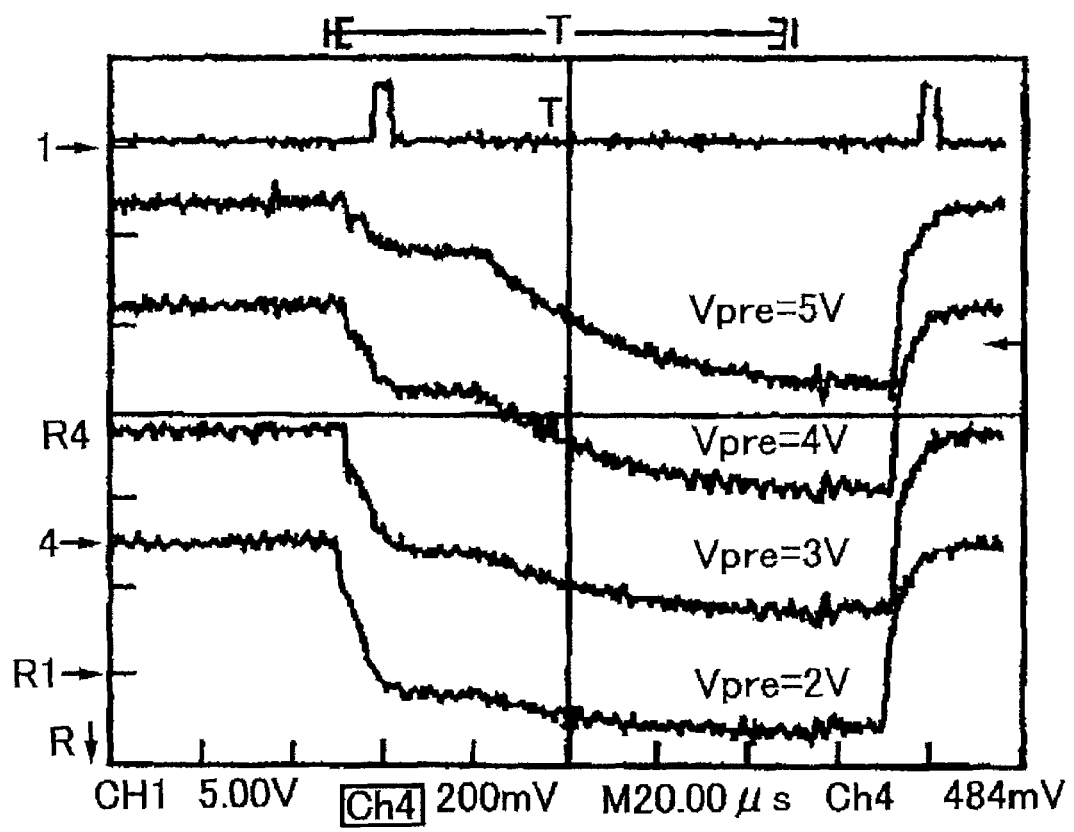
FIG. 15 is a characteristic diagram showing a voltage change of a current line in the case of integrating a current drive circuit of the invention in a source driver circuit.

FIG. 15 shows a voltage change on the current line 35 in the case where the current drive circuit of the invention is integrated in the source driver circuit. It shows a voltage change in the case where each precharge voltage $V_{pre}$ applied from the precharge circuit 80 is changed from 5 V to 2 V, and it is shown that the current line 35 is driven at the highest rate when the precharge voltage $V_{pre}$ is 2 V.

Embodiment 8

Next, an example of the case where the invention is applied to a pixel circuit which is different from the case of FIG. 10 is described.

Figure 18:
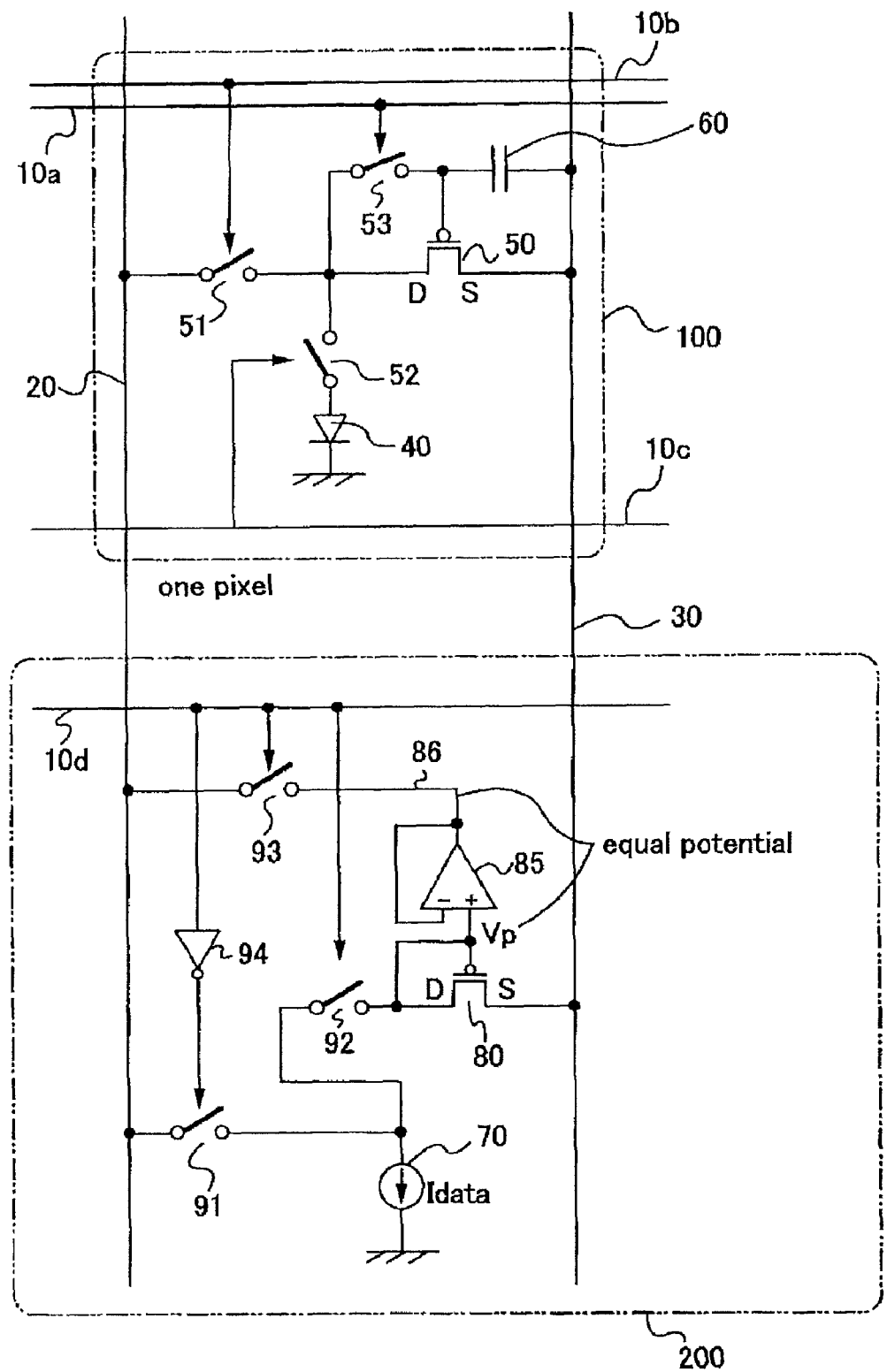
FIG. 18 is a circuit diagram showing an active matrix display device according to an embodiment of the invention.

FIG. 18 is a circuit configuration showing an example of a display device using the current drive circuit of the invention. Note that in the following description, identical portions are denoted by the same reference numerals as of the conventional circuits shown in FIGS. 30 to 33 and will not be explained in details.

In an embodiment shown in FIG. 18, the configuration of the pixel circuit 100 is the same as the circuit configuration shown in FIG. 30.

The configuration of the source driver circuit 200 which corresponds to the pixel circuit 100 is described now.

The source driver circuit 200 is provided with a switch 91 for connecting by switching the image signal input current source 70 between the precharge operation and the signal current input operation, a switch 92 for selectively connecting the image signal input current source 70 to a driving element 80, and a switch 93 for selectively connecting an output terminal 86 of the impedance transformation amplifier 85 to a signal line 20.

The impedance transformation amplifier 85 may be a circuit for amplifying a current supply ability to an output terminal 86 and can be configured by using an operational amplifier and the like.

Embodiment 9

An operational amplifier is used in an embodiment of FIG. 18.

These switches 91, 92 and 93 are driven by a control signal of a control line 10d. The switches 92 and 93 are turned ON and OFF simultaneously while the switch 91 is driven through an inverter 9, therefore the operations of the switches 92 and 93 and the operation of the switch 91 are opposite. It should be noted that these switches 91 to 93 can be configured with transistors having any polarities.

The driving element 80 is configured with a p-channel TFT of which gate and drain are connected and it is configured so that it has a similar connection, the same conductivity type, and the same transistor size as a driving TFT 50 in the pixel circuit 100. Not only the transistor sizes but the characteristics also are desirably the same.

In order to obtain such transistors with the same characteristics, it is desirable to irradiate the same laser shot in the case of crystallizing a semiconductor layer with a laser.

The drain of the driving element 80 is connected to the non-inverting input terminal of the impedance transformation amplifier 85 and configures a voltage follower circuit. Further, the source of the driving element 80 is connected to the power supply line 30.

The amplifier 85 has a high input impedance, outputs a voltage at an output terminal 16 having the same potential as a voltage $V_p$ supplied to the non-inverting input terminal, and also has a high current drive ability, therefore the potential of a signal line 20 which is connected to the impedance transformation amplifier 85 through a switch 93 can be precharged rapidly by flowing a large current.

That is to say, the circuit shown in FIG. 3 is applied to FIG. 18. A driving element 80 in FIG. 18 corresponds to the precharge circuit 500 in FIG. 3. The driving TFT 50 in FIG. 18 corresponds to the driven circuit 150 in FIG. 3.

Next, the operation of the circuit shown in FIG. 18 is described with reference to FIGS. 19 and 20. Note that an inverter 94 and signal lines 10a to 10d are omitted in FIGS. 19 and 20 for simplicity.

Figure 19:
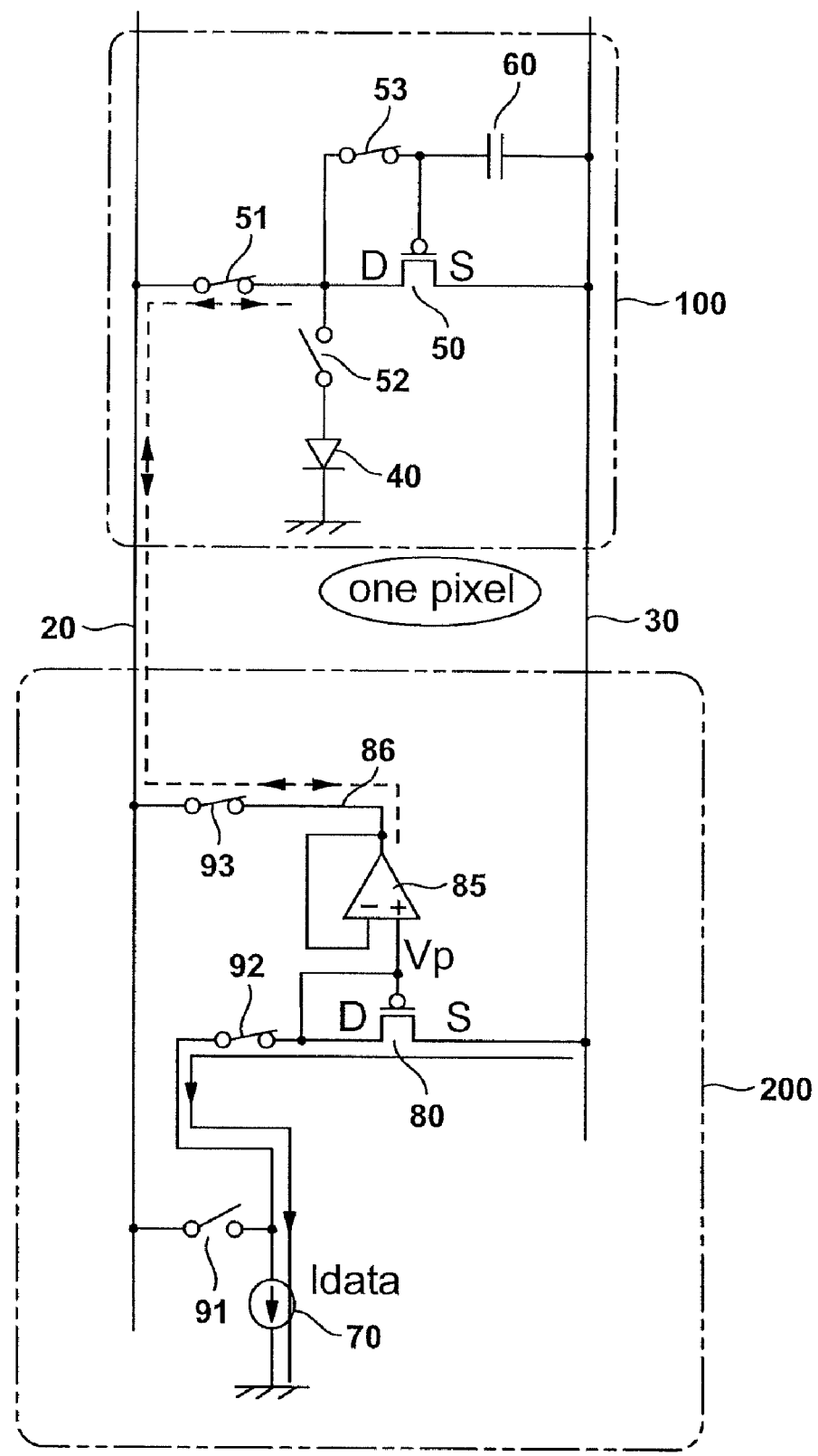
FIG. 19 is a diagram for describing a circuit operation of the circuit in FIG. 18 during the precharge.
Figure 20:
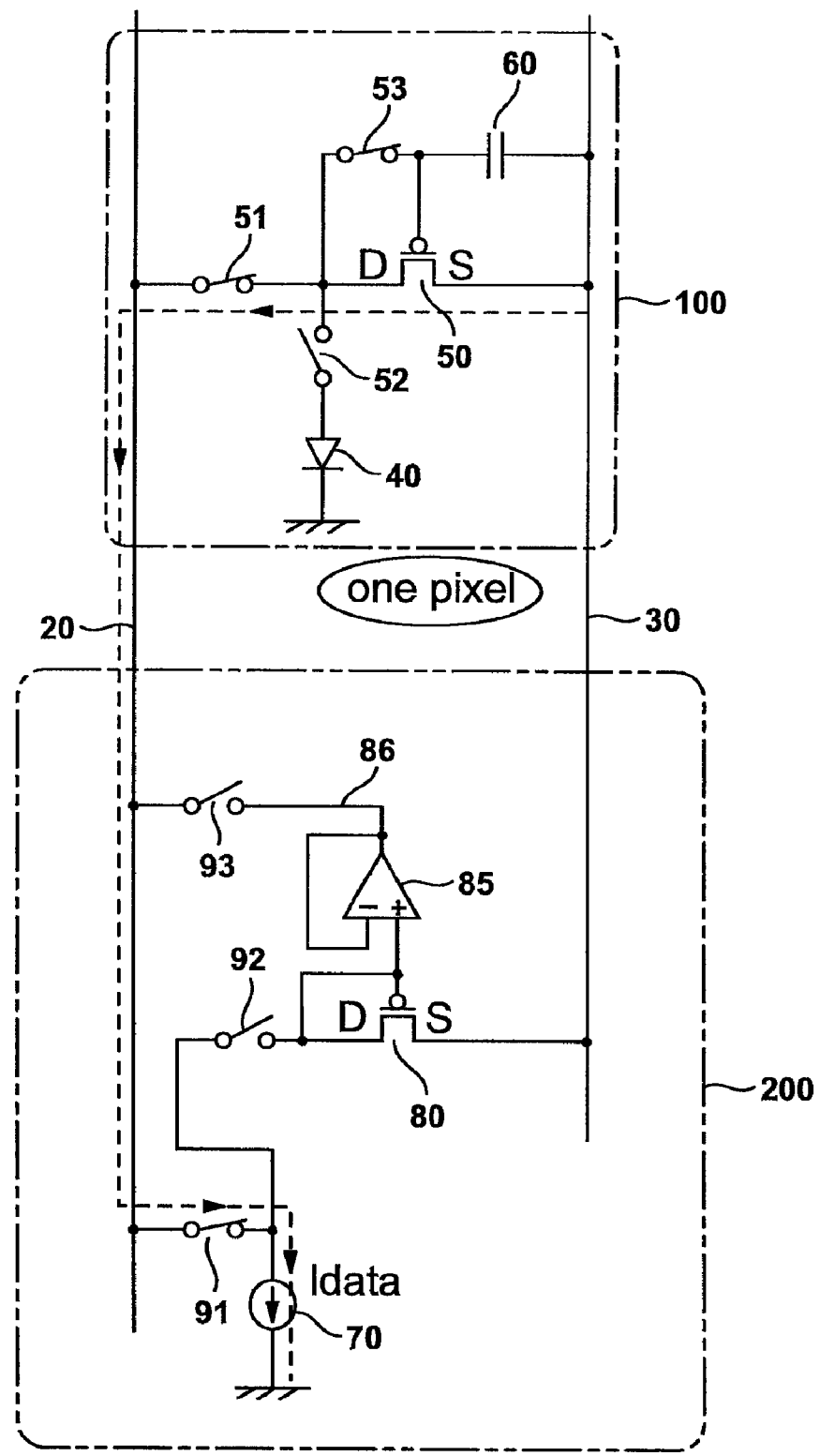
FIG. 20 is a diagram for describing a circuit operation of the circuit in FIG. 18 during a signal current writing.

FIG. 19 shows a signal input operation in a precharge period.

First, in the precharge period, the switches 93 and 92 are turned ON and the switch 91 is turned OFF by a control voltage of the control line 10d.

Thus, a current $I_{data}$ from the image signal input current source 70 does not flow directly to the pixel circuit 100, but flows to the driving element 80. As a result, a drain voltage $V_p$ of the driving element 80 is determined.

By using the amplifier 85, the same voltage as the voltage $V_p$ is outputted to an output terminal 86 and a large driving current flows from the impedance transformation amplifier 85. Thus the signal line 20 and the drain potential of the driving TFT 50 in the pixel circuit 100 reach the precharge voltage $V_p$. At this time, when the driving TFT 50 in the pixel circuit 100 and the driving TFT 80 in the source driver circuit 200 are completely the same in characteristics, a signal input is completed.

However, the characteristics of the driving TFTs 50 and 80 have variations actually. Therefore, it is often the case that the potential in a steady state obtained by inputting a current to the driving TFT 50 and the voltage $V_p$ do not match. It is required to correct the variation by inputting a signal current $I_{data}$ to make the driving TFT in a steady state. Then, the switches 92 and 93 are turned OFF and the switch 91 is turned ON as shown in FIG. 20.

Thus, the output voltage of the amplifier 85 is disconnected and a correct signal based on the signal current $I_{data}$ from the image signal input source 70 is inputted to the pixel circuit 100. At this time, the signal line 20 and the drain of the driving TFT 50 are charged close to the potential required for the precharge period, therefore a signal input is completed in a short time.

That is, the signal line 20 and the drain of the driving TFT 50 reach the steady state. These transitions are the same as the conventional circuit configurations shown in FIGS. 32 and 33, therefore a detailed description is omitted here.

Thus, in the case of this embodiment, although a precharge circuit for precharging a signal line to a predetermined potential prior to supplying a signal current to a signal line is configured by the driving TFT 80 and the amplifier 85, such a precharge circuit is required to be changed according to the circuit configuration of the pixel circuit 100. Note that any circuit configuration of a pixel circuit is applicable basically.

That is to say, it is desirable to make a potential of a driven element in a pixel circuit in a steady state or a state close to it by a precharge circuit and supply it.

Note that the circuit shown in FIG. 3 is applied to FIG. 18, however, the invention is not limited to this configuration. Other configurations than this can be applied as well. Further, it is needless to say that the descriptions made so far can be applied as well.

Therefore, in the case where a current $I_{data}$ has a small value, it is desirable to precharge by using a precharge voltage $V_p$ which is slightly higher than the signal line 20 and the drain potential of the driving TFT 50 in the pixel circuit 100 in steady states. That is to say, it is preferable that an absolute value of the voltage between the gate and source of the driving TFT 50 becomes smaller than an ideal value by precharging by using a precharge voltage which has a slightly higher value than an ideal value. It should be noted that the driving TFT 50 in FIG. 18 is a p-channel transistor. Therefore, precharging by using a precharge voltage which has a slightly higher value than an ideal value is the same as precharging by using an optimum precharge voltage for a small signal current. As a result, a steady state can be obtained rapidly as described above.

Embodiment 10

Figure 21:
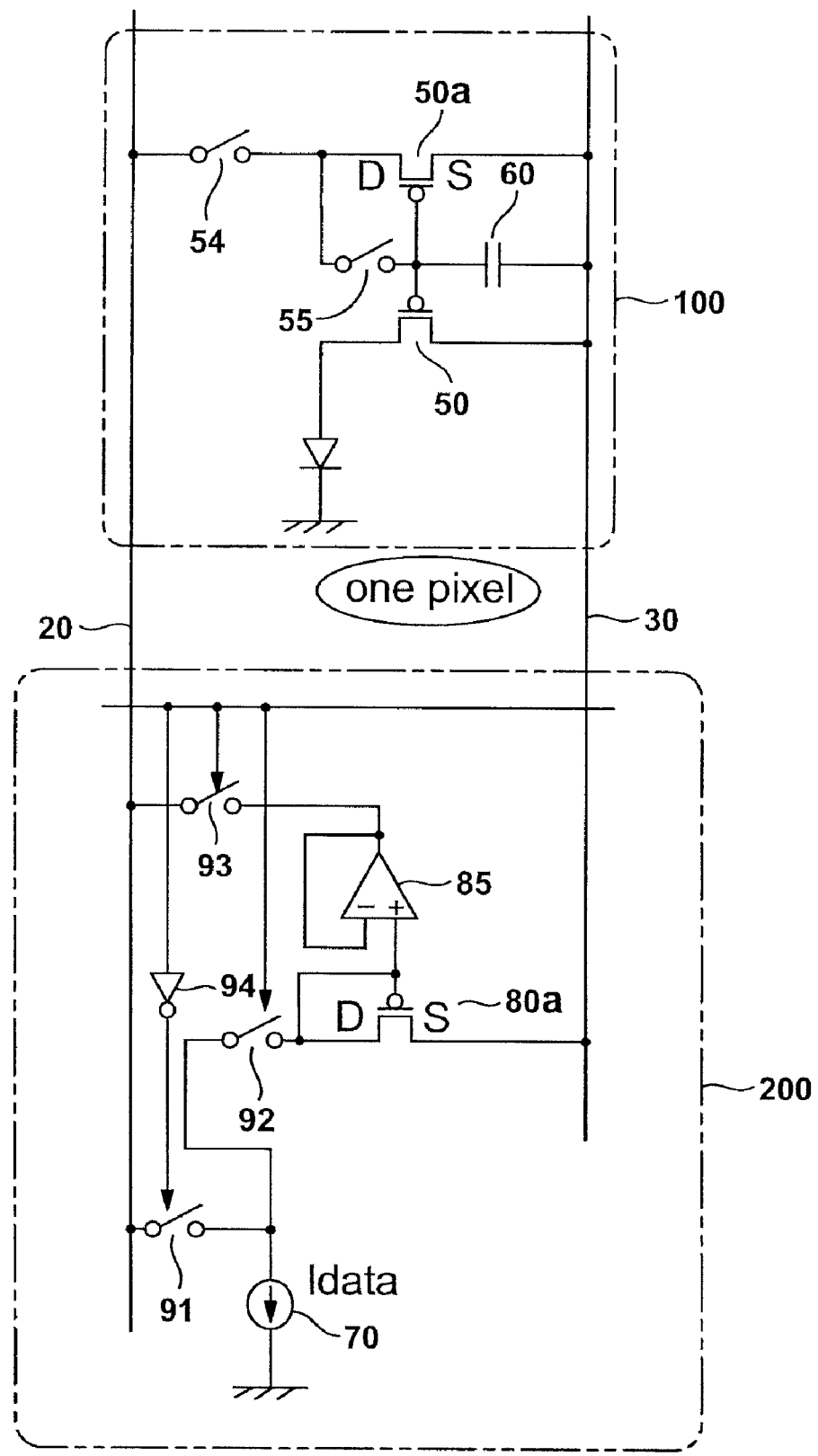
FIG. 21 is a circuit configuration of another embodiment of the invention.

FIG. 21 shows another embodiment of the invention and the pixel circuit 100 is configured by using a mirror TFT 50a in addition to the driving TFT 50 in contrast with the case as shown in FIG. 18. A signal current from the signal line 20 is configured so as to be applied to the mirror TFT 50a through the switches 54 and 55.

In this case, it is desirable that the transistor size of the driving element 80a is the same as the size of the mirror TFT 50a, not as the driving TFT 50. Thus, a potential in a steady state can easily be set.

Embodiment 11

Figure 22:
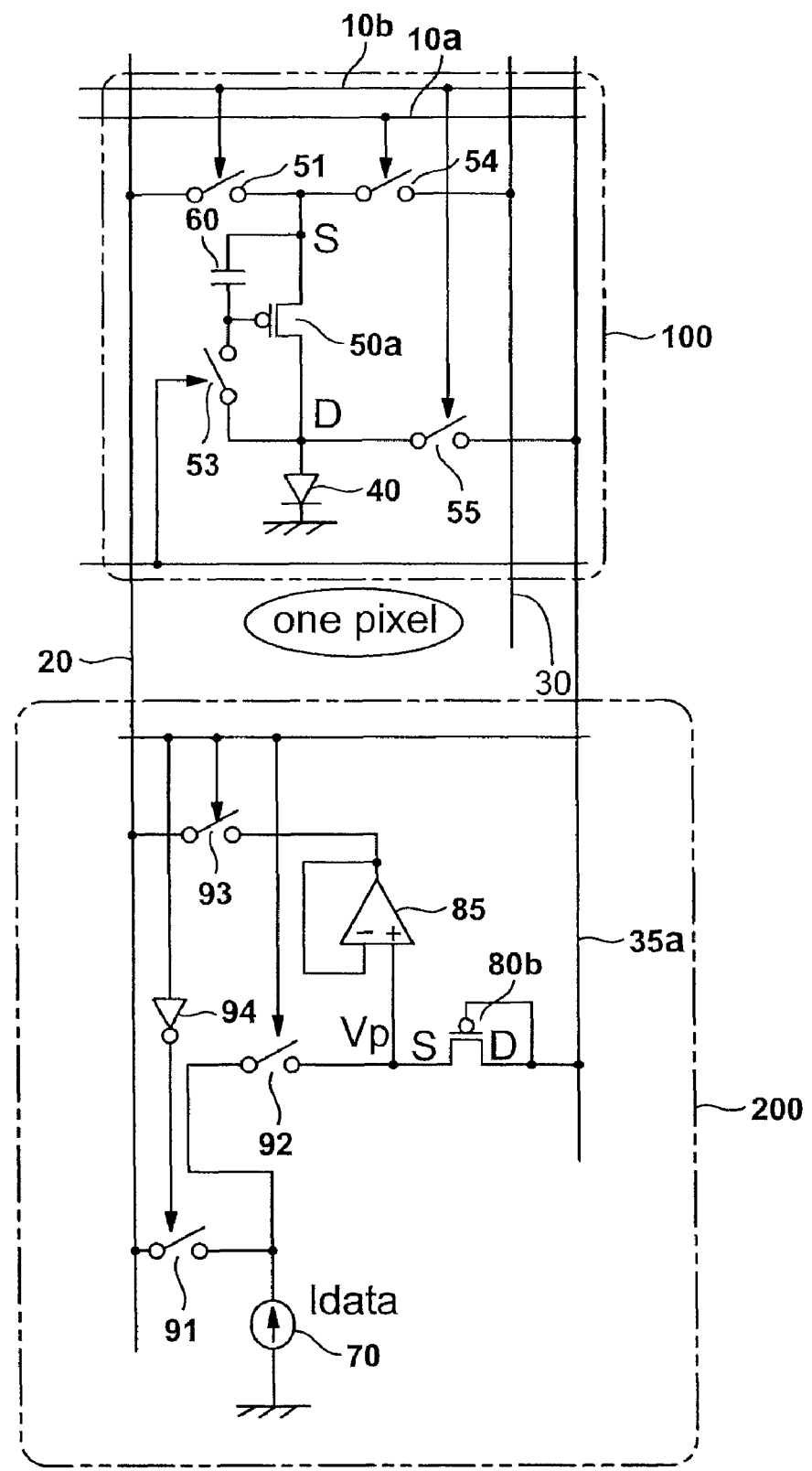
FIG. 22 is a circuit configuration of another embodiment of the invention.

FIG. 22 shows a circuit configuration of another embodiment of the invention, to which the circuit shown in FIG. 8 is applied. A configuration of a driving element 80b configuring the source driver circuit 200 is different from the case of FIG. 18 or 21.

In the case of the embodiment shown in FIG. 22, the gate and drain of the driving element 80b are commonly connected and connected to a reference line 35a for supplying a predetermined voltage and the source of the driving element 80b is connected to the non-inverting input terminal of the amplifier 85.

The pixel circuit 100 is configured so that a reference potential from the reference line 35a is supplied to the drain of the driving TFT 50a through a switch 55, and a driving current from the power supply line 30 is supplied to the source of the driving TFT 50a through the switch 54.

When such a circuit configuration is employed, it is necessary to make the transistor size of the driving element 80b configuring the precharge circuit in the source driver circuit 200 the same as the transistor size of the driving TFT 50a in the pixel circuit 100. In this manner, the configuration of the precharge circuit is required to be changed appropriately in accordance with the configuration of the pixel circuit 100.

However, in the case of FIG. 22, a potential of the drain terminal of the driving TFT 50a (corresponds to the driven circuit 150) may change by a voltage characteristic of a light emitting element 40. Precharge voltage changes when the potential of the drain terminal of the driving TFT 50a changes. Therefore, in FIG. 22, a reference potential from the reference line 35a is supplied to the drain of the driving TFT 55a through the switch 55 so as not to be influenced by the change in the voltage characteristics of the light emitting element 40. Thus, a change in the precharge voltage is prevented.

Note that the driving TFTs 50 and 50a are p-channel transistors in the above-described embodiment, however, in the case of using an n-channel driving TFT also, a driving element in the precharge circuit is required to be changed to the n-channel transistor accordingly.

It should be noted that the circuit shown in FIG. 8 is applied in FIG. 22, however, the invention is not limited to this configuration. Further, it is needless to say that the descriptions made so far can be applied as well.

In this manner, a precharge can be performed to a variety of pixel circuits to which a current is inputted by using a variety of configurations.

Next, the configuration of the amplifier 85 which is used in the precharge circuit of the invention is described.

The amplifier 85 can also be configured by using an operational amplifier as shown in FIGS. 18, 21 and 22, however, the invention is not limited to this in the case of a circuit with a large current supply ability. Further, in the case of a circuit for simply converting an impedance of input and output to output the same potential as the input, any configuration can be employed.

Figure 23:
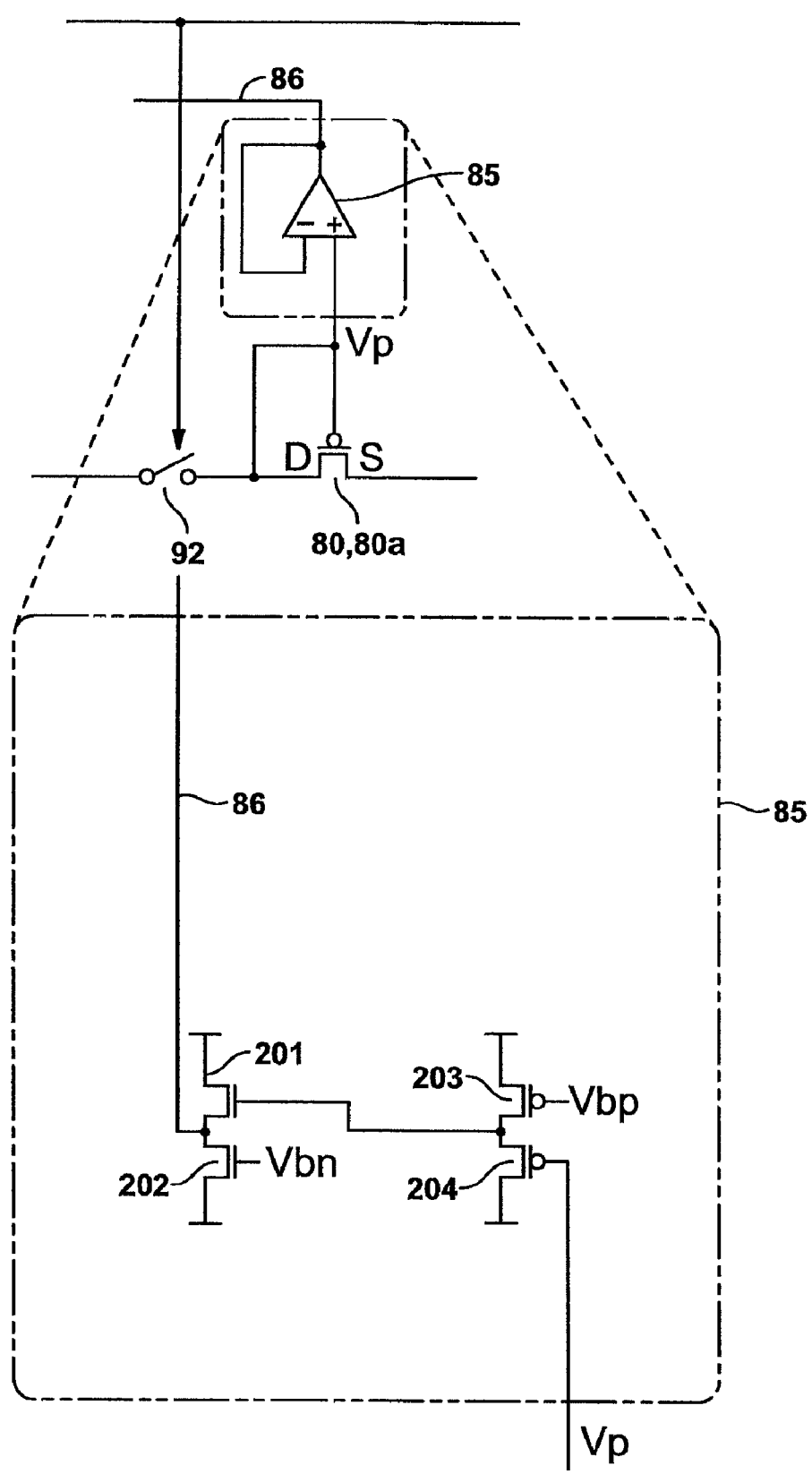
FIG. 23 is a diagram showing an example of a circuit configuration of a source follower circuit used in the invention.

As a simple example, the case using a source follower circuit is shown in FIG. 23.

The source follower circuit is configured with p-channel TFTs 203 and 204, and n-channel TFTs 201 and 204. In the case of using a p-channel transistor in the source follower circuit, the output voltage is lower than the input voltage by a bias voltage.

On the other hand, in the case of using an n-channel transistor, the output voltage is lower than the input voltage by a bias voltage. Therefore, designing a bias voltage and a transistor size by using a source follower circuit using n-channel transistors and a source follower circuit using p-channel transistors together, a circuit which outputs the output voltage having the same potential as the input voltage can be configured. Further, the output voltage may be controlled by using only one source follower circuit and inputting with estimating the change of a bias voltage. A differential amplification circuit may be used alternatively.

Above-described with reference to FIGS. 18 to 22 are the circuit configurations in the cases using an analog gradation system (the case where an analog signal is inputted to the pixel circuit), however, the case using a digital gradation (the case where a digital signal is inputted to the pixel circuit) is also applicable to the invention.

Figure 42:
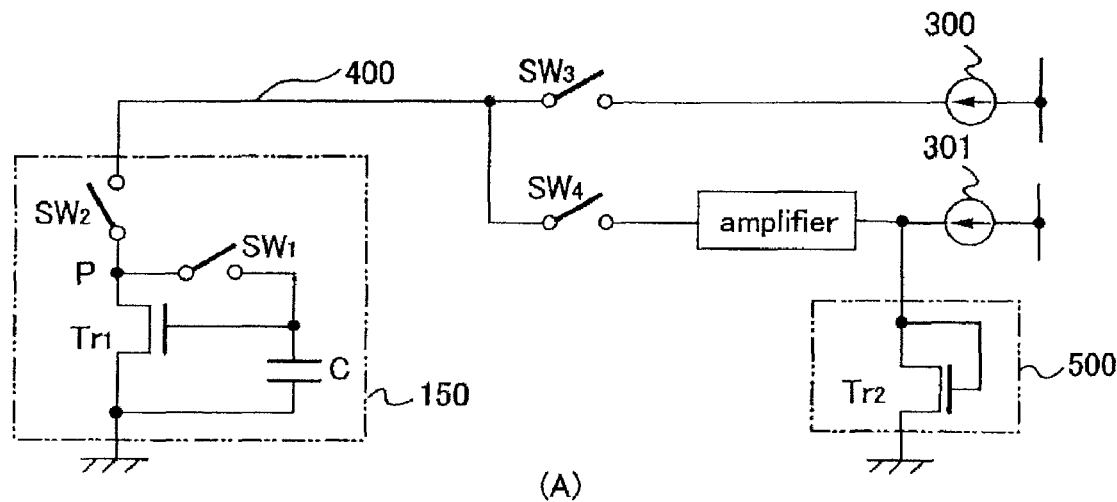
FIG. 42 is a diagram showing a configuration in which different current sources are provided in each of a precharge circuit and a driven circuit.
Figure 42:
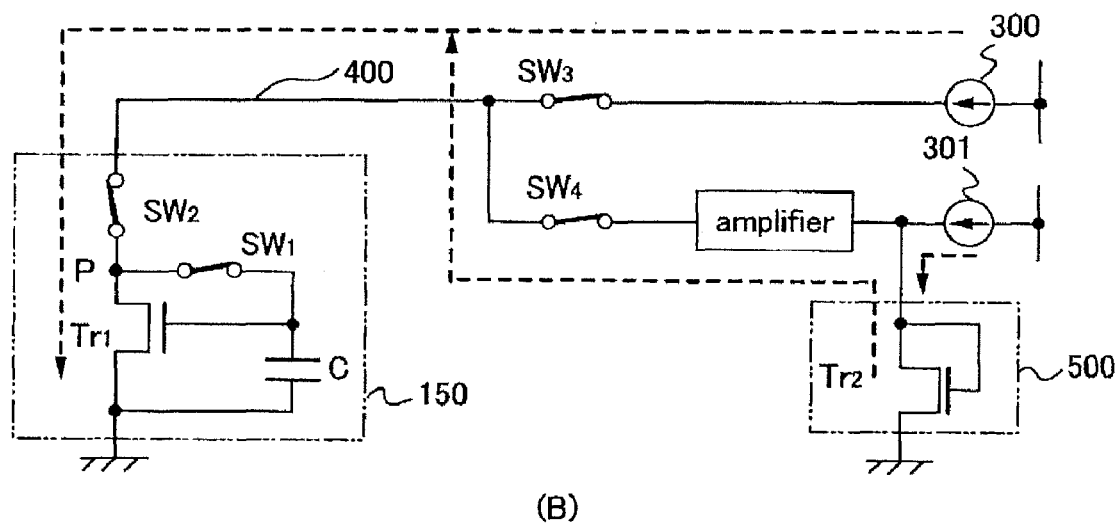

It should be noted that a signal current may be supplied while a precharge voltage is supplied. This is because the supply of signal current has almost no influence on the potential to be determined as long as an appropriate precharge voltage is supplied. However, in such cases as embodiments 4 to 9, 11, and 13, it is required to flow a current to the transistor $Tr_2$, therefore a signal current can not be supplied while a precharge voltage is being supplied to the driven circuit. In this case, one more signal current source may be prepared for supplying a current from one signal current source to the driven circuit while supplying a current from the other signal current source to the transistor $Tr_2$. An example of this configuration is shown in FIG. 42. As shown in FIG. 42, the signal current source 300 supplies a current to the driven circuit 150 while a signal current source 301 supplies a current to the transistor $Tr_2$. Thus, a signal current can be supplied while a precharge voltage is being supplied.

Embodiment 12

Figure 24:
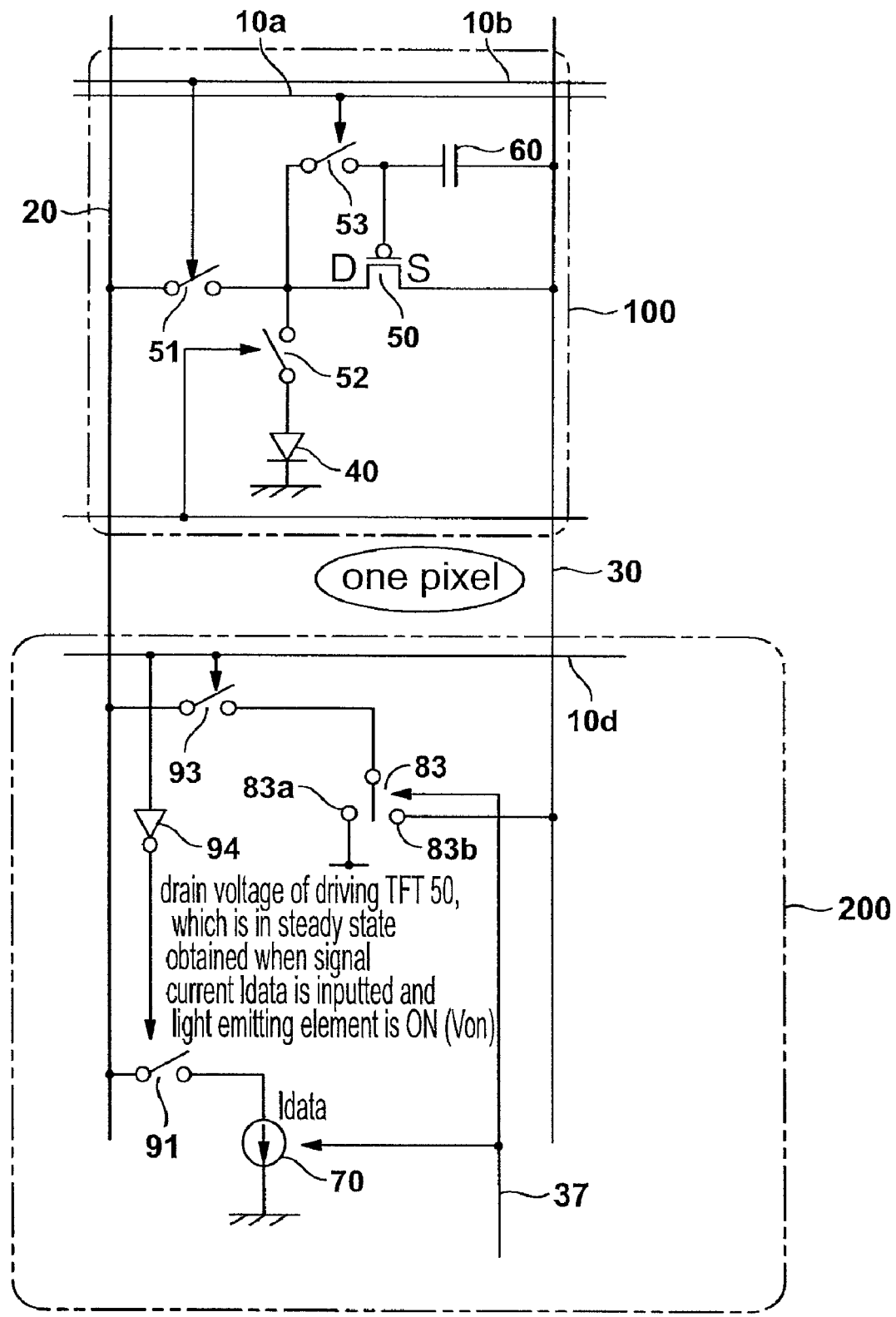
FIG. 24 is a diagram showing an embodiment of a circuit configuration of the invention in the case of digital gradation circuit method.

FIG. 24 shows an embodiment showing a circuit configuration of the invention in the case of digital gradation circuit method. It should be noted that a pixel circuit in FIG. 24 has the same configuration as the one in FIG. 18 as an example, however, the invention is not limited to this.

In the case of the digital gradation also, a precharge voltage may be determined in the same way as the analog gradation. That is, in the case where the light emitting element is ON (emitting state), a voltage ($V_{on}$) which is in a steady state obtained when a signal current $I_{data}$ is inputted and the light emitting element is ON may be determined as a precharge voltage. In the case where the light emitting element is OFF (non-emitting state), a precharge voltage may be set as a voltage which never makes the light emitting element in an emitting state. Such voltage as the voltage between the gate and source of a transistor as a current source becomes zero may be typically set.

As shown in FIG. 24, a switch circuit 83 is connected to a terminal 83a or a terminal 83b prior to supplying a data signal current $I_{data}$ to the signal line 20. A video signal decides which terminal to connect. Thus, a precharge operation is performed. At this time, the switch 93 is ON and the switch 91 is OFF.

The switch 83 is connected to the terminal 83a when the video signal is ON (emission) and connected to the terminal 83b when the video signal is OFF (non-emission). After that, the switch 93 is turned OFF and the switch 91 is turned ON, then the data signal current $I_{data}$ is inputted to the pixel circuit 100.

In this manner, in the case of the digital gradation also, a predetermined precharge voltage $V_{on}$ is applied in advance to the drain of the driving TFT 50 through the signal line 20, therefore the signal writing rate is increased.

It should be noted that the configuration shown in FIG. 17 is applied to FIG. 24, however, the invention is not limited to this. For example, a voltage may be generated as shown in FIG. 3. Other configurations can be applied as well. Further, it is needless to say that the descriptions made so far can be applied as well.

Figure 25:
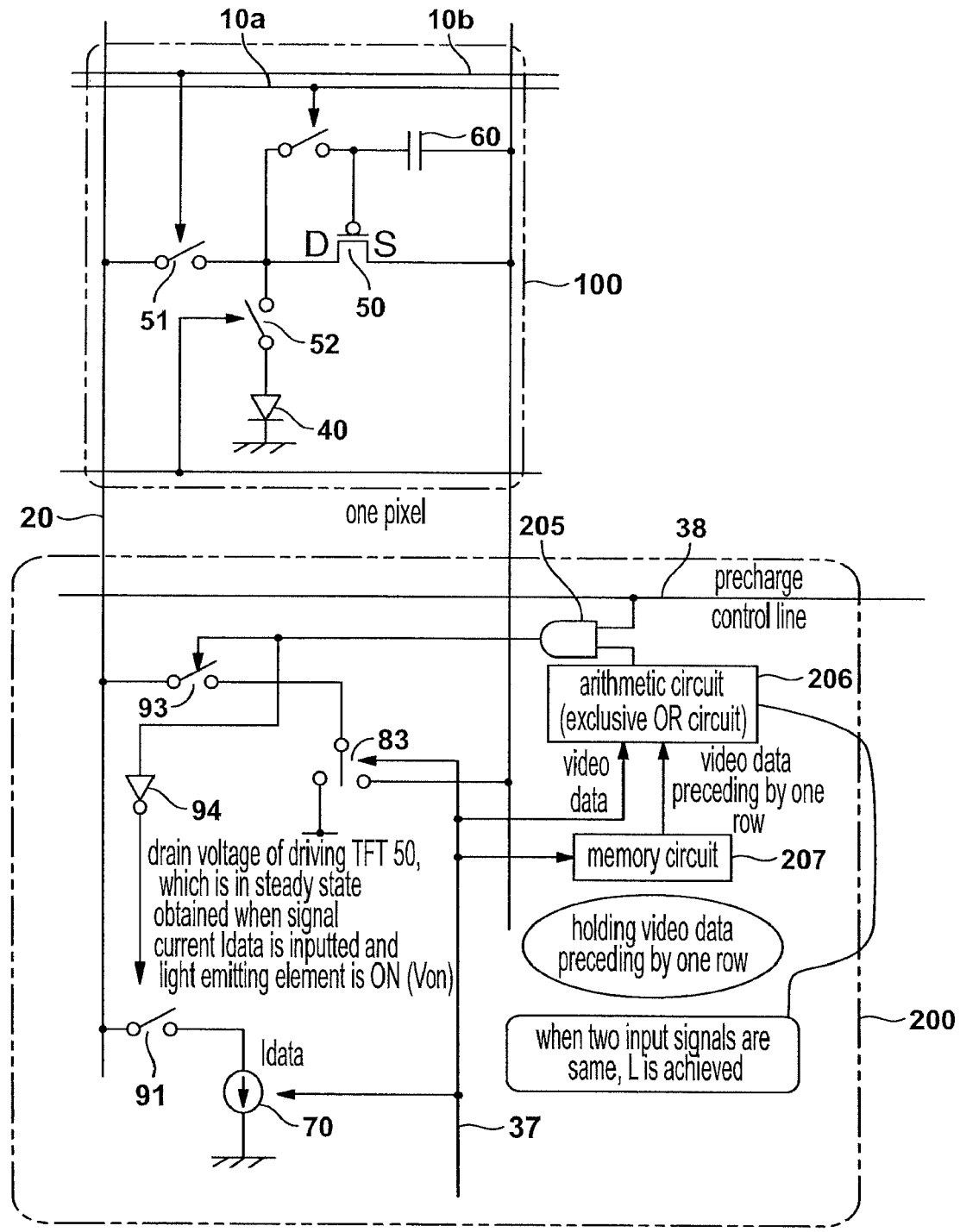
FIG. 25 is a diagram with an improved precharge circuit in the circuit configuration of the digital gradation system shown in FIG. 24.

FIG. 25 shows an improved precharge circuit having a circuit configuration of the digital gradation system shown in FIG. 24.

The precharge circuit shown in FIG. 25 is configured with a memory circuit 207 for holding a video data preceding the signal of a video signal line 37 by one row, an arithmetic circuit 206 configured with an exclusive OR circuit for inputting the present video data and the video data preceding the signal of the video signal line 37 by one row from the memory circuit 207, and an AND circuit 205 for logically multiplying a signal of a precharge control line 38 and a signal from the arithmetic circuit 206 or the like. The signal line 20 is precharged by turning ON the switch 93 with a signal from the precharge control line 38 only when a video data is different from the preceding row.

In FIG. 24, precharge is performed every time. However, it is sometimes the case that the potential of an actual steady state and the precharge voltage $V_{on}$ are not the same or the values are apart from each other due to a variation. Therefore, as it is considered that the potential in a steady state on the preceding row is closer to the potential in a steady state in a presently selected row than the precharge voltage $V_{on}$, precharge is performed only when the video data is different from the one in the preceding row. Further, it is possible not to perform a precharge in the case bright signals (emitting state) are continuously generated.

Furthermore, a logic circuit 206 outputs an output signal having the same level in the case where the present video data and the preceding video data by one row are the same, thus turning OFF the switch 93.

Figure 26:
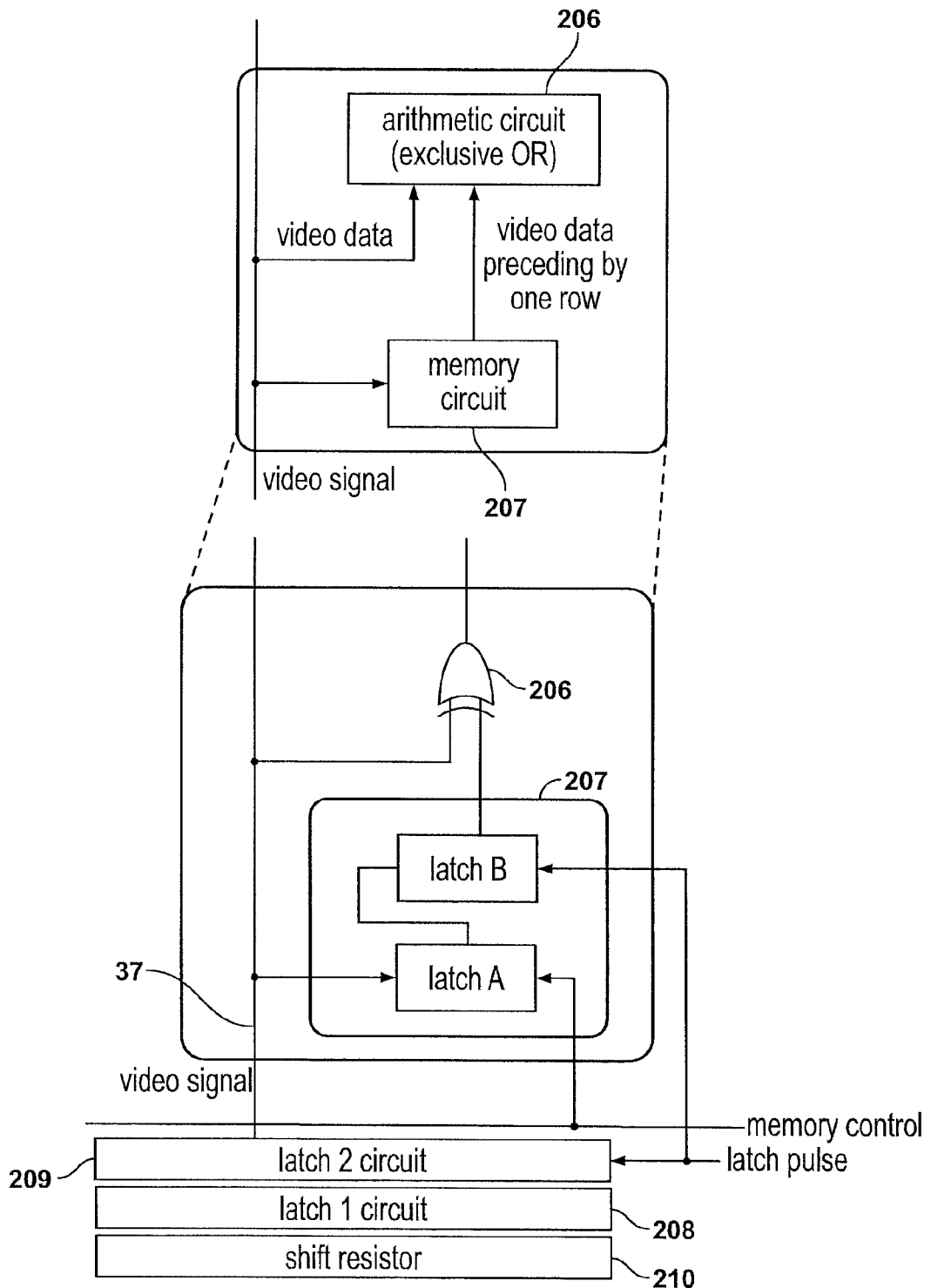
FIG. 26 is a diagram showing a specific configuration of an arithmetic circuit and a memory circuit shown in FIG. 25.

FIG. 26 shows specific configurations of an arithmetic circuit 206 and a memory circuit 207 shown in FIG. 25. The memory circuit 207 is configured with latches A and B and each of the latches A and B are driven by a latch 1 circuit 208 and a latch 2 circuit 209 and a shift register 210.

Figure 27:
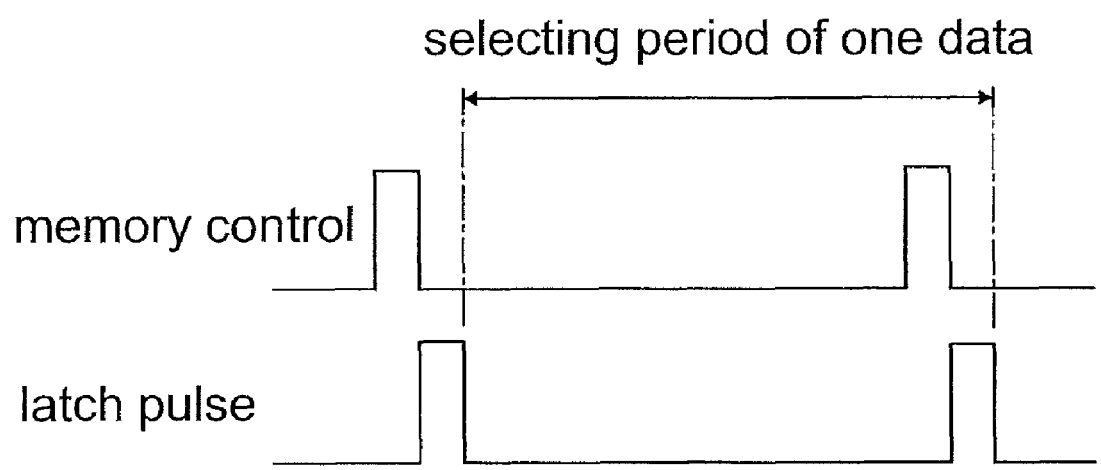
FIG. 27 is a diagram showing a memory control signal for controlling a memory circuit shown in FIG. 26 and a control signal of a latch pulse for controlling the memory circuit.

FIG. 27 is a diagram showing a memory control signal for controlling a memory circuit 207 shown in FIG. 26 and a control signal of a latch pulse for controlling the memory circuit 207. In this manner, the preceding video data is controlled.

Figure 28:
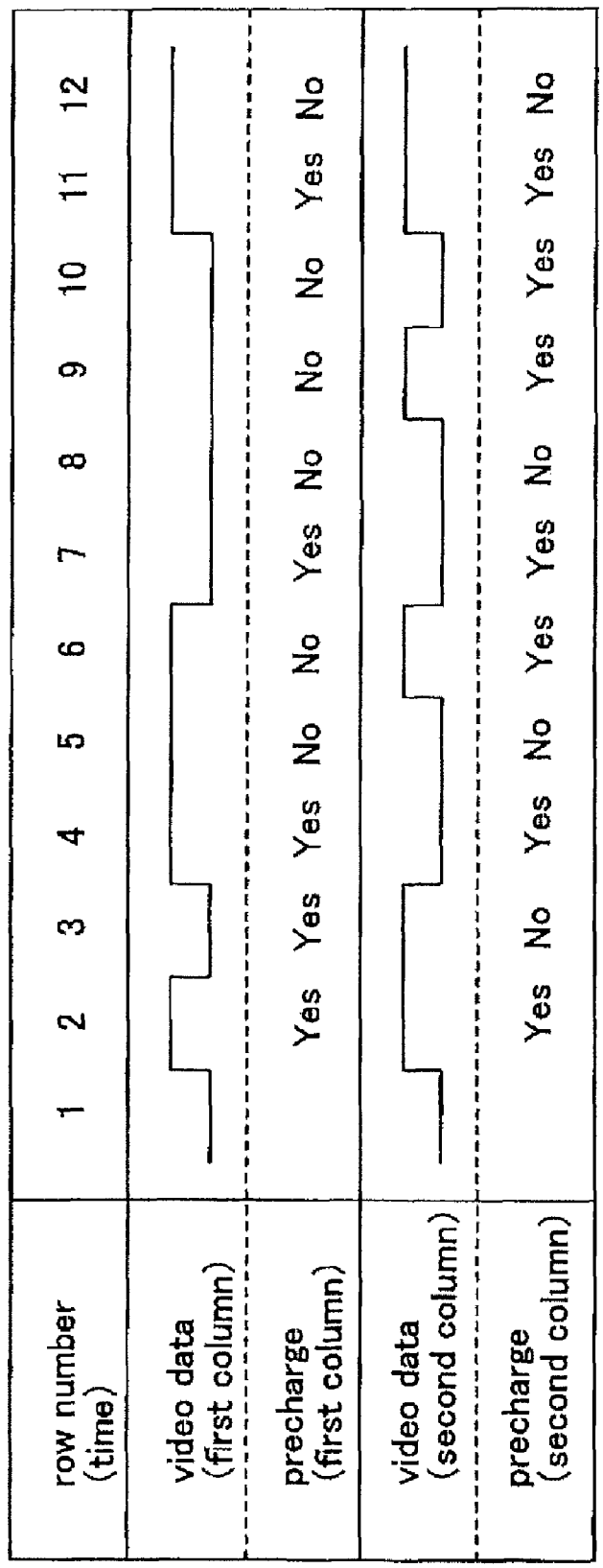
FIG. 28 is a diagram for describing a control operation of a precharge control line shown in FIG. 25.

FIG. 28 is a diagram describing a control operation of the precharge control line 38 shown in FIG. 25, showing that the signal line 20 is precharged only when a video data in a first row and a video data in a second row are different.

Note that FIG. 25 shows that the precharge is not performed in the case of the digital gradation system when the same video signal as the preceding row is inputted, however, the invention is not limited to this. That is, the precharge can be performed in the case of the analog gradation system also. For example, the precharge may be performed when the video signal of a preceding row and the video signal of the presently selected row are apart from each other, and the precharge may not be performed when they are close to each other.

For example, the magnitude of the voltage for precharging when a signal current is in a certain range (region) is controlled in the case of FIGS. 17 and 4. Therefore, when the video signal inputted last, that is the video signal inputted in a pixel in a preceding row, and the video signal to be inputted are in the same region, the precharge may not be performed and the precharge may be performed only when they are in different regions.

Note that a current source which is the driven circuit 150 is disposed in the pixel circuit in FIGS. 10 to 14 and 18 to 25 and the like. Therefore, the precharge circuit was in a circuit for supplying a current to the pixel circuit, that is, a signal driver circuit. However, a current source is provided in the signal driver circuit as well. Therefore, the invention may be applied with the current source in the signal driver circuit as the driven circuit 150.

Figure 29:
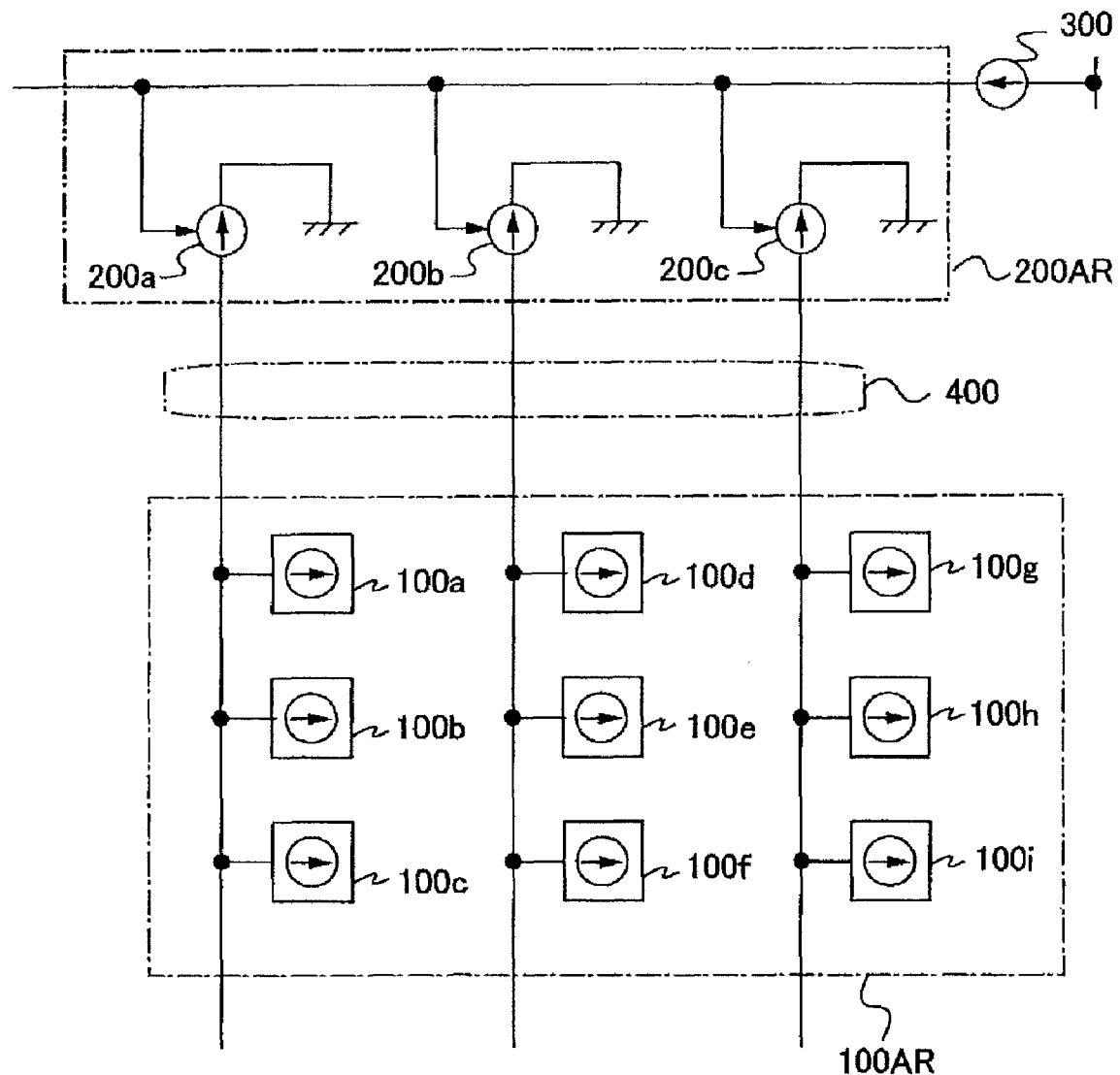
FIG. 29 is a diagram showing a basic configuration of an active matrix display device.

When the driven circuit 150 is disposed in the signal driver circuit, a current source for supplying current to the signal driver circuit is provided. A precharge circuit may be disposed there. An entire configuration in this case is shown in FIG. 29. The circuit shown in FIG. 29 is configured with a pixel circuit 100AR configured with pixels arranged in matrix, a signal driver circuit 200AR for supplying a current to the pixel circuit 100AR, and a reference current source 300 for supplying a current to the signal driver circuit 200AR.

FIGS. 10 to 14 and 18 to 25 describe the case of supplying a current from the signal driver circuit 200a and the like to the pixel circuit 100a and the like, that is, the case where the driven circuit 150 is in the pixel circuit 100a and the like.

Similarly, in the case of supplying a current from the reference current source 300 to the signal driver circuit 200a and the like, that is, the case where the driven circuit 150 is in the signal driver circuit 200AR, the invention can be applied. Note that the operation and the circuit configuration is the same as FIGS. 1 to 9, 16 and 17, therefore a detailed description is omitted here.

A transistor used for the invention is not exclusive limited and may be a thin film transistor (TFT) using a non-single crystalline semiconductor film represented by an amorphous silicon or a polycrystalline silicon, a MOS transistor formed by using a semiconductor substrate or an SOI substrate, a junction type transistor, a bipolar transistor, a transistor using an organic semiconductor or a carbon nanotube, or the like. Furthermore, a substrate on which a transistor is mounted is not exclusively limited to a certain type. It may be a single crystalline semiconductor substrate, an SOI substrate, a glass substrate, or the like.

Embodiment 13

Next, a display device and a configuration of the signal driver circuit and the operation thereof are described. A circuit of the invention can be applied to a part or a pixel of the signal driver circuit.

Figure 35:
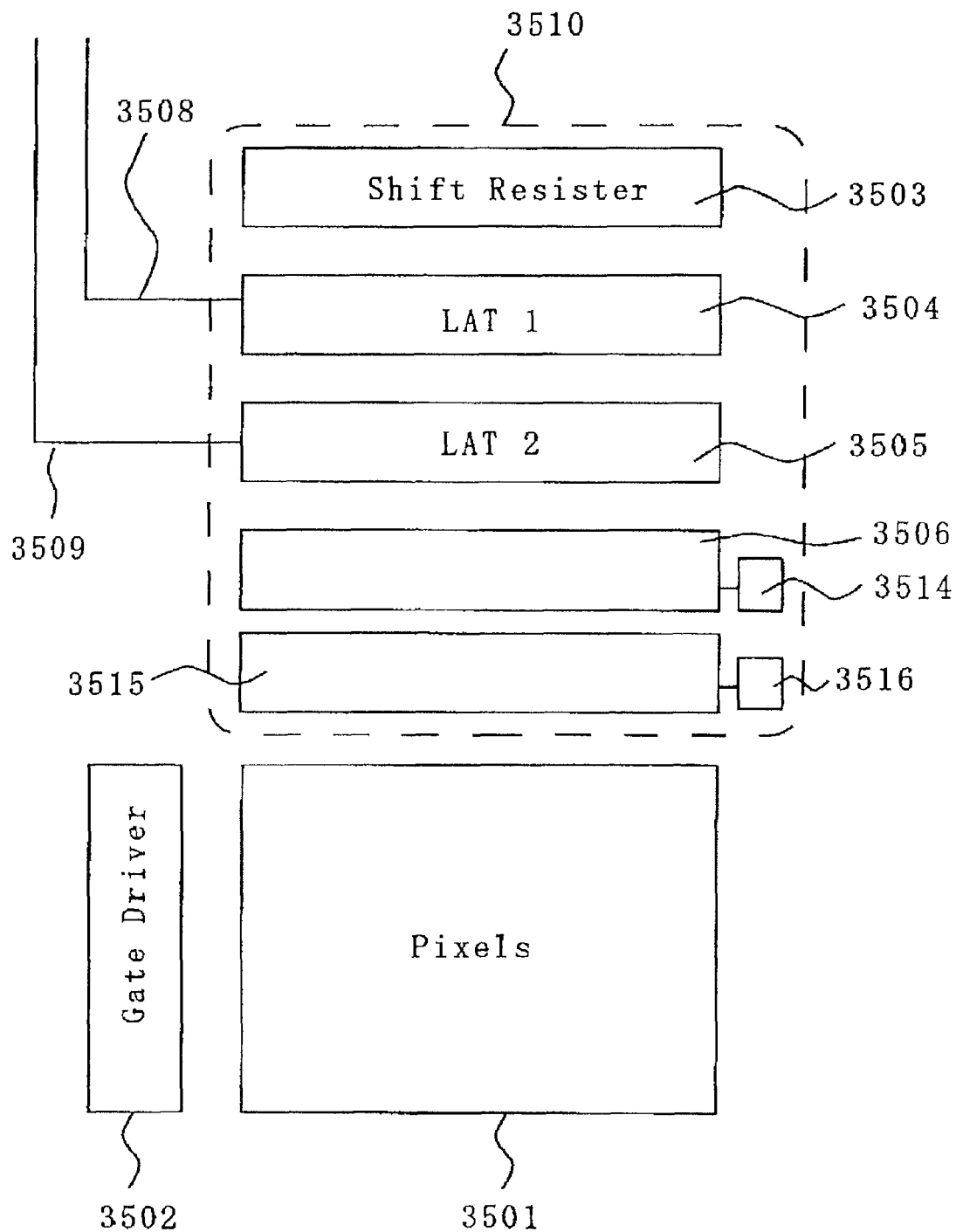
FIG. 35 is a diagram showing a configuration of a display device to which the invention is applied.

The display device includes a pixel arrangement 3501, a gate driver circuit 3502, and a signal driver circuit 3510 as shown in FIG. 35. The gate drive circuit 3502 outputs a selection signal to the pixel arrangement 3501 sequentially. The signal driver circuit 3510 outputs a video signal or a precharge signal to the pixel arrangement 3501 sequentially. In the pixel arrangement 3501, an image is displayed by controlling the light according to the video signal. The video signal inputted from the signal driver circuit 3510 to the pixel arrangement 3501 is a current, and a precharge signal is a voltage. That is, a display element arranged in each pixel and an element which controls the display element are changed in their conditions by a video signal (current) inputted from the signal driver circuit 3510. The display element arranged in the pixel includes an EL element, an element used for an FED (field emission display) and the like.

It should be noted that a plurality of the gate driver circuits 3502 and the signal driver circuits 3510 may be provided.

The signal driver circuit 3510 can be separated into a plurality of portions. As a rough example, it can be separated into a shift register 3503, a first latch circuit (LAT 1) 3504, a second latch circuit (LAT 2) 3505, a digital voltage/analog current conversion circuit 3506, and a digital voltage/analog voltage conversion circuit 3515. The digital voltage/analog current conversion circuit 3506 has a function to convert a digital voltage into an analog current, and may have a function of gamma correction.

Furthermore, the pixel has a display element such as an OLED. The pixel also has a circuit for outputting a current (video signal) to the display device, that is a current source circuit.

The operation of the signal driver circuit 3510 is briefly described. The shift register 3503 is configured with a plurality of rows of flip flop (FF) circuits and the like, and inputted with a clock signal (S-CLK), a start pulse (SP), and an inverted clock signal (S-CLKb). A sampling pulse is sequentially outputted according to these signals.

The sampling pulses outputted from the shift register 3503 are inputted to the first latch circuit (LAT 1) 3504. A video signal is inputted from a video signal line 3508 to the first latch circuit (LAT 1) 3504, and a video signal is stored in each row according to the timing that the sampling pulse is inputted. It should be noted that in the case where the digital voltage/analog current conversion circuit 3506 is provided, the video signal has a digital value. Further, the video signal in this stage is often a voltage.

However, in the case where the first latch circuit 3504 and the second latch circuit 3505 can hold analog values, the digital voltage/analog current conversion circuit 3506 or a part of it and a digital voltage/analog voltage conversion circuit 3515 or a part of it can often be omitted. In that case, the video signal is often a current, however, it may be a voltage. Further, in the case where data to be outputted to the pixel arrangement 3501 has a binary value, that is a digital value, the digital voltage/analog current conversion circuit 3506 or a part of it and a digital voltage/analog voltage conversion circuit 3515 or a part of it can often be omitted.

When the video signal are stored to the last row in the first latch circuit (LAT 1) 3504, a latch pulse is inputted from the latch control line 3509 during a blanking period, and the video signals stored in the first latch circuit (LAT 1) 3504 are transmitted to the second latch circuit (LAT 2) 3505 simultaneously. Then, the video signals stored in the second latch circuit (LAT 2) 3505 are inputted one row at a time to the digital voltage/analog current conversion circuit 3506 or a digital voltage/analog voltage conversion circuit 3515. The signals outputted from the digital voltage/analog voltage conversion circuit 3515 are inputted to the pixel arrangement 3501 as precharge signals. Thereafter, the signals outputted from the digital voltage/analog current conversion circuit 3506 are inputted to the pixel arrangement 3501 as video signals.

While the video signals stored in the second latch circuit (LAT 2) 3505 are inputted to the digital voltage/analog current conversion circuit 3506 and the like and then inputted to the pixel arrangement 3501, sampling pulses are outputted from the shift register 3503 again. That is, two operations are performed at the same time. Therefore, a sequential operation per line can be realized. Thereafter, this operation is repeated.

Next, a circuit configuration of each portion is described. The shift register 3503, the first latch circuit (LAT 1) 3504, and the second latch circuit (LAT 2) 3505 can be realized with a known technology.

The digital voltage/analog current conversion circuit 3506 can be configured with the configuration shown in FIG. 4. That is to say, the digital data D1 to D4 in FIG. 4 correspond to the video signal outputted from the second latch circuit (LAT 2) 3505. The switches $SW_6$ to $SW_9$ are turned ON or OFF by using the digital data D1 to D4 (the video signals outputted from the second latch circuit (LAT 2) 3505. An analog current (video signal) is outputted from the signal current source 300 (a current source corresponding to each bit) to the driven circuit 150 (the pixel arrangement 3501) through the signal line 400. Such switches and signal current sources are disposed for each signal line to configure the digital voltage/analog current conversion circuit 3506.

Figure 41:
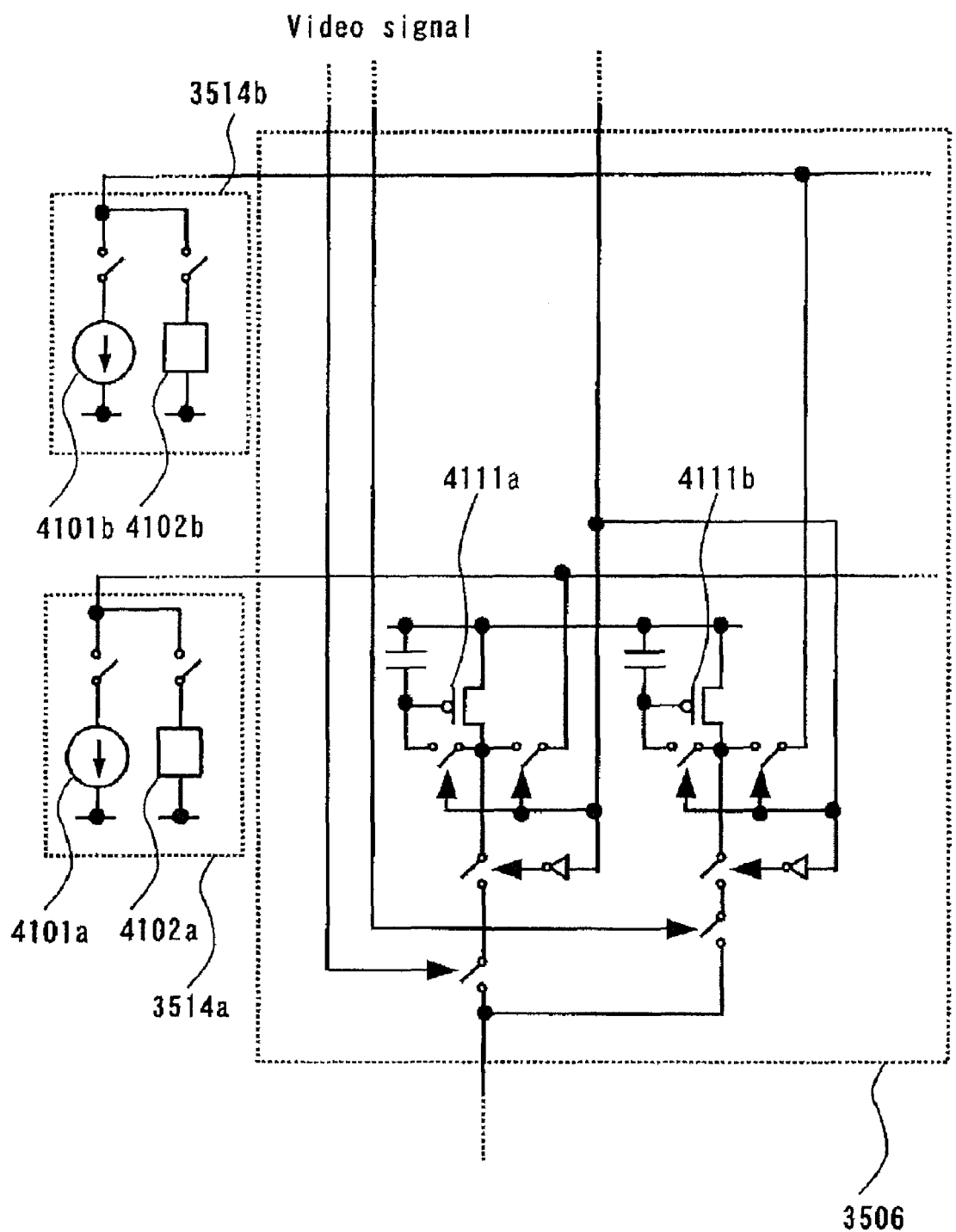
FIG. 41 is a diagram showing an example of a configuration in which a precharge circuit is disposed in a reference current source circuit.

It should be noted that each of the current sources corresponding to each bit in the signal current source 300 may be realized by using a transistor and operating in a saturation region by applying a constant voltage between the gate and source thereof. In this case, however, a current value varies when the characteristics of the transistor for operating as current sources vary. Then, a current may be supplied from a reference current source circuit 3514 to set the current in the signal current source 300 in each row. In that case, a current source corresponding to each bit in the signal current source 300 in each row in the digital voltage/analog current conversion circuit 3506 is the driven circuit 150. Therefore, not only a current source for supplying a current to the driven circuit 150 but a variety of precharge circuits can be disposed in the reference current source circuit 3514. An example of that case is shown in FIG. 41. FIG. 41 shows the case of tow-bit input and output. A transistor 4111a is a current source (driven circuit) corresponding to a first bit and a transistor 4111b is a current source (driven circuit) corresponding to a second bit. The reference current source 3514a corresponds to the first bit and the reference current source 3514b corresponds to the second bit.

In the case of setting a current in the current source corresponding to each bit in the signal current source 300 in each row in the digital voltage/analog current conversion circuit 3506 with the reference current source circuit 3514, a circuit for controlling it is often provided. The shift register 3503 or the second latch circuit (LAT 2) 3505 may be used for controlling it as well.

Note that the details of the circuit for supplying a current to the pixel 3501 are disclosed in World Patent No. WO03-038793, World Patent No. WO03-038794, World Patent No. WO03-038795, World Patent No. WO03-038796, and the World Patent No. WO03-038797 which are earlier applications of the present applicant and the arts thereof can be used as well.

The digital voltage/analog voltage conversion circuit 3515 may be configured by using a resistance dividing DA converter circuit (R-DAC) or a capacitance dividing DA converter circuit (C-DAC) as known techniques. That is to say, by inputting some precharge voltages as reference voltages to the DA converter circuit and using the video signals outputted from the second latch circuit (LAT 2) 3505, an appropriate analog voltage (precharge voltage) corresponding to the outputted video signals may be outputted to the driven circuit 150 (the pixel arrangement 3501) through the signal line 400. It should be noted that in the case where the video signals outputted form the second latch circuit (LAT 2) 3505 have N-bit ($2^N$ gradation), $2^N$ voltages may be generated in the digital voltage/analog voltage conversion circuit 3515 and inputted to the pixel or a predetermined precharge voltage for each region may be outputted by using the precharge selection circuit 700 or switches $SW_{10}$ to $SW_{13}$ as shown in FIG. 4.

Some precharge voltages as references are required to be inputted to the digital voltage/analog voltage conversion circuit 3515. A precharge voltage may be directly inputted or a precharge voltage generated in the reference voltage generation circuit 3516 may be inputted. In the latter case, such a circuit as shown in FIG. 5 may be used. In that case, each of the current sources in FIG. 5 may be disposed in addition exclusively, or the current source in the reference current source circuit 3514 or the digital voltage/analog current conversion circuit 3506 or the like may be shared. Further, the precharge circuits (transistors) 500A to 500D in FIG. 5 may be disposed in addition exclusively, or the current source in the pixel arrangement 3501 may be shared. Or, an analog voltage (precharge voltage) may be disposed in each row by using the precharge circuit 500 or the impedance transformation amplifier 600 as shown in FIGS. 3 and 18 to 22.

It should be noted that the signal driver circuit and a part of it may not be disposed on the same substrate as the pixel arrangement 3501 and may be configured by using an external IC chip.

Note that the configuration of the signal driver circuit is not limited to FIG. 35.

Figure 37:
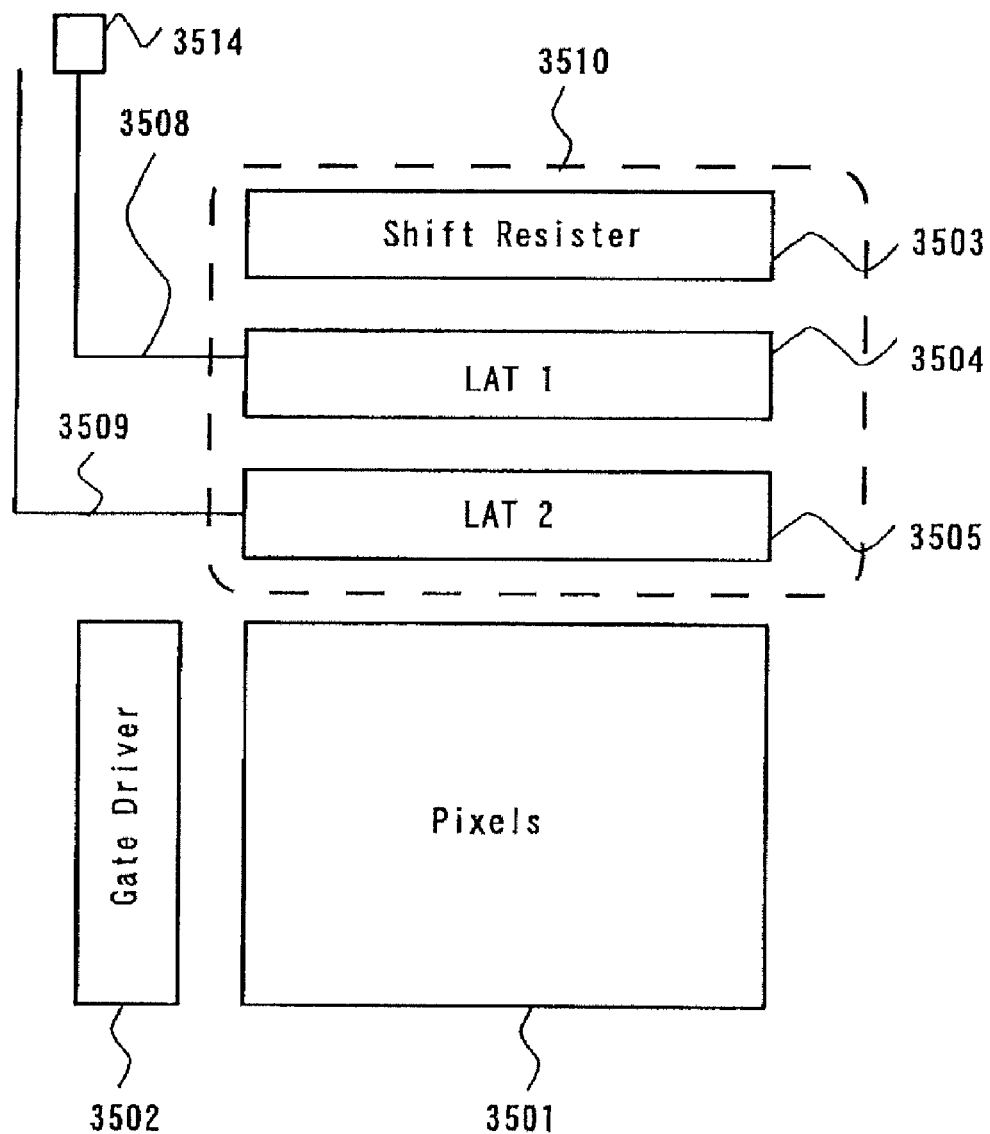
FIG. 37 is a diagram showing an example of a configuration in which a video signal is inputted to the first latch circuit in FIG. 35.

For example, in the case where the first latch circuit 3504 or the second latch circuit 3505 can store analog current, a video signal (analog current) may be inputted to the first latch circuit (LAT 1) 3504. The configuration in this case is shown in FIG. 37.

Figure 38:
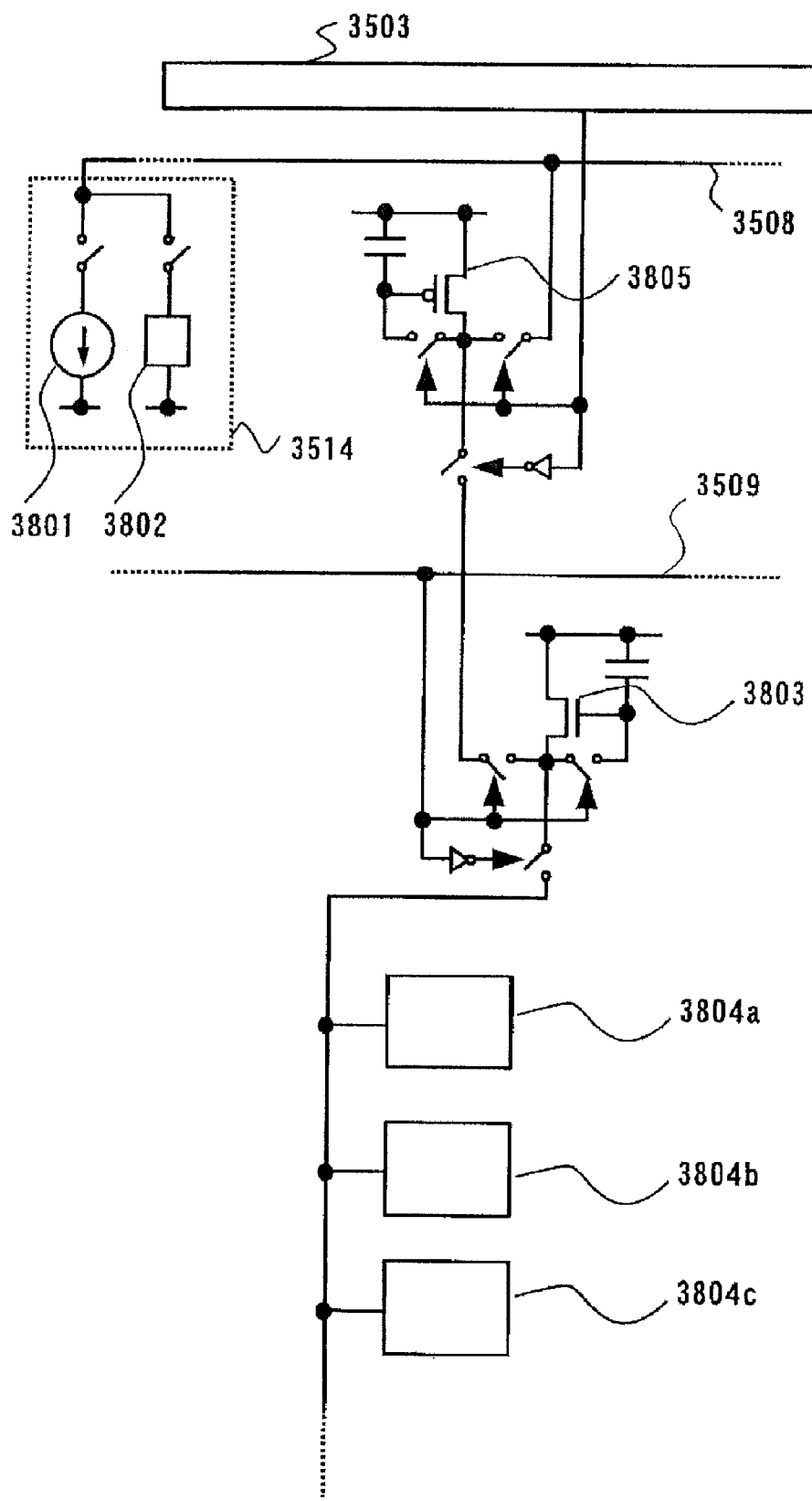
FIG. 38 is a diagram showing a configuration of FIG. 37 in details.

As a circuit for supplying a video signal to the first latch circuit (LAT 1) 3504, a video signal supply circuit 3514 is connected. In this case, the video signal supply circuit 3514 corresponds to the signal current source 300 and the precharge circuit 500 in FIG. 16 and the like. Then, the driven circuit 150 corresponds to a transistor disposed in the first latch circuit (LAT 1) 3504. FIG. 38 shows an example of the detailed configuration of FIG. 37. A video signal is inputted to a transistor 3805 which is a driven circuit disposed in the first latch circuit (LAT 1) 3504 by using a signal current source 3801 and a precharge circuit 3802. At this time, the signal can be written quickly since the precharge circuit 3802 is provided. After that, the video signal is inputted from the transistor 3805 in the first latch circuit (LAT 1) 3504 to a transistor 3803 in the second latch circuit (LAT 2) 3505 in synchronism with the latch signals. Then, the video signals are supplied from the transistor 3803 in the second latch circuit (LAT 2) 3505 to a pixels 3804a to 3804c and the like.

It should be noted that FIG. 38 shows the case where a signal can be quickly inputted by using a precharge circuit when supplying a current from the video signal supply circuit 3514 to a transistor (driven circuit) in the first latch circuit (LAT 1) 3504, however, the invention is not limited to this. By providing a precharge circuit in the first latch circuit (LAT 1) 3504, a precharge operation may be performed when supplying a current from a transistor in the first latch circuit (LAT 1) 3504 to a transistor in the second latch circuit (LAT 2) 3505.

Figure 39:
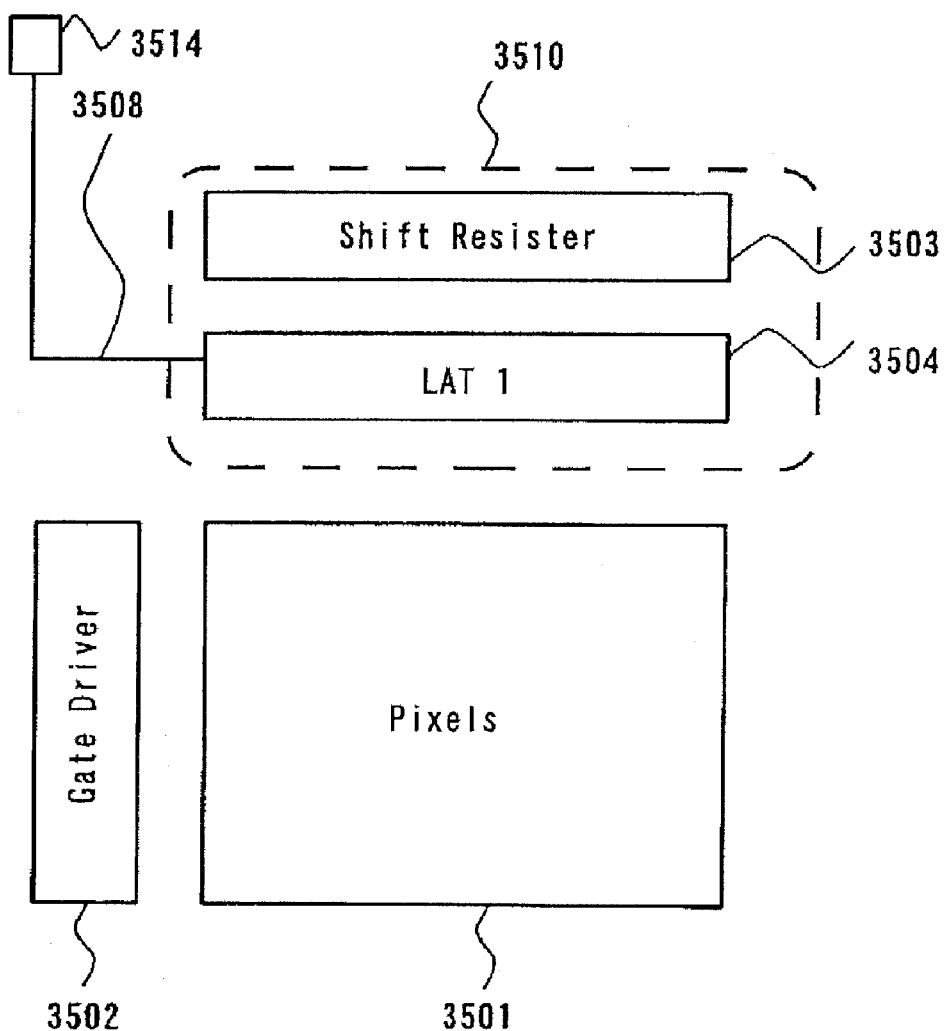
FIG. 39 is a diagram showing an example of a configuration in which a second latch circuit does not exist in FIG. 38.
Figure 40:
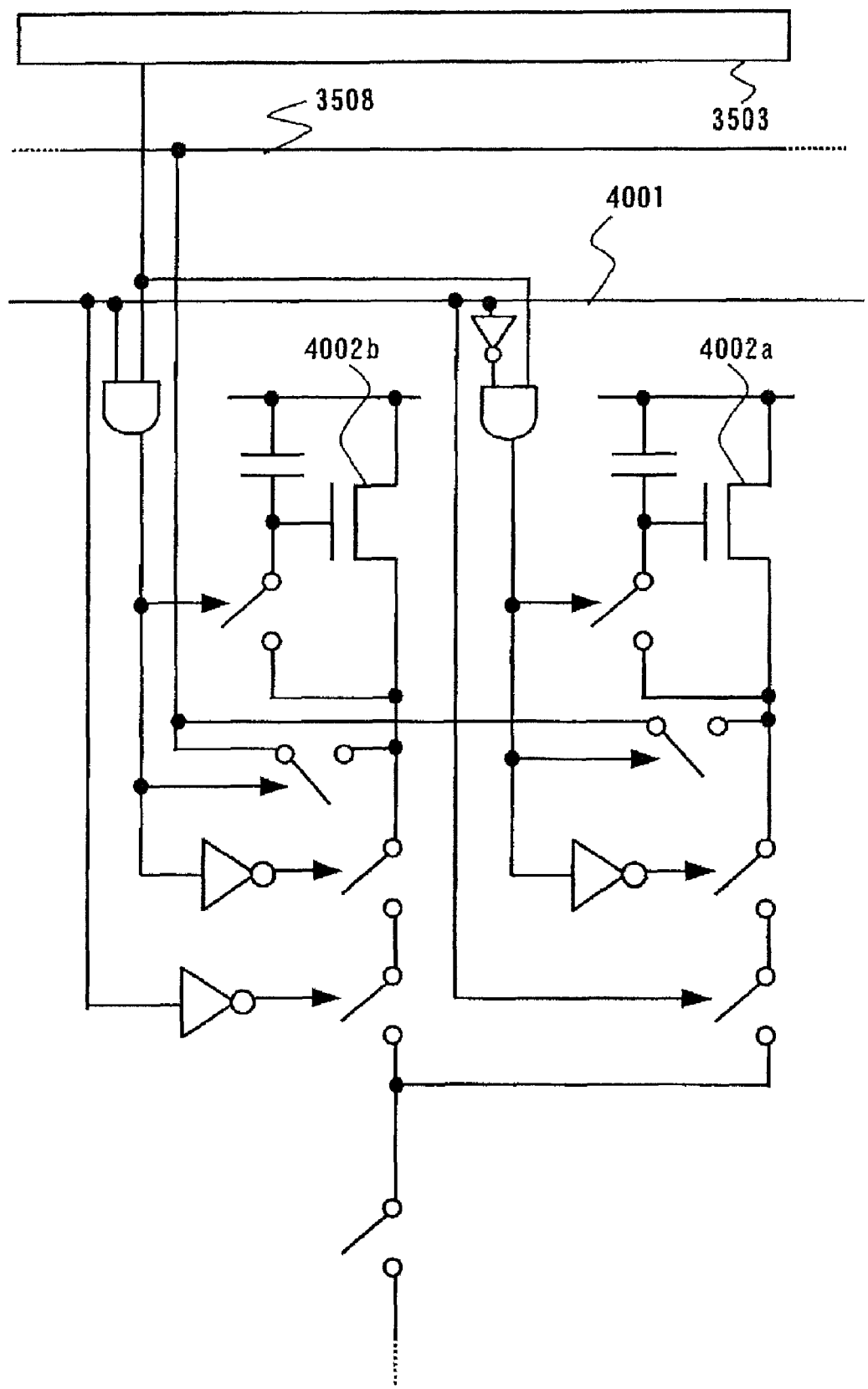
FIG. 40 is a diagram showing FIG. 39 in details.

Similarly, by providing a precharge circuit in the second latch circuit (LAT 2) 3505, a precharge operation may be perfumed when supplying a current from the transistor in the second latch circuit (LAT 2) to the pixel (driven circuit) as well. In that case, the second latch circuit (LAT 2) 3505 may not be provided. The configuration in this case is shown in FIG. 39. In this case, a plurality of transistors denoted as 4002a and 4002b are provided per row in the first latch circuit (LAT 1) as shown in FIG. 40. Then, a signal is supplied from the video signal supply circuit 3514 to one transistor and then the signal is supplied to the pixel from the other transistor. The transistors are operated by switched over sequentially by using a wiring 4001. Here also, a signal can be written quickly by providing a precharge circuit in each region as shown in FIGS. 37 and 38.

It is to be noted that the configurations of a variety of precharge circuits described so far can be applied to the configurations of FIGS. 35 and 37 to 40.

Embodiment 14

Figure 36:
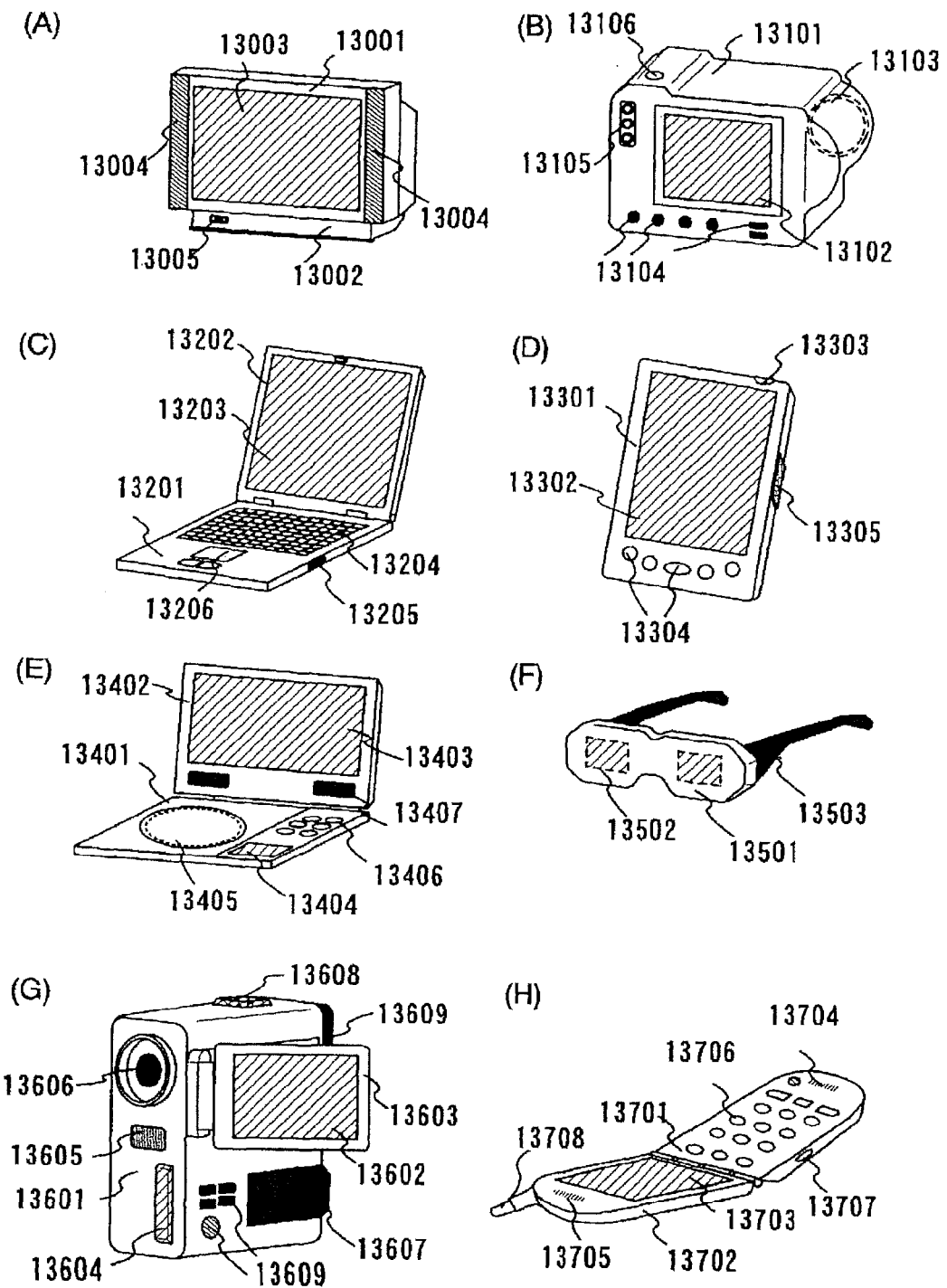
FIG. 36 is a diagram showing electronic apparatuses to which the invention is applied.

Electronic apparatuses, each using the invention, include a video camera, a digital camera, a goggle type display (head mount display), a navigation system, a sound reproduction device (a car audio equipment and an audio set), a lap-top computer, a game machine, a portable information terminal (a mobile computer, a mobile phone, a portable game machine, an electronic book, or the like), an image reproduction apparatus including a recording medium (more specifically, an apparatus which can reproduce a recording medium such as a digital versatile disc (DVD) and display the reproduced image), or the like. Specific examples of those electric apparatuses are shown in FIG. 36.

FIG. 36(A) shows a light emitting apparatus, which includes a housing 13001, a support base 13002, a display portion 13003, a speaker portion 13004, a video input terminal 13005, and the like. The invention can be applied to an electronic circuit configuring the display portion 13003. Further, the light emitting apparatus shown in FIG. 36(A) is completed with the invention. Since the light emitting apparatus is of self-light emitting type, it does not need a back light, therefore a display portion which is thinner than that of a liquid crystal display can be obtained. Note that light emitting apparatuses include all information display devices, for example, personal computers, television broadcast transmitter-receivers, and advertisement displays.

FIG. 36(B) shows a digital still camera, which includes a main body 13101, a display portion 13102, an image receiving portion 13103, operation keys 13104, an external connection port 13105, a shutter 13106, and the like. The invention can be applied to an electronic circuit configuring the display portion 13102. Further, the digital still camera shown in FIG. 36(B) is completed with the invention.

FIG. 36(C) shows a lap-top notebook personal computer, which includes a main body 13201, a housing 13202, a display portion 13203, a keyboard 13204, external connection ports 13205, a pointing mouse 13206, and the like. The invention can be applied to an electronic circuit configuring the display portion 13203. Further, the light emitting apparatus shown in FIG. 36(C) is completed with the invention.

FIG. 36(D) shows a mobile computer, which includes a main body 13301, a display portion 13302, a switch 13303, operation keys 13304, an infrared port 13305, and the like. The invention can be applied to an electronic circuit configuring the display portion 13303. Further, the mobile computer shown in FIG. 36(D) is completed with the invention.

FIG. 36(E) shows a portable image reproducing device provided with a recording medium (specifically, a DVD reproducing device), which includes a main body 13401, a housing 13402, a display portion A 13403, a display portion B 13404, a recording medium (such as a DVD) read-in portion 13405, operation keys 13406, a speaker portion 13407, and the like. The display portion A 13403 mainly displays image data, and the display portion B 13404 mainly displays text information. The invention can be applied to electronic circuits configuring the display portions A 13403 and B 13404. Note that family game machines and the like are included in the image reproducing devices provided with a recording medium. Further, the DVD reproducing device shown in FIG. 36(E) is completed with the invention.

FIG. 36(F) shows a goggle type display (head mounted display), which includes a main body 13501, a display portion 13502, an arm portion 13503, and the like. The invention can be applied to an electronic circuit configuring the display portion 13502. The goggle type display shown in FIG. 36(F is completed with the invention.

FIG. 36(G) shows a video camera, which includes a main body 13601, a display portion 13602, a housing 13603, an external connection port 13604, a remote control reception portion 13605, an image receiving portion 13606, a battery 13607, an audio input portion 13608, operation keys 13609 and the like. The invention can be applied to an electronic circuit configuring the display portion 13602. The video camera shown in FIG. 36(G) is completed with the invention.

FIG. 36(H) shows a mobile phone, which includes a main body 13701, a housing 13702, a display portion 13703, an audio input portion 13704, an audio output portion 13705, operation keys 13706, an external connection port 13707, an antenna 13708, and the like. The invention can be applied to an electronic circuit configuring the display portion 13703.

Note that, by displaying white characters on a black background, the current consumption of the mobile phone can be suppressed. Further, the mobile phone shown in FIG. 36(H) is completed with the invention.

When the luminance of light emitting materials is increased in the future, the light emitting apparatus will be able to be applied to a front or rear type projector for magnifying and projecting outputted light containing image data by a lens or the like.

The above-described electronic apparatuses tend to display information distributed via electronic communication lines such as the Internet and CATVs (cable TVs). Particularly increased are the cases where moving image data is displayed. Since the response rate of the light emitting material is very high, the light emitting apparatus is preferably used for moving image display.

Since the light emitting apparatus consumes power in a portion emitting the light, information is desirably displayed so that the light emitting portions are as small as possible. Thus, in the case where the light emitting apparatus is used for a display portion of a portable information terminal, particularly, a mobile phone, a sound reproduction device, or the like, which primarily displays text information, it is preferable that the text information is formed in the light emitting portions with the non-light emitting portions as the background.

As described above, the application range of the invention is very wide; therefore the invention can be used for electronic apparatuses in all fields. The electronic apparatuses according to this embodiment may employ a semiconductor device of any configurations shown in this invention.

INDUSTRIAL APPLICABILITY

The current drive circuit of the invention is provided with a precharge circuit which precharges a signal line to a predetermined potential prior to supplying a signal current to the signal line, therefore the rate of signal writing is not delayed even when the signal current is small.

The invention claimed is:

1. A semiconductor device comprising:
   a driven circuit comprising a first transistor;
   a signal line electrically connected to the first transistor through a node;
   a precharge circuit electrically connected to the signal line and comprising a second transistor; and
   a current source circuit electrically connected to the first transistor and the second transistor,
   wherein a gate width of the second transistor is larger than a gate width of the first transistor, and
   wherein the precharge circuit is configured to perform a precharge of the driven circuit prior to supplying a signal current to the driven circuit.

2. The semiconductor device according to claim 1, further comprising an impedance transformation amplifier.

3. The semiconductor device according to claim 2, wherein the impedance transformation amplifier is a source follower circuit.

4. The semiconductor device according to claim 1,
   wherein the driven circuit is included in a pixel circuit, and
   wherein the precharge circuit is included in a source driver circuit.

5. The semiconductor device according to claim 1, wherein the precharge is performed by supplying a precharge voltage to the node.

6. The semiconductor device according to claim 1, wherein the precharge circuit is included in a current drive circuit.

7. The semiconductor device according to claim 1, further comprising:
a first switch configured to control an electrical connection between the signal line and the precharge circuit;
a second switch configured to control an electrical connection between the signal line and the current source circuit; and
a third switch configured to control an electrical connection between the current source circuit and the precharge circuit.

8. The semiconductor device according to claim 1, wherein a gate electrode of the first transistor is electrically connected to a drain electrode of the first transistor.

9. The semiconductor device according to claim 8, wherein the gate electrode of the first transistor is electrically connected to the drain electrode of the first transistor through a fourth switch.

10. A semiconductor device comprising:
a driven circuit comprising a first transistor;
a precharge circuit comprising a second transistor;
a first switch for controlling an electrical connection between the driven circuit and the precharge circuit; and
a second switch for controlling an electrical connection between the driven circuit and a current source circuit,
wherein a gate width of the second transistor is larger than a gate width of the first transistor.

11. The semiconductor device according to claim 10, further comprising an amplifier circuit configured to amplify a signal current outputted from the precharge circuit.

12. The semiconductor device according to claim 11, wherein the amplifier circuit is a source follower circuit.

13. The semiconductor device according to claim 10,
wherein the driven circuit is included in a pixel circuit, and
wherein the precharge circuit is included in a source driver circuit.

14. The semiconductor device according to claim 10, wherein the precharge circuit is included in a current drive circuit.

15. The semiconductor device according to claim 10,
wherein a first terminal of the first switch is electrically connected to the precharge circuit, and
wherein a second terminal of the first switch is electrically connected to the second switch.

16. The semiconductor device according to claim 10, further comprising a third switch configured to control an electrical connection between the current source circuit and the precharge circuit.

17. The semiconductor device according to claim 10, wherein a gate electrode of the first transistor is electrically connected to a drain electrode of the first transistor.

18. The semiconductor device according to claim 17, wherein the gate electrode of the first transistor is electrically connected to the drain electrode of the first transistor through a fourth switch.

19. A semiconductor device comprising:
a driven circuit comprising a first transistor;
a signal line electrically connected to the first transistor through a node;
a precharge circuit electrically connected to the signal line and comprising a second transistor; and
a current source circuit electrically connected to the first transistor and the second transistor,
wherein a gate length of the second transistor is smaller than a gate length of the first transistor, and
wherein the precharge circuit is configured to perform a precharge of the driven circuit prior to supplying a signal current to the driven circuit.

20. The semiconductor device according to claim 19, further comprising an impedance transformation amplifier.

21. The semiconductor device according to claim 20, wherein the impedance transformation amplifier is a source follower circuit.

22. The semiconductor device according to claim 19,
wherein the driven circuit is included in a pixel circuit, and
wherein the precharge circuit is included in a source driver circuit.

23. The semiconductor device according to claim 19, wherein the precharge is performed by supplying a precharge voltage to the node.

24. The semiconductor device according to claim 19, wherein the precharge circuit is included in a current drive circuit.

25. The semiconductor device according to claim 19, further comprising:
a first switch configured to control an electrical connection between the signal line and the precharge circuit;
a second switch configured to control an electrical connection between the signal line and the current source circuit; and
a third switch configured to control an electrical connection between the current source circuit and the precharge circuit.

26. The semiconductor device according to claim 19, wherein a gate electrode of the first transistor is electrically connected to a drain electrode of the first transistor.

27. The semiconductor device according to claim 26, wherein the gate electrode of the first transistor is electrically connected to the drain electrode of the first transistor through a fourth switch.

28. A semiconductor device comprising:
a driven circuit comprising a first transistor;
a precharge circuit comprising a second transistor;
a first switch for controlling an electrical connection between the driven circuit and the precharge circuit; and
a second switch for controlling an electrical connection between the driven circuit and a current source circuit,
wherein a gate length of the second transistor is smaller than a gate length of the first transistor.

29. The semiconductor device according to claim 28, further comprising an amplifier circuit configured to amplify a signal current outputted from the precharge circuit.

30. The semiconductor device according to claim 29, wherein the amplifier circuit is a source follower circuit.

31. The semiconductor device according to claim 28,
wherein the driven circuit is included in a pixel circuit, and
wherein the precharge circuit is included in a source driver circuit.

32. The semiconductor device according to claim 28, wherein the precharge circuit is included in a current drive circuit.

33. The semiconductor device according to claim 28,
wherein a first terminal of the first switch is electrically connected to the precharge circuit, and
wherein a second terminal of the first switch is electrically connected to the second switch.

34. The semiconductor device according to claim 28, further comprising a third switch configured to control an electrical connection between the current source circuit and the precharge circuit.

35. The semiconductor device according to claim 28, wherein a gate electrode of the first transistor is electrically connected to a drain electrode of the first transistor.

36. The semiconductor device according to claim 35, wherein the gate electrode of the first transistor is electrically connected to the drain electrode of the first transistor through a fourth switch.

* * * * *